United States Patent
Park et al.

(10) Patent No.: US 12,261,160 B2
(45) Date of Patent: Mar. 25, 2025

(54) DISPLAY DEVICE INCLUDING DUMMY PATTERN ON BANK

(71) Applicant: Samsung Display Co., LTD., Yongin-si (KR)

(72) Inventors: Ki Hoon Park, Yongin-si (KR); Jung Hyun Ahn, Suwon-si (KR); Hyun Deok Im, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 424 days.

(21) Appl. No.: 17/705,925

(22) Filed: Mar. 28, 2022

(65) Prior Publication Data

US 2022/0344314 A1 Oct. 27, 2022

(30) Foreign Application Priority Data

Apr. 23, 2021 (KR) .................. 10-2021-0052812

(51) Int. Cl.
*H01L 27/12* (2006.01)
*H01L 25/16* (2023.01)
*H01L 23/00* (2006.01)

(52) U.S. Cl.
CPC .......... *H01L 25/167* (2013.01); *H01L 27/124* (2013.01); *H01L 24/24* (2013.01);
(Continued)

(58) Field of Classification Search
CPC ...... H01L 25/167; H01L 27/124; H01L 24/24
(Continued)

(56) References Cited

U.S. PATENT DOCUMENTS 11,367,823 B2 6/2022 Kim et al.
2010/0133993 A1* 6/2010 Pang .................. H10K 59/126
445/24

(Continued)

FOREIGN PATENT DOCUMENTS

CN          1637535 A   *  7/2005  ....... G02F 1/134363
KR    10-2014-0143046      12/2014
(Continued)

OTHER PUBLICATIONS

International Search Report corresponding to International Application No. PCT/KR2022/005546 dated Aug. 8, 2022.
(Continued)

*Primary Examiner* — Phuc T Dang
(74) *Attorney, Agent, or Firm* — KILE PARK REED & HOUTTEMAN PLLC

(57) ABSTRACT

A display device includes first banks extending in a first direction and that are spaced apart from each other in a second direction intersecting the first direction, a first electrode extending in the first direction and including a first part disposed between the first banks, a second electrode extending in the first direction and including a second part spaced apart from the first part in the second direction and disposed between the first banks, a first dummy pattern disposed on one of the first banks and spaced apart from the first part, a second dummy pattern disposed on another one of the first banks and spaced apart from the second part, and light-emitting elements disposed between the first banks, the light-emitting elements having at least one end portion disposed on one of the first part of the first electrode and the second part of the second electrode.

20 Claims, 32 Drawing Sheets

(52) U.S. Cl.
CPC .............. *H01L 24/25* (2013.01); *H01L 24/95* (2013.01); *H01L 2224/24051* (2013.01); *H01L 2224/24105* (2013.01); *H01L 2224/24147* (2013.01); *H01L 2224/244* (2013.01); *H01L 2224/25175* (2013.01); *H01L 2224/95133* (2013.01)

(58) Field of Classification Search
USPC .......................................................... 257/91
See application file for complete search history.

(56) References Cited

U.S. PATENT DOCUMENTS

| | | | |
|---|---|---|---|
| 2021/0066561 A1* | 3/2021 | Chang | H01L 33/62 |
| 2021/0074769 A1* | 3/2021 | Park | H10K 59/38 |
| 2022/0123026 A1 | 4/2022 | Oh et al. | |
| 2022/0158052 A1 | 5/2022 | Lee et al. | |

FOREIGN PATENT DOCUMENTS

| | | |
|---|---|---|
| KR | 10-2019-0124359 | 11/2019 |
| KR | 10-2020-0005711 | 1/2020 |
| KR | 10-2020-0006209 | 1/2020 |
| KR | 10-2020-0088954 | 7/2020 |
| KR | 10-2020-0102607 | 9/2020 |
| KR | 10-2021-0025144 | 3/2021 |
| KR | 10-2021-0057891 | 5/2021 |

OTHER PUBLICATIONS

Written Opinion corresponding to International Application No. PCT/KR2022/005546, dated Aug. 8, 2022.
Antonio Ramos et al., "AC Electric-Field-Induced Fluid Flow in Microelectrodes", Journal of Colloid and Interface Science, 1999, pp. 420-422, vol. 217.

* cited by examiner

DISPLAY DEVICE INCLUDING DUMMY PATTERN ON BANK

CROSS-REFERENCE TO RELATED APPLICATION(S)

This application claims priority to and benefits of Korean Patent Application No. 10-2021-0052812 under 35 U.S.C. 119, filed on Apr. 23, 2021 in the Korean Intellectual Property Office, the entire contents of which are incorporated herein by reference.

BACKGROUND

1. Technical Field

The disclosure relates to a display device.

2. Description of the Related Art

Display devices are becoming more important with developments in multimedia technology. Accordingly, various display devices such as an organic light-emitting diode (OLED) display device, a liquid crystal display (LCD) device, and the like have been used.

A typical display device may include a display panel for displaying an image, such as an OLED display panel or an LCD panel. A light-emitting display panel may include light-emitting elements such as light-emitting diodes (LEDs). The LEDs may be classified as organic LEDs (OLEDs) using an organic light-emitting material and an inorganic LEDs (ILEDs) using an inorganic light-emitting material.

SUMMARY

Embodiments of the disclosure provide a display device, which may include a plurality of electrodes and dummy patterns and can thus improve the degree of alignment and the emission efficiency of light-emitting elements.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to an embodiment of the disclosure, a display device may include first banks extending in a first direction, the first banks being spaced apart from each other in a second direction intersecting the first direction, a first electrode extending in the first direction and including a first part which may be disposed between the first banks, a second electrode extending in the first direction and including a second part which may be spaced apart from the first part in the second direction and disposed between the first banks, a first dummy pattern disposed on one of the first banks and spaced apart from the first part of the first electrode, a second dummy pattern disposed on another one of the first banks and spaced apart from the second part of the second electrode, and light-emitting elements disposed between the first banks, the light-emitting elements having at least one end portion disposed on one of the first part of the first electrode and the second part of the second electrode.

A first distance between the first electrode and the second electrode may be smaller than a second distance between the first banks, and a first width of the first part of the first electrode and the second part of the second electrode may be smaller than the first distance.

A width of the first dummy pattern and the second dummy pattern may be greater than the first width.

The first electrode and the second electrode may be spaced apart from the first dummy pattern and the second dummy pattern at a same distance along sides of the first banks.

The first electrode may further include a third part which extends in the first direction, may be connected to the first part, and may be disposed on a side of the one of the first banks in the first direction, the second electrode may further include a fourth part which extends in the first direction, may be connected to the second part, and may be disposed on a side of the another one of the first banks in the first direction, and a second width of the third part and the fourth part may be greater than a width of the first dummy pattern and the second dummy pattern.

One of the sides of the third part that faces the fourth part may be parallel to one of the sides of the first part that faces the second part in the first direction, and one of the sides of the fourth part that faces the third part may be parallel to one of the sides of the second part that faces the first part in the first direction.

Another side of the third part may be spaced apart from a side of the first dummy pattern that does not face the first part, and another side of the fourth part may be spaced apart from a side of the second dummy pattern that does not face the second part.

Another side of the first part may be spaced apart from the first dummy pattern, and another side of the second part may be spaced apart from the second dummy pattern.

The display device may further include a first insulating layer disposed on the first electrode, the second electrode, the first dummy pattern, and the second dummy pattern, a first connecting electrode disposed on the first electrode and the first dummy pattern, the first connecting electrode electrically contacting first end portions of the light-emitting elements, and a second connecting electrode disposed on the second electrode and the second dummy pattern, the second connecting electrode electrically contacting second end portions of the light-emitting elements.

The first connecting electrode contacts the first electrode through a first contact which penetrates the first insulating layer, the first connecting electrode may not contact the first dummy pattern, the second connecting electrode contacts the second electrode through a second contact which penetrates the first insulating layer, and the second connecting electrode may not contact the second dummy pattern.

The first banks may include first sub-banks and a second sub-bank which may be disposed between the first sub-banks, the first part of the first electrode may be disposed between one of the first sub-banks and the second sub-bank, the second part of the second electrode may be disposed between another one of the first sub-banks and the second sub-bank, and the display device may further include a third electrode which may be disposed between the first electrode and the second electrode and include a fifth part disposed between the one of the first sub-banks and the second sub-bank, and a fourth electrode which may be spaced apart from the second electrode in the second direction and includes a sixth part disposed between the another one of the first sub-banks and the second sub-bank.

The display device may further include a third dummy pattern spaced apart from the sixth part of the fourth electrode and disposed on the another one of the first sub-banks, wherein the second dummy pattern may be disposed between the second part of the second electrode and the fifth part of the third electrode and disposed on the second sub-bank, and a width of the second dummy pattern may be greater than each of a width of the first dummy pattern and a width of the third dummy pattern.

The display device may further include a third dummy pattern spaced apart from the fifth part of the third electrode and disposed on the second sub-bank, and a fourth dummy pattern spaced apart from the sixth part of the fourth electrode and disposed on the another one of the first sub-banks, wherein the second dummy pattern and the third dummy pattern may be spaced apart from each other on the second sub-bank.

According to an embodiment of the disclosure, a display device may include first banks disposed on a first substrate, a first electrode including a first part which may be disposed between the first banks, a second electrode including a second part which may be disposed between the first banks and spaced apart from the first part, dummy patterns disposed on the first banks and spaced apart from the first electrode and the second, a first insulating layer disposed on the first banks, the first electrode, the second electrode, and the dummy patterns, and light-emitting elements disposed between the first banks and disposed on the first insulating layer, the light-emitting elements having at least one end portion disposed on one of the first part of the first electrode and the second part of the second electrode.

The first electrode and the second electrode may be spaced apart from the first banks, and each of a width of the first part of the first electrode and a width of the second part of the second electrode may be smaller than a distance between the first and second parts of the first and second electrodes.

The dummy patterns may include a first dummy pattern which may be disposed on a first bank adjacent to the first part, and a second dummy pattern which may be disposed on a first bank adjacent to the second part, and a distance between the first dummy pattern and the second dummy pattern may be greater than a distance between the first banks.

A width of the first dummy pattern may be greater than a width of the first part, and a width of the second dummy pattern may be greater than a width of the second part.

The display device may further include a first connecting electrode disposed on the first electrode and the first dummy pattern, the first connecting electrode electrically contacting first end portions of the light-emitting elements, and a second connecting electrode disposed on the second electrode and the second dummy pattern, the second connecting electrode electrically contacting second end portions of the light-emitting elements, wherein the first connecting electrode and the second connecting electrode do not contact the first dummy pattern and the second dummy pattern.

The first banks may include first sub-banks and a second sub-bank which may be disposed between the first sub-banks, the first part of the first electrode may be disposed between one of the first sub-banks and the second sub-bank, the second part of the second electrode may be disposed between another one of the first sub-banks and the second sub-bank, and the display device may further include a third electrode including a part that may be spaced apart from the first part of the first electrode and is disposed between the one of the first sub-banks and the second sub-bank, and a fourth electrode including a part that may be spaced apart from the second part of the second electrode and is disposed between the another one of the first sub-banks and the second sub-bank.

The dummy patterns may further include a first dummy pattern which may be spaced apart from the first electrode and may be disposed on the one of the first sub-banks, a second dummy pattern which may be spaced apart from the second electrode and may be disposed on the second sub-bank, a third dummy pattern which may be spaced apart from the third electrode and may be disposed on the second sub-bank, and a fourth dummy pattern which may be spaced apart from the fourth electrode and may be disposed on the another one of the first sub-banks, and the second dummy pattern and the third dummy pattern may be spaced apart from each other on the second sub-bank.

According to the aforementioned and other embodiments of the disclosure, light-emitting elements can be properly aligned, and the degree of alignment of the light-emitting elements can be improved using electrode lines whose width may be changed during the fabrication of a display device. Also, as electrodes, which apply electric signals for causing the light-emitting elements to emit light, and dummy patterns, which reflect light emitted by the light-emitting elements, may be provided, the front emission efficiency of the light-emitting elements can be improved.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION OF THE EMBODIMENTS

Figure 1:
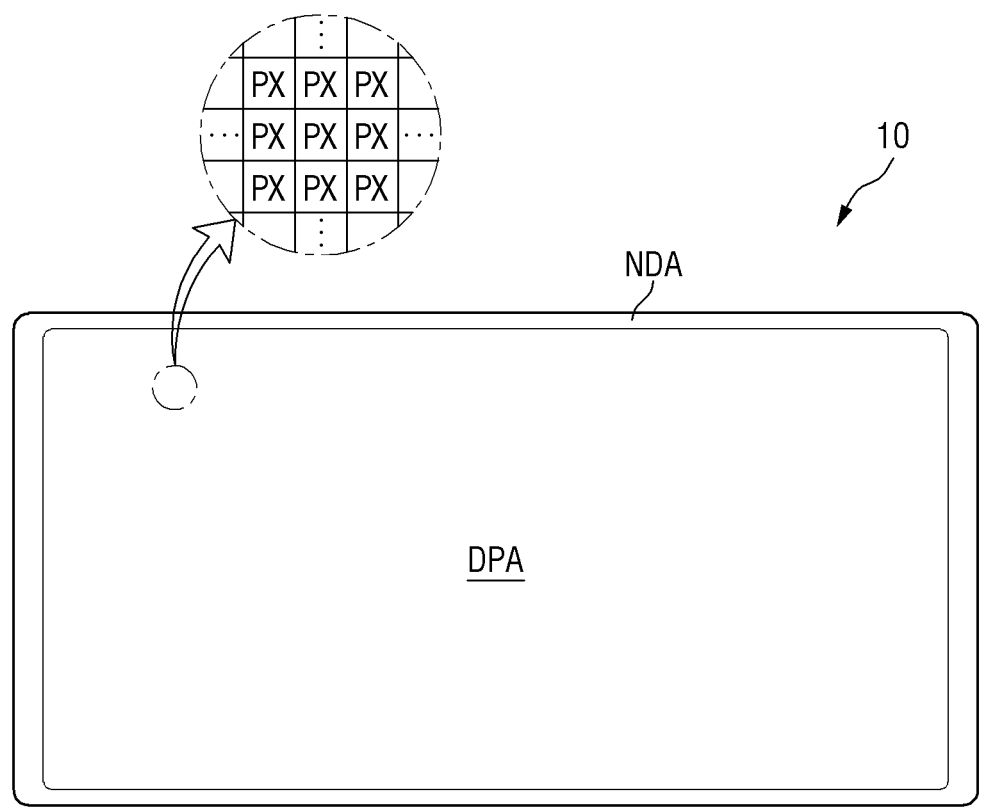
FIG. 1 is a schematic plan view of a display device according to an embodiment of the disclosure.

The disclosure will now be made more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well (and vice versa), unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or "to not overlap" another element, this may include that the elements are spaced apart from each other, offset from each other, or set aside from each other or any other suitable term as would be appreciated and understood by those of ordinary skill in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display device according to an embodiment of the disclosure.

Referring to FIG. 1, a display device 10 may display a moving or still image. The display device 10 may refer to nearly all types of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like.

The display device 10 may include a display panel that provides a display screen. Examples of the display panel of the display device 10 may include an inorganic light-emitting diode (ILED) display panel, an organic light-emitting diode (OLED) display panel, a quantum-dot light-emitting diode (QLED) display panel, a plasma display panel (PDP), a field-emission display (FED) panel, and the like. The display panel of the display device 10 will hereinafter be described as being, for example, an ILED display panel, but the disclosure is not limited thereto. For example, various other display panels are also applicable to the display panel of the display device 10.

The shape of the display device 10 may vary. In an example, the display device 10 may have a rectangular shape that extends longer in a horizontal direction than in a vertical direction, a rectangular shape that extends longer in the vertical direction than in the horizontal direction, a square shape, a tetragonal shape with rounded corners, a non-tetragonal polygonal shape, or a circular shape. The shape of a display area DPA of the display device 10 may be similar to the shape of the display device 10. FIG. 1 illustrates that the display device 10 and the display area DPA both have a rectangular shape that extends in a second direction DR2.

The display device 10 may include the display area DPA and a non-display area NDA. The display area DPA may be an area in which a screen may be displayed, and the non-display area NDA may be an area in which a screen may not be displayed. The display area DPA may also be referred to as an active area, and the non-display area NDA may also be referred to as an inactive area. The display area DPA may occupy the middle part of the display device 10.

The display area DPA may include a plurality of pixels PX. The pixels PX may be arranged in row and column directions. The pixels PX may have a rectangular or square shape in a plan view, but the disclosure is not limited thereto. In other embodiments, the pixels PX may have a rhombus shape having sides that are inclined with respect to a particular direction. The pixels PX may include a stripe or PENTILE™ arrangement. Each of the pixels PX may include one or more light-emitting elements emitting light of a particular wavelength range and may thus display a particular color.

The non-display area NDA may be disposed around the display area DPA. The non-display area NDA may surround the entire display area DPA or part of the display area DPA. The display area DPA may have a rectangular shape, and the non-display area NDA may be disposed adjacent to sides (e.g., four sides) of the display area DPA. The non-display area NDA may form the bezel of the display device 10. Lines or circuit drivers included in the display device 10 may be disposed in the non-display area NDA, or external devices may be mounted in the non-display area NDA.

Figure 2:
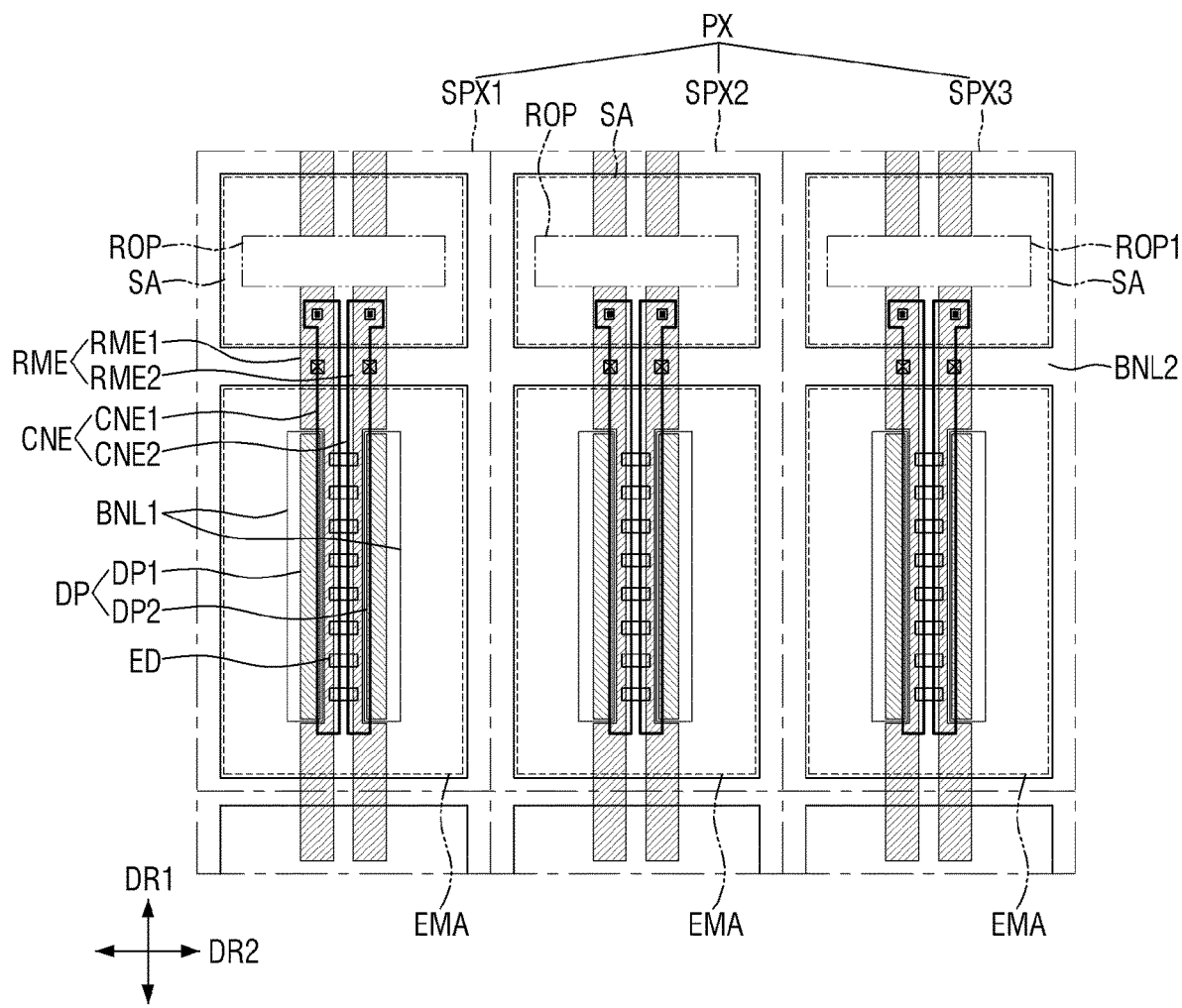
FIG. 2 is a schematic plan view of a pixel of the display device of FIG. 1.

FIG. 2 is a schematic plan view of a pixel of the display device of FIG. 1. FIG. 2 illustrates a pixel PX and part of another pixel PX adjacent thereto in a first direction DR1.

Referring to FIG. 2, a pixel PX of the display device 10 may include a plurality of subpixels SPXn (where n may be an integer of 1 to 3). In an example, the pixel PX may include first, second, and third subpixels SPX1, SPX2, and SPX3. The first subpixel SPX1 may emit first-color light, the second subpixel SPX2 may emit second-color light, and the third subpixel SPX3 may emit third-color light. In an example, the first-color light, the second-color light, and the third-color light may be blue light, green light, and red light, respectively, but the disclosure is not limited thereto. In other embodiments, the subpixels SPXn may all emit light of the same color. In an example, the subpixels SPXn may all emit blue light. FIG. 2 illustrates that the pixel PX may include three subpixels SPXn, but the disclosure is not limited thereto. In other embodiments, the pixel PX may include more than three subpixels SPXn.

Each of the subpixels SPXn may include an emission area EMA and a non-emission area. The emission area EMA may be an area that outputs light of a particular wavelength range due to light-emitting elements ED being disposed therein, and the non-emission area may be an area which may have no light-emitting elements ED disposed therein, may not be reached by light emitted by light-emitting elements ED, and thus may not output light. The emission area EMA may include a region where the light-emitting elements ED may be disposed and a region around the light-emitting elements ED where light emitted by the light-emitting elements ED may be output.

However, the disclosure is not limited thereto. The emission area EMA may also include regions that output light emitted by the light-emitting elements ED and reflected or refracted by other members. Light emitting elements ED may be disposed in each of the subpixels SPXn to form an emission area EMA including a region in which the light-emitting elements ED may be disposed and the surroundings of the region in which the light-emitting elements ED may be disposed.

FIG. 2 illustrates that the emission areas EMA of the first, second, and third subpixels SPX1, SPX2, and SPX3 have substantially the same size, but the disclosure is not limited thereto. In some embodiments, the emission areas EMA of the subpixels SPXn may have different sizes depending on the color or the wavelength of light emitted by light-emitting elements ED.

Each of the subpixels SPXn may further include a subarea SA, which may be disposed in the non-emission area of the corresponding subpixel SPXn. In each of the subpixels SPXn, the subarea SA may be disposed on a first side, in the first direction DR1, of the emission area EMA, between the emission area EMA of the corresponding subpixel SPXn and the emission area EMA of another subpixel SPXn adjacent to the corresponding subpixel SPXn in the first direction DR1. In an example, multiple emission areas EMA or multiple subareas SA may be repeatedly arranged in a second direction DR2, and the emission areas EMA and the subareas SA may be alternately arranged in the first direction DR1. However, the disclosure is not limited to this example. For example, the plurality of emission areas EMA and the plurality of subareas SA may have a different layout from that illustrated in FIG. 2. Referring to FIG. 2, an emission area EMA and a subarea SA, which is on one side, in the first direction DR1, of the emission area EMA (e.g., on the upper side of the emission area EMA), may be included in one subpixel SPXn, and a subarea SA of another subpixel SPXn adjacent to the corresponding subpixel SPXn in the first direction DR1 may be disposed on another side, in the first direction DR1, of the emission area EMA (e.g., on the lower side of the emission area EMA).

A second bank BNL2 may be disposed between the subareas SA and the emission areas EMA of the subpixels SPXn, and the distance between the subareas SA and the emission areas EMA may vary depending on the width of the second bank BNL2. As no light-emitting elements ED may be disposed in the subareas SA, no light may be output from the subareas SA, but electrodes RME may be disposed in part in the subareas SA. Two sets of electrodes RME from two different subpixels SPXn may be separated from each other in a first separation part ROP1 of a subarea SA of one of the two different subpixels SPXn.

The second bank BNL2 may include parts that extend in the first direction DR1 and parts that extend in the second direction DR2 and may be arranged in a lattice pattern in a plan view, over the entire display area DPA. The second bank BNL2 may be disposed along the boundaries of each of the subpixels SPXn to separate the subpixels SPXn from one another. Also, the second bank BNL2 may be disposed to surround and separate the emission area EMA of each of the subpixels SPXn.

The pixel PX or each of subpixels SPXn of the pixel PX may include a pixel driving circuit. Lines may be provided to pass through or by the pixel PX or each of the subpixels SPXn and apply driving signals to the pixel driving circuit. The pixel driving circuit may include transistors and capacitors. The number of transistors and capacitors included in the pixel driving circuit may vary. In an example, the pixel driving circuit may have a "3T1C" structure including three transistors and one capacitor. The pixel driving circuit will hereinafter be described as having the "3T1C" structure, but the disclosure is not limited thereto. In other embodiments, various other structures such as a "2T1C", "7T1C", or "6T1C" structure may also be applicable to the pixel driving circuit.

Figure 3:
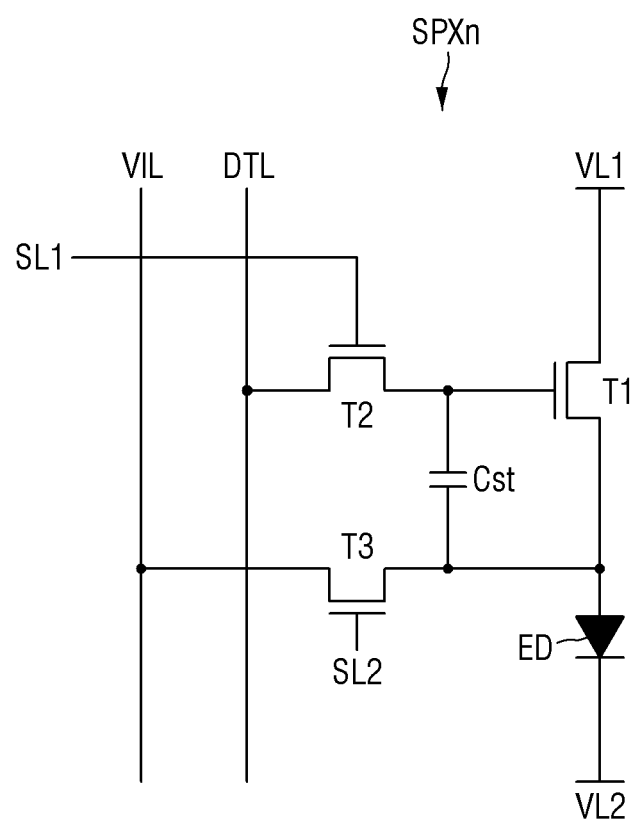
FIG. 3 is a schematic circuit diagram of an equivalent circuit of a subpixel of the display device of FIG. 1.

FIG. 3 is a schematic circuit diagram of an equivalent circuit of a subpixel of the display device of FIG. 1.

Referring to FIG. 3, the display device 10 may include, in a subpixel SPXn, a light-emitting element ED, three transistors (i.e., first, second, and third transistors T1, T2, and T3), and one storage capacitor Cst.

The light-emitting element ED may emit light in accordance with a current applied thereto via the first transistor T1. The light-emitting element ED may emit light of a particular wavelength range in accordance with electric signals applied thereto from first and second electrodes (not illustrated) connected thereto.

A first end portion of the light-emitting element ED may be connected to a source electrode of the first transistor T1, and a second end portion of the light-emitting element ED may be connected to a second voltage line VL2, to which a low-potential voltage (or a second power supply voltage) lower than a high-potential voltage (or a first power supply voltage) that may be provided to a first voltage line VL1 may be provided.

The first transistor T1 may control a current that flows from the first voltage line VL1 to the light-emitting element ED in accordance with the difference in voltage between the gate electrode and the source electrode of the first transistor T1. In an example, the first transistor T1 may be a driving transistor for driving the light-emitting element ED. The gate electrode of the first transistor T1 may be connected to the source electrode of the second transistor T2, the source electrode of the first transistor T1 may be connected to the first end portion of the light-emitting element ED, and the drain electrode of the first transistor T1 may be connected to the first voltage line VL1, to which the first power supply voltage may be provided.

The second transistor T2 may be turned on by a scan signal from a first scan line SL1 and may connect a data line DTL to the gate electrode of the first transistor T1. The gate electrode of the second transistor T2 may be connected to the first scan line SL1, the source electrode of the second transistor T2 may be connected to the gate electrode of the first transistor T1, and the drain electrode of the second transistor T2 may be connected to the data line DTL.

The third transistor T3 may be turned on by a scan signal from a second scan line SL2 to connect an initialization voltage line VIL to one end of the light-emitting element ED. The gate electrode of the third transistor T3 may be connected to the second scan line SL2, the drain electrode of the third transistor T3 may be connected to the initialization voltage line VIL, and the source electrode of the third transistor T3 may be connected to one end of the light-emitting element ED or the source electrode of the first transistor T1. The first and second scan lines SL1 and SL2 are illustrated as being separate lines, but the disclosure is not limited thereto. In other embodiments, the first and second scan lines SL1 and SL2 may be integrally formed as a single scan line, in which case, the second and third transistors T2 and T3 may be turned on at the same time by the same scan signal.

The source electrodes and the drain electrodes of the first, second, and third transistors T1, T2, and T3 are not limited to the above description. The first, second, and third transistors T1, T2, and T3 may be formed as thin-film transistors (TFTs). FIG. 3 illustrates that the first, second, and third transistors T1, T2, and T3 may be formed as N-type metal-oxide semiconductor field-effect transistors (MOSFETs), but the disclosure is not limited thereto. In other embodiments, the first, second, and third transistors T1, T2, and T3 may be formed as P-type MOSFETs. In yet other embodiments, some of the first, second, and third transistors T1, T2, and T3 may be formed as N-type MOSFETS, and the other transistor(s) may be formed as P-type MOSFETs.

The storage capacitor Cst may be formed between the gate electrode and the source electrode of the first transistor T1. The storage capacitor Cst may store a differential voltage between the gate electrode and the source electrode of the first transistor T1.

The structure of a pixel PX of the display device 10 will hereinafter be described.

Figure 4:
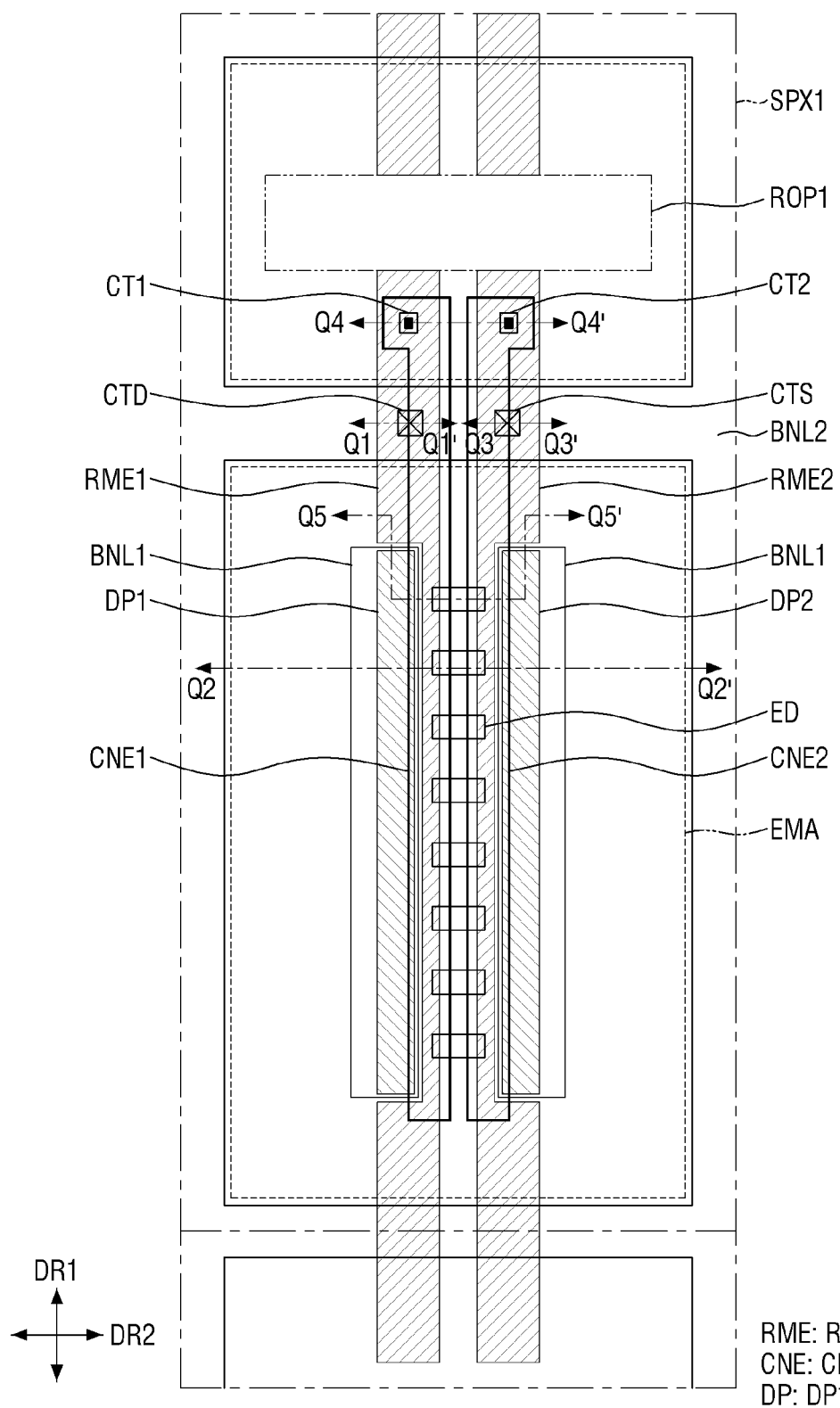
FIG. 4 is a schematic plan view of a first subpixel of FIG. 2.
Figure 5:
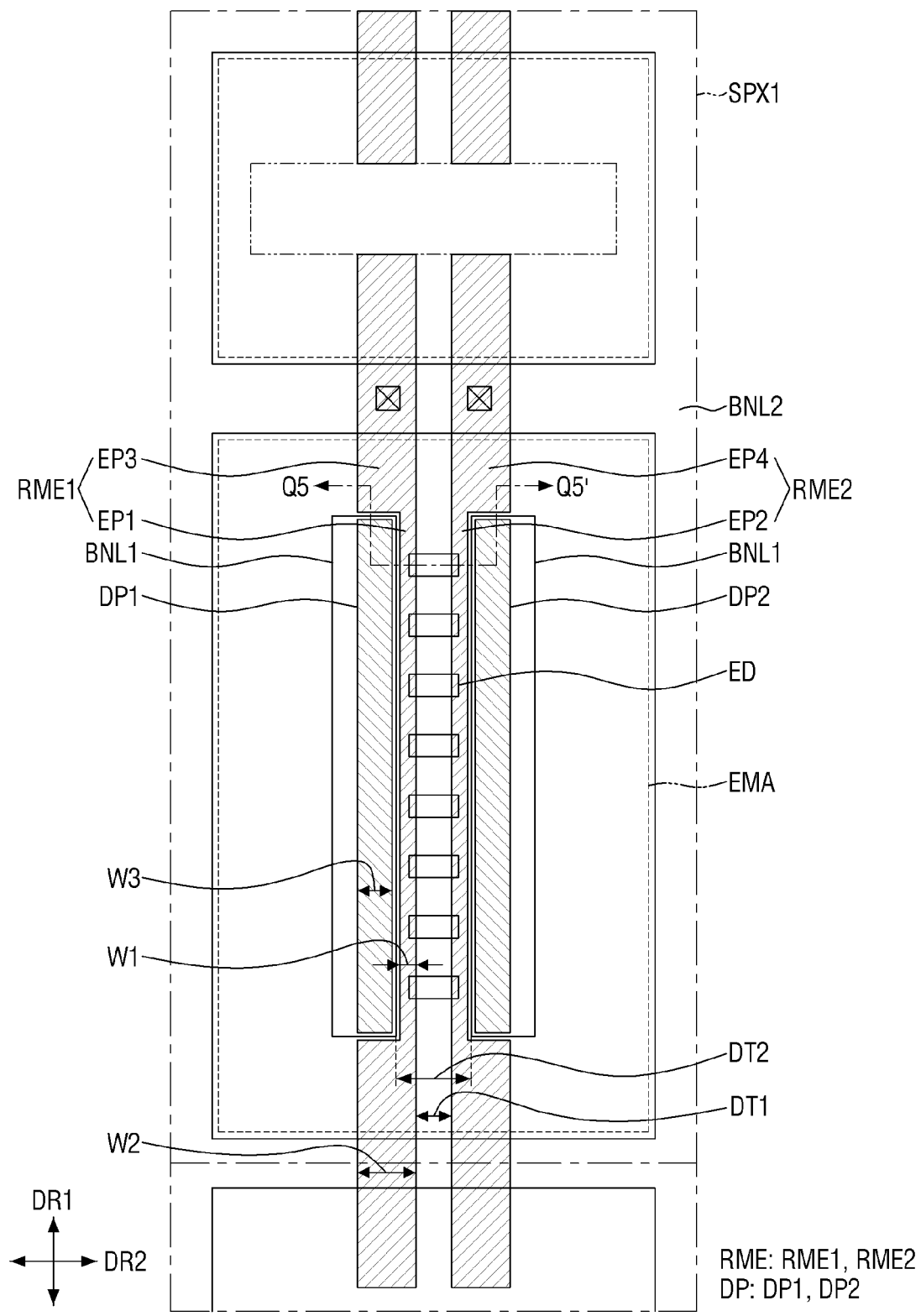
FIG. 5 is a schematic plan view illustrating the layout of electrodes and first banks in the first subpixel of FIG. 2.
Figure 6:
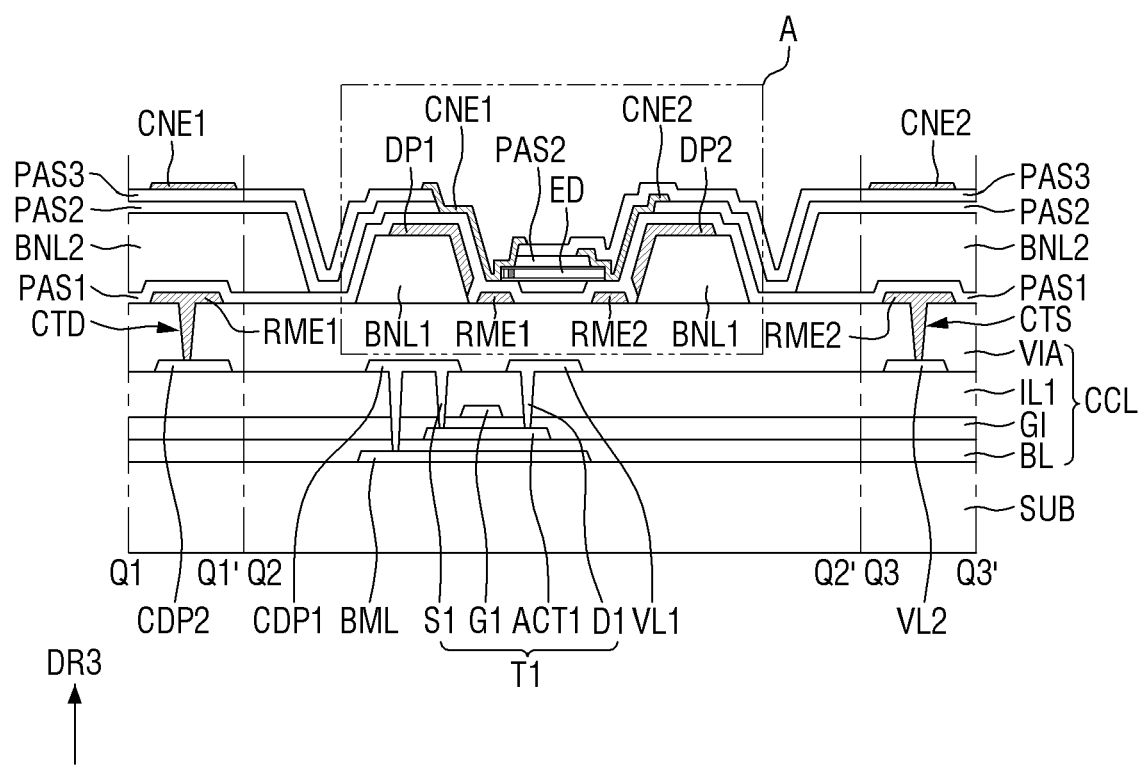
FIG. 6 is a schematic cross-sectional view taken along lines Q1-Q1', Q2-Q2', and Q3-Q3' of FIG. 4.
Figure 7:
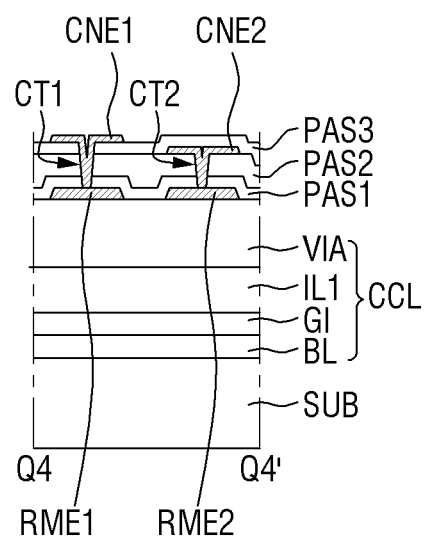
FIG. 7 is a schematic cross-sectional view taken along line Q4-Q4' of FIG. 4.
Figure 8:
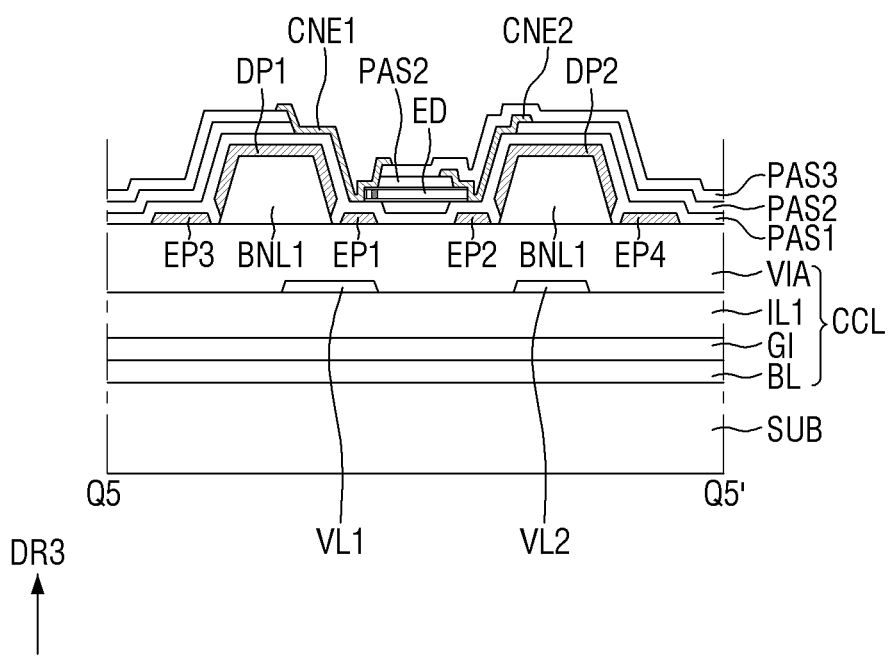
FIG. 8 is a schematic cross-sectional view taken along line Q5-Q5' of FIGS. 4 and 5.

FIG. 4 is a schematic plan view of the first subpixel of FIG. 2. FIG. 5 is a schematic plan view illustrating the layout of electrodes and first banks in the first subpixel of FIG. 2. FIG. 6 is a schematic cross-sectional view taken along lines Q1-Q1', Q2-Q2', and Q3-Q3' of FIG. 4. FIG. 7 is a schematic cross-sectional view taken along line Q4-Q4' of FIG. 4. FIG. 8 is a schematic cross-sectional view taken along line Q5-Q5' of FIGS. 4 and 5.

FIG. 4 illustrates the first subpixel SPX1 included in the pixel PX of FIG. 2 and part of another subpixel SPXn adjacent to the first subpixel SPX1 in the first direction DR1, and FIG. 5 illustrates the layout of first banks BNL1, the electrodes RME, the light-emitting elements ED, and dummy patterns DP in the first subpixel SPX1. FIG. 6 illustrates a cross-sectional view taken across both end portions of a light-emitting element ED included in the first subpixel SPX1. FIG. 7 illustrates a cross-sectional view taken across a plurality of first and second contacts CT1 and CT2 in the first subpixel SPX1, and FIG. 8 illustrates a cross-sectional view illustrating the layout of the first banks BNL1, the electrodes RME, and the dummy patterns DP in the first subpixel SPX1.

Referring to FIGS. 4 through 8 and further to FIG. 2, the display device 10 may include, in the first subpixel SPX1, the first substrate SUB, and may further include a semiconductor layer, conductive layers, and insulating layers, which may be disposed on the first substrate SUB. The semiconductor layer, the conductive layers, and the insulating layers may form a circuit layer CCL and a display element layer of the display device 10.

The first substrate SUB may be an insulating substrate. The first substrate SUB may be formed of an insulating material such as glass, quartz, a polymer resin, or a combination thereof. The first substrate SUB may be a rigid substrate or may be a flexible substrate that may be bendable, foldable, or rollable.

A first conductive layer may be disposed on the first substrate SUB. The first conductive layer may include a lower metal layer BML, and the lower metal layer BML, may overlap with an active layer ACT1 of a first transistor T1. The lower metal layer BML may include a material capable of blocking the transmission of light and may prevent light from being incident upon the active layer ACT1 of the first transistor T1. The lower metal layer BML may not be provided.

A buffer layer BL may be disposed on the lower metal layer BML and the first substrate SUB. The buffer layer BL may be formed on the first substrate SUB to protect the transistors of the first subpixel SPX1 from moisture that may penetrate through the first substrate SUB, which may be vulnerable to moisture, and may perform a surface planarization function.

The semiconductor layer may be disposed on the buffer layer BL. The semiconductor layer may include the active layer ACT1 of the first transistor T1. The active layer ACT1 may be disposed to partially overlap with a gate electrode G1 of the first transistor T1 in a second conductive layer that will be described later.

The semiconductor layer may include polycrystalline silicon, monocrystalline silicon, an oxide semiconductor, or a combination thereof. In other embodiments, the semiconductor layer may include polycrystalline silicon. The oxide semiconductor may be an oxide semiconductor containing indium (In). In an example, the oxide semiconductor may be at least one of indium tin oxide (ITO), indium zinc oxide (IZO), indium gallium oxide (IGO), indium zin tin oxide (IZTO), indium gallium tin oxide (IGTO), and indium gallium zinc tin oxide (IGZTO).

FIGS. 3 through 7 illustrate that the first subpixel SPX1 may include only one first transistor T1, but the disclosure is not limited thereto. For example, the first subpixel SPX1 may include more than one transistor.

A first gate insulating layer GI may be disposed on the semiconductor layer and the buffer layer BL. The first gate insulating layer GI may function as a gate insulating film for the first transistor T1.

A second conductive layer may be disposed on the first gate insulating layer GI. The second conductive layer may include the gate electrode G1 of the first transistor T1. The gate electrode G1 may be disposed to overlap with the channel region of the active layer ACT1 in a thickness direction, i.e., in a third direction DR3.

A first interlayer insulating layer IL1 may be disposed on the second conductive layer. The first interlayer insulating layer IL1 may function as an insulating film between the second conductive layer and layers disposed on the second conductive layer and may protect the second conductive layer.

A third conductive layer may be disposed on the first interlayer insulating layer IL1 The third conductive layer may include first and second voltage lines VL1 and VL2 and a plurality of first and second conductive patterns CDP1 and CDP2.

A high-potential voltage (or a first power supply voltage) to be delivered to a first electrode RME1 may be applied to the first voltage line VL1, and a low-potential voltage (or a second power supply voltage) to be delivered to a second electrode RME2 may be applied to the second voltage line VL2. Part of the first voltage line VL1 may be in contact with the active layer ACT1 of the first transistor T1 through a contact hole that penetrates the first interlayer insulating layer IL1 and the first gate insulating layer GI. The first voltage line VL1 may function as a drain electrode D1 of the first transistor T1.

A first conductive pattern CDP1 may be in contact with the active layer ACT1 of the first transistor T1 through a contact hole that penetrates the first interlayer insulating layer IL1 and the first gate insulating layer GI. Also, the first conductive pattern CDP1 may be in contact with the lower metal layer BML, through another contact hole. The first conductive pattern CDP1 may function as a source electrode S1 of the first transistor T1.

A second conductive pattern CDP2 may be electrically connected to the first transistor T1 via the first conductive pattern CDP1. The first and second conductive patterns CDP1 and CDP2 are illustrated as being separate from each other, but in other embodiments, the second conductive pattern CDP2 may be integrally formed with the first conductive pattern CDP1 and may thus form a single pattern together with the first conductive pattern CDP1. The second conductive pattern CDP2 may be connected to the first electrode RME1, and the first transistor T1 may transmit the first power supply voltage, applied thereto from the first voltage line VL1, to the first electrode RME1.

The first and second conductive patterns CDP1 and CDP2 are illustrated as being formed in the same layer, but the disclosure is not limited thereto. In other embodiments, the second conductive pattern CDP2 may be formed in a different conductive layer from the first conductive pattern CDP1, for example, in a fourth conductive layer disposed on the third conductive layer with a number of insulating layers interposed therebetween. The first and second voltage lines VL1 and VL2 may be formed in the fourth conductive layer, rather than in the third conductive layer, and the first voltage line VL1 may be electrically connected to the drain electrode D1 of the first transistor T1 via another conductive pattern.

Although not illustrated, the second and third conductive layers may further include capacitor electrodes of storage capacitors. As the capacitor electrodes of the storage capacitors may be disposed in different layers, they may form capacitors in an insulating layer therebetween. In some embodiments, the capacitor electrodes of the storage capacitors may be integrally formed with the gate electrode G1 and the source electrode S1 of the first transistor T1, but the disclosure is not limited thereto.

Each of the buffer layer BL, the first gate insulating layer G, and the first interlayer insulating layer IL1 may consist of a plurality of inorganic layers that are alternately stacked. In an example, each of the buffer layer BL, the first gate insulating layer G, and the first interlayer insulating layer IL1 may be formed as a double- or multilayer in which inorganic layers of at least one of silicon oxide ($SiO_x$), silicon nitride ($SiN_x$), and silicon oxynitride ($SiO_xN_y$) may be alternately stacked, but the disclosure is not limited thereto. In another example, each of the buffer layer BL, the first gate insulating layer GI, and the first interlayer insulating layer IL1 may be formed as a single inorganic layer including silicon oxide ($SiO_x$), silicon nitride ($SiN_x$), and/or silicon oxynitride ($SiO_xN_y$). Also, in some embodiments, the first interlayer insulating layer IL1 may be formed of an organic insulating material such as polyimide (PI).

The second and third conductive layers may be formed as single layers or multilayers including molybdenum (Mo), aluminum (Al), chromium (Cr), gold (Au), titanium (Ti), nickel (Ni), neodymium (Nd), copper (Cu), or an alloy thereof, but the disclosure is not limited thereto.

A via layer VIA may be disposed on the third conductive layer. The via layer VIA may include an organic insulating material such as, for example, PI, and may perform a surface planarization function.

First banks BNL1, electrodes RME, dummy patterns DP, the second bank BNL2, light-emitting elements ED, and connecting electrodes CNE may be disposed on the via layer VIA as the display element layer. First, second, and third insulating layers PAS1, PAS2, and PAS3 may also be disposed on the via layer VIA.

The first banks BNL1 may be disposed directly on the via layer VIA. The first banks BNL1 may extend in the first direction DR1 and may be spaced apart from one another in the second direction DR2. In an example, the first banks BNL1 may extend in the first direction DR1 in the middle of the emission area EMA of the first subpixel SPX1, surrounded by the second bank BNL2. The first banks BNL1 may be disposed on the left and right sides of the center of the emission area EMA to be spaced apart from each other. The first banks BNL1, which are spaced apart from each other, may have the same width, but the disclosure is not limited thereto. In other embodiments, the first banks BNL1 may have different widths. The first banks BNL1 may be disposed in the emission area EMA, over the entire surface of the display area DPA, and may form island patterns that have a relatively small width and extend in a direction. Light-emitting elements ED may be disposed between the first banks BNL1.

The first banks BNL1 may protrude at least in part from the top surface of the via layer VIA. Each of protruding parts of the first banks BNL1 or of the second bank BNL2 may have inclined or curved side surfaces, and light emitted by the light-emitting elements ED may be reflected by the dummy patterns DP on the first banks BNL1 or on the second bank BNL2 and may thus be emitted in an upward direction with respect to the via layer VIA. In other embodiments, each of the first banks BNL1 may have a semicircular or semielliptical shape with a curved outer surface, in a cross-sectional view. The first banks BNL1 may include an organic insulating material such as PI, but the disclosure is not limited thereto.

A plurality of electrodes RME may be disposed in the first subpixel SPX1 to extend in one direction. The electrodes RME may extend in the first direction DR1 to be disposed in and across the emission area EMA and the subarea SA of the first subpixel SPX1 and may be spaced apart from each other in the second direction DR2. The electrodes RME of the first subpixel SPX1 may be spaced apart from electrodes RME of another subpixel SPXn in a first separation part ROP1 of the subarea SA of the first subpixel SPX1.

The display device 10 may include the first and second electrodes RME1 and RME2, which are disposed in the first subpixel SPX1. The first electrode RME1 may be disposed on the left side of the center of the emission area EMA, and the second electrode RME2 may be spaced apart from the first electrode RME1 in the second direction DR2 and may be disposed on the right side of the center of the emission area EMA.

The first and second electrodes RME1 and RME2 may be arranged in part parallel to the first banks BNL1 in the first direction DR1. The first and second electrodes RME1 and RME2 may be arranged in part between the first banks BNL1, which may be spaced apart from each other in the second direction DR2. For example, the electrodes RME may extend in the first direction DR1, on both sides, in the first direction DR1, of each of the first banks BNL1, and may be disposed to bypass the first banks BNL1. Each of the first and second electrodes RME1 and RME2 may include parts that are disposed on both sides, in the first direction DR1, of each of the first banks BNL1 and part that is disposed between the first banks BNL1, and may be spaced apart from the first banks BNL1.

The first electrode RME1 may include a first part EP1, which may be disposed between the first banks BNL1 that may be spaced apart from each other in the second direction DR2, and the second electrode RME2 may include a second part EP2, which may be spaced apart from the first part EP1 in the second direction DR2 and may be disposed between the first banks BNL1. The first and second parts EP1 and EP2 may be disposed between the first banks BNL1 to be spaced apart from, and face, the first banks BNL1. The light-emitting elements ED may be disposed on the first and second parts EP1 and EP2 of the first and second electrodes RME1 and RME2, between the first banks BNL1.

The first electrode RME1 may further include third parts EP3, which may be connected to the first part EP1 and may be disposed on both sides, in the first direction DR1, of one of the first banks BNL1, and the second electrode RME2 may further include fourth parts EP4, which may be connected to the second part EP2 and may be disposed on both sides, in the first direction DR1, of another first bank BNL1. Sides of the third parts EP3 and sides of the fourth parts EP4 that are opposite to the sides of the third parts EP3 may be parallel to sides of the first and second parts EP1 and EP2 that may be opposite to each other, in the first direction DR1. The first and second electrodes RME1 and RME2 may generally extend in a direction and may be inwardly recessed on outer sides thereof. For example, the first electrode RME1 may be disposed to face the right side and parts of the upper and lower sides of the left first bank BNL1, and the second electrode RME2 may be disposed to face the left side and parts of the upper and lower sides of the right first bank BNL1.

The first part EP1, the second part EP2, the third parts EP3, and the fourth parts EP4 may be defined by their locations relative to the first banks BNL1 and may have different widths. In an example, the width of the first and second parts EP1 and EP2 of the first and second electrodes RME1 and RME2, i.e., a first width W1, may be smaller than the width of the third parts EP3 and the fourth parts EP4, i.e., a second width W2. The third parts EP3 and the fourth parts EP4 may extend in a direction and may have a reduced width at locations where they meet the first banks BNL1 so that the first and second parts EP1 and EP2 may appear. The electrodes RME may extend in a direction from a side to another side, in the first direction DR1, of each of the first banks BNL1, but may bypass the first banks BNL1. Accordingly, parts of the electrodes RME may be spaced apart from sides of the first banks BNL1 and may be disposed directly on the via layer VIA not to overlap with the first banks BNL1 in the thickness direction.

The dummy patterns DP may be disposed on parts of the first banks BNL1 where the electrodes RME are not disposed. The dummy patterns DP may have a similar shape to the first banks BNL1 and may be spaced apart from the electrodes RME, on the first banks BNL1. The dummy patterns DP may include a first dummy pattern DP1, which may be disposed on one of the first banks BNL1 and may be spaced apart from the first electrode RME1, and a second dummy pattern DP2, which may be disposed on another first bank BNL1 and may be spaced apart from the second electrode RME2.

The first dummy pattern DP1 may extend in the first direction DR1 and may be disposed on the left first bank BNL1, which may be disposed in a left part of the emission area EMA of the first subpixel SPX1. The first dummy pattern DP1 may be arranged parallel to the third parts EP3 of the first electrode RME1 in the first direction DR1 and may be spaced apart from the first part EP1 and the third parts EP3 of the first electrode RME1. A first side, in the second direction DR2, of the first dummy pattern DP1, i.e., the right side of the first dummy pattern DP1, may be spaced apart from, and face, the first part EP1 in a plan view, and a second side, in the second direction DR2, of the first dummy pattern DP1, i.e., the left side of the first dummy pattern DP1, may be parallel to the left sides of the third parts EP3 in the first direction DR1, in a plan view. The first dummy pattern DP1 may be spaced apart from the first electrode RME1, along sides of the left first bank BNL1.

Similarly, the second dummy pattern DP2 may extend in the first direction DR1 and may be disposed on the right first bank BNL1, which may be disposed in a right part of the emission area EMA of the first subpixel SPX1. The second dummy pattern DP2 may be arranged parallel to the fourth parts EP4 of the second electrode RME2 in the first direction DR1 and may be spaced apart from the second part EP2 and the fourth parts EP4 of the second electrode RME2. A second side, in the second direction DR2, of the second dummy pattern DP2, i.e., the left side of the second dummy pattern DP2, may be spaced apart from, and face, the second part EP2 in a plan view, and a first side, in the second direction DR2, of the second dummy pattern DP2, i.e., the right side of the second dummy pattern DP2, may be parallel to the right sides of the fourth parts EP4 in the first direction DR1, in a plan view. The second dummy pattern DP2 may be spaced apart from the second electrode RME2, along sides of the right first bank BNL1. Thus, the distance between the first and second dummy patterns DP1 and DP2 may be greater than the distance between the first banks BNL1.

The electrodes RME and the dummy patterns DP may be initially formed as single electrode lines and may be obtained by patterning the single electrode lines. The electrode lines may extend in the first direction DR1 and may be disposed to cover parts of the first banks BNL1, and parts of the electrode lines along the sides of each of the first banks BNL1 may be removed by patterning. As a result, the electrode lines may be separated into the dummy patterns DP, which may be disposed on the first banks BNL1, and the electrodes RME, which may be disposed directly on the via layer VIA, and outer sides of the third parts EP3 and outer sides of each of the fourth parts EP4 of the electrodes RME may be parallel to outer sides of the dummy patterns DP.

The third parts EP3 of the first electrode RME1 and the fourth parts EP4 of the second electrode RME2 may have the same width as the electrode lines. Thus, the first and second parts EP1 and EP2 of the first and second electrodes RME1 and RME2 and the dummy patterns DP may have a smaller width than the third parts EP3 and the fourth parts EP4. In an example, the width, in the second direction DR2, of the first and second dummy patterns DP1 and DP2, i.e., a third width W3, may be smaller than the width of the electrodes RME, i.e., the second width W2, but may be greater than the width of the first and second parts EP1 and EP2 between the first banks BNL1, i.e., the first width W1.

The width, in the second direction DR2, of the dummy patterns DP3, i.e., the third width W3, may be smaller than the width of the first banks BNL1. The first and second dummy patterns DP1 and DP2 may cover at least inclined side surfaces of each of the first banks BNL1. As the dummy patterns DP may be narrower than the first banks BNL1, the dummy patterns DP may be disposed to cover parts of side surfaces of the first banks BNL1 that may be opposite to each other.

As will be described later, the light-emitting elements ED may be disposed between the first banks BNL1. At least one end portion of each of the light-emitting elements ED may be disposed on the first part EP1 of the first electrode RME1 or the second part EP2 of the second electrode RME2, or both end portions of each of the light-emitting elements ED may be disposed on the first and second parts EP1 and EP2. The electrodes RME may be electrically connected to the light-emitting elements through the connecting electrodes CNE.

The first and second electrodes RME1 and RME2 may be connected to the third conductive layer through first and second electrode contact holes CTD and CTS, respectively, which may be formed in an area that overlaps with the second bank BNL2. The first electrode RME1 may be in contact with the second conductive pattern CDP2 through the first electrode contact hole CTD, which penetrates the via layer VIA. The second electrode RME2 may be in contact with the second voltage line VL2 through the second electrode contact hole CTS, which penetrates the via layer VIA. The first electrode RME1 may be electrically connected to the driving transistor T1 via the first and second conductive patterns CDP1 and CDP2 and may thus receive the first power supply voltage, and the second electrode RME2 may be electrically connected to the second voltage line VL2 and may thus receive the second power supply voltage. The electrodes RME may be electrically connected to the third conductive layer and the light-emitting elements ED and may transmit electric signals for causing the light-emitting elements ED to emit light.

The electrodes RME may be used to form an electric field in the first subpixel SPX1 to align the light-emitting elements ED during the fabrication of the display device 10. Electric signals for aligning the light-emitting elements ED may be applied to the electrodes RME or electrode lines formed during the fabrication of the display device 10, after the separation of the dummy patterns DP along sides of each of the first banks BNL1. As electric signals may be applied to different electrode lines, an electric field may be formed on the first and second parts EP1 and EP2 of the electrodes RME, between the first banks BNL1, and the light-emitting elements ED may be aligned on the electrodes RME by the electric field. For example, the electrodes RME may be used to apply electric signals for aligning the light-emitting elements ED and electric signals for causing the light-emitting elements ED to emit light.

The light-emitting elements ED may extend in one direction, and the light-emitting elements ED may be arranged such that the direction in which the light-emitting elements ED extend may be at a right angle or an inclination with respect to the direction in which the electrodes RME extend. Light may be emitted from both end portions, in the direction in which the light-emitting elements ED extend, of each of the light-emitting elements ED.

Figure 9:
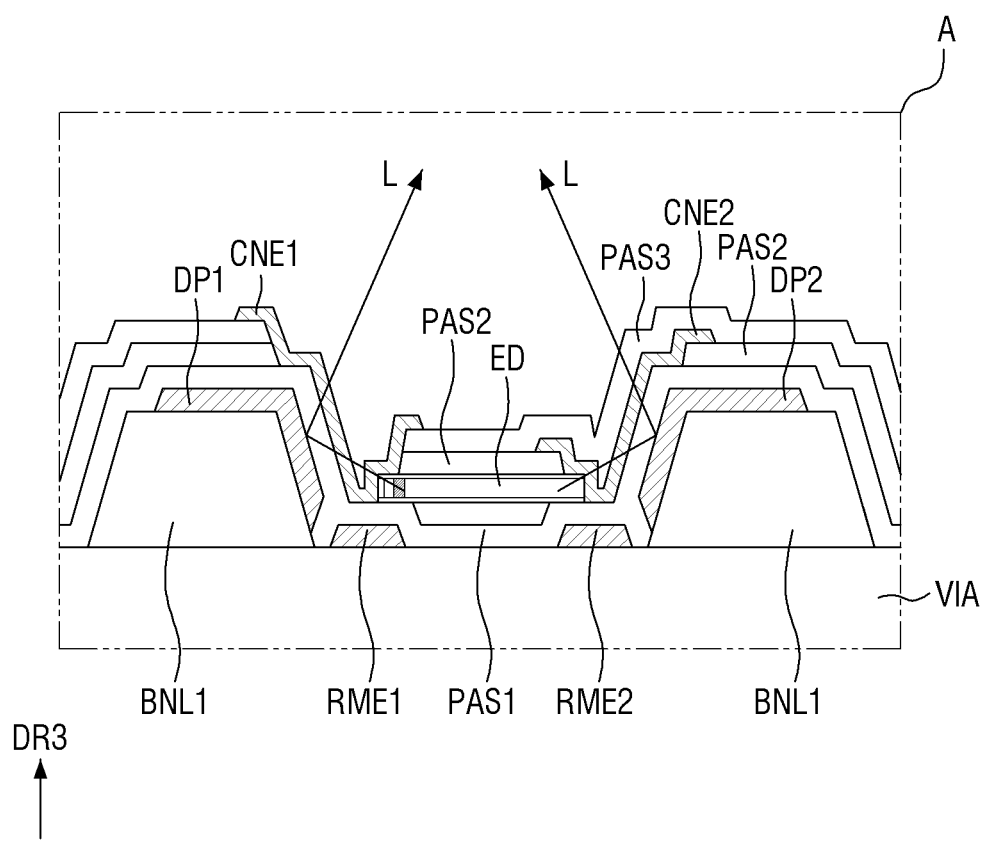
FIG. 9 is an enlarged schematic cross-sectional view of part A of FIG. 8.

FIG. 9 is an enlarged schematic cross-sectional view of part A of FIG. 6. FIG. 9 illustrates how light L emitted from both end portions of each of the light-emitting elements ED travels.

Referring to FIG. 9 and further to FIG. 6, the light-emitting elements ED may extend in one direction and may be arranged in a direction parallel to the top surface of the via layer VIA, and light L emitted by the light-emitting elements ED may travel not in the upward direction, but in the direction parallel to the top surface of the via layer VIA. Both end portions of each of the light-emitting elements ED may face the first banks BNL1, and the light L may travel toward the dummy patterns DP on the first banks BNL1.

The dummy patterns DP may include a material with high reflectance and may reflect the light L. The first banks BNL1 may protrude from the top surface of the via layer VIA, and the dummy patterns DP may be disposed to cover the top surfaces of the first banks BNL1 or at least inclined side surfaces of the first banks BNL1. The light L, emitted from the light-emitting elements ED in the direction parallel to the top surface of the via layer VIA, may be reflected by inclined side surfaces of the dummy patterns DP and may thus be emitted in the upward direction. As the dummy patterns DP are disposed on the first banks BNL1 in consideration of the direction in which the light-emitting elements ED may output light, the front emission efficiency of the light-emitting elements ED can be improved.

As already mentioned above, the dummy patterns DP may be formed by the same process as the electrodes RME and may thus include the same material as the electrodes RME. In an example, the dummy patterns DP and the electrodes RME may include a conductive material with high reflectance. The electrodes RME may transmit electric signals for causing the light-emitting elements ED to emit light, and the dummy patterns DP may emit light emitted by the light-emitting elements ED, in the upward direction.

The dummy patterns DP may include a conductive material, may be formed to be spaced apart from the electrodes RME, and may be isolated from the connecting electrodes CNE by the first insulating layer PAS1. The dummy patterns DP may be arranged in a state of being electrically insulated, i.e., in a floated state, on the first banks BNL1. Accordingly, during the alignment of the light-emitting elements ED, an electric field may be formed mainly on the first and second parts EP1 and EP2 of the electrodes RME, and as a result, the number of light-emitting elements ED deviated from their designated locations between the first banks BNL1 can be reduced.

As the electrodes RME may be disposed in part between the first banks BNL1, the light-emitting elements ED can be properly aligned and caused to emit light. Also, as the dummy patterns DP, which are disposed on the first banks BNL1 but separated from the electrodes RME, are provided, the front emission efficiency of the light-emitting elements ED can be improved.

The electrodes RME may be spaced apart from each other in the second direction DR2, and the first banks BNL1 may be spaced apart from each other in the second direction DR2. The distance between the electrodes RME and the distance between the first banks BNL1 may be designed in consideration of how the light-emitting elements ED and the electrodes RME are arranged or electrically connected.

The distance between the first and second electrodes RME1 and RME2, i.e., a first distance DT1, may be smaller than the distance between the first banks BNL1, i.e., a second distance DT2, and the first distance DT1 may be smaller than the length of the light-emitting elements ED. As the first distance DT1 is designed to be smaller than the length of the light-emitting elements ED, most of the light-emitting elements ED can have both end portions thereof placed on the first and second parts EP1 and EP2 of the first and second electrodes RME1 and RME2.

The width of the first and second parts EP1 and EP2 of the first and second electrodes RME1 and RME2, i.e., the first width W1, may affect the distance from the light-emitting elements ED to the dummy patterns DP. To minimize the risk of the light L failing to be reflected by the dummy patterns DP and leaking in other directions, the width of the first and second parts EP1 and EP2, i.e., the first width W1, may be relatively small. The first width W1 may be smaller than the distance between the first and second parts EP1 and EP2, i.e., the first distance DT1.

The first subpixel SPX1 is illustrated as having two electrodes RME disposed therein, but the disclosure is not limited thereto. The display device 10 may further include, in the first subpixel SPX1, other electrodes RME in addition to the first and second electrodes RME1 and RME2. In an embodiment where the display device 10 includes more than two electrodes RME in the first subpixel SPX1, an electrode other than the first and second electrodes RME1 and RME2 may be connected to the third conductive layer. Also, the locations of the first and second electrode contact holes CTD and CTS are not particularly limited. For example, the first and second electrode contact holes CTD and CTS may be formed in an area other than that below the second bank BNL2, for example, in the emission area EMA or the subarea SA of the first subpixel SPX1.

As already mentioned above, the electrodes RME and the dummy patterns DP may include the same material, for example, a conductive material with high reflectance. In an example, the electrodes RME and the dummy patterns DP may include at least one metal such as silver (Ag), Cu, or Al or an alloy of Al, Ni, or lanthanum (La), an alloy containing Al, Ni, or La, or a stack of the alloy and a layer of a metal such as Ti or Mo. In some embodiments, the electrodes RME and the dummy patterns DP may be formed as double layers or multilayers in which an alloy containing Al and at least one metal layer of Ti or Mo may be stacked. The electrodes RME may be electrically connected to the light-emitting elements ED through the connecting electrodes CNE, and the dummy patterns DP may reflect light, emitted by the light-emitting elements ED and traveling toward side surfaces of each of the first banks BNL1, in the upward direction.

However, the disclosure is not limited thereto, and the electrodes RME and the dummy patterns DP may further include a transparent conductive material. In an example, the electrodes RME may include a material such as ITO, IZO, ITZO, or a combination thereof. In some embodiments, the electrodes RME and the dummy patterns DP may have a structure in which one or more layers of a transparent conductive material and one or more metal layers with high reflectance are stacked or may be formed as single layers including a transparent conductive material and a metal with high reflectance. In an example, the electrodes RME may have a stack structure such as ITO/Ag/ITO/, ITO/Ag/IZO, or ITO/Ag/ITZO/IZO.

Referring again to FIGS. 3 through 7, the first insulating layer PAS1 may be disposed on the via layer VIA, the first banks BNL1, the electrodes RME, and the dummy patterns DP. The first insulating layer PAS1 may be disposed to cover the entire electrodes RME and the entire dummy patterns DP and may protect and insulate the electrodes RME and the dummy patterns DP. Also, the first insulating layer PAS1 may prevent the light-emitting elements ED from being placed in direct contact with, and thereby damaged by, other members.

The top surface of the first insulating layer PAS1 may be formed to be recessed in part between the electrodes RME, which may be spaced apart from each other in the second direction DR2. The light-emitting elements ED may be disposed on a recessed part of the top surface of the first insulating layer PAS1, and space may be formed between the light-emitting elements ED and the first insulating layer PAS1.

The first insulating layer PAS1 may include the first and second contacts CT1 and CT2, which expose parts of the top surfaces of the electrodes RME. The first and second contacts CT1 and CT2 may penetrate the first insulating layer PAS1, and the connecting electrodes CNE that will be described later may be in contact with parts of the electrodes RME that may be exposed by the first and second contacts CT1 and CT2.

The second bank BNL2 may be disposed on the first insulating layer PAS1. In a plan view, the second bank BNL2 may include parts that extend in the first direction DR1 and parts that extend in the second direction DR2 and may thus be arranged in a lattice pattern. The second bank BNL2 may be disposed along the boundaries of the first subpixel SPX1 to separate the first subpixel SPX1 from other neighboring subpixels SPXn. Also, the second bank BNL2 may be disposed to surround the emission area EMA and the subarea of the first subpixel SPX1, and areas that are defined and opened by the second bank BNL2 may be the emission area EMA and the subarea SA of the first subpixel SPX1.

The second bank BNL2 may have a height. In some embodiments, the height of the second bank BNL2 may be greater than the height of the first banks BNL1, and the thickness of the second bank BNL2 may be the same as, or greater than, the thickness of the first banks BNL1. The second bank BNL2 may prevent ink from spilling over from one subpixel SPXn to another subpixel SPXn during inkjet printing as performed during the fabrication of the display device 10. The second bank BNL2 may prevent ink having different sets of light-emitting elements ED for different subpixels SPXn from being mixed together. The second bank BNL2, like the first banks BNL1, may include PI, but the disclosure is not limited thereto.

The light-emitting elements ED may be disposed on the first insulating layer PAS1. Each of the light-emitting elements ED may include a plurality of layers that are arranged in a direction parallel to the top surface of the first substrate SUB. The light-emitting elements ED may be arranged such that the direction in which the light-emitting elements ED extend may be parallel to the first substrate SUB, and the semiconductor layers included in each of the light-emitting elements ED may be sequentially arranged in the direction parallel to the top surface of the first substrate SUB. However, the disclosure is not limited thereto. In other embodiments, the plurality of layers included in each of the light-emitting elements ED may be arranged in a direction perpendicular to the first substrate SUB.

The light-emitting elements ED may be disposed on the electrodes RME, which may be spaced apart from each other in the second direction DR2, between the first banks BNL1. The light-emitting elements ED may be spaced apart from one another in the direction in which the electrodes RME extend, i.e., in the first direction DR1, and may be aligned substantially parallel to one another. The light-emitting elements ED may extend in one direction, and the length of the light-emitting elements ED may be greater than the minimum distance between the electrodes RME, which are spaced apart from each other in the second direction DR2. The light-emitting elements ED may be arranged such that both end portions thereof may be placed on different electrodes RME, and that the direction in which the electrodes RME extend may substantially form a right angle with the direction in which the light-emitting elements ED extend. However, the disclosure is not thereto. In other embodiments, the light-emitting elements ED may be arranged at an inclination with respect to the direction in which the electrodes RME extend.

Each of the light-emitting elements ED may include a plurality of semiconductor layers, and the light-emitting elements ED may emit light of different wavelengths depending on the materials of the semiconductor layers thereof. However, the disclosure is not limited thereto. In other embodiments, the light-emitting elements ED may emit light of the same color. Also, each of the light-emitting elements ED may include semiconductor layers that are doped with dopants of different conductivity types and may be aligned such that one end portion thereof may be oriented in a particular direction by an electric field formed on the electrodes RME. The first and second end portions of each of the light-emitting elements ED may be defined based on one semiconductor layer included in the corresponding light-emitting element ED. In an example, portions of the light-emitting elements ED that are placed on the first part EP1 of the first electrode RME1 may be the first end portions of the light-emitting elements ED, and portions of the light-emitting elements ED that are placed on the second part EP2 of the second electrode RME2 may be the second end portions of the light-emitting elements ED. In the embodiment where the display device 10 includes more than two electrodes RME in the first subpixel SPX1, the first end portions of light-emitting elements ED that are disposed on different electrodes RME may be oriented in different directions.

The light-emitting elements ED may be in contact with the connecting electrodes CNE and may thus be electrically connected to the connecting electrodes CNE. As some of the semiconductor layers included in each of the light-emitting elements ED may be exposed at both ends, in the length direction, of each of the light-emitting elements ED, the exposed semiconductor layers may be in contact with the connecting electrodes CNE. The light-emitting elements ED may be electrically connected to the electrodes RME or the conductive layers below the via layer VIA through the connecting electrodes CNE, and electric signals may be applied to the light-emitting elements ED so that the light-emitting elements ED may emit light of a particular wavelength range.

The second insulating layer PAS2 may be disposed on the light-emitting elements ED. In an example, the second insulating layer PAS2 may be disposed to cover parts of the outer surfaces of each of the light-emitting elements ED, but not cover both sides or both end portions of each of the light-emitting elements ED. Parts of the second insulating layer PAS2 on the light-emitting elements ED may extend in the first direction DR1 over the first insulating layer PAS1, in a plan view, and may thus form linear or island patterns in the first subpixel SPX1. The second insulating layer PAS2 may protect and fix the light-emitting elements ED during the fabrication of the display device 10. Also, the second insulating layer PAS2 may be disposed to fill the space between the light-emitting elements ED and the first insulating layer PAS1.

The second insulating layer PAS2 may also be disposed even on the first banks BNL1 and the second bank BNL2. The second insulating layer PAS2 may be disposed on the first insulating layer PAS1, but may expose both end portions of each of the light-emitting elements ED and parts of areas where the electrodes RME may be disposed. Although not specifically illustrated, the second insulating layer PAS2 may also be disposed even in the subarea SA of the first subpixel SPX1. The first and second insulating layers PAS1 and PAS2 may be partially removed from the first separation part ROP1 of the subarea SA of the first subpixel SPX1, together with the first insulating layer PAS1, during the formation of the electrodes RME. Part of the via layer VIA may be exposed in the first separation part ROP1, and the third insulating layer PAS3 may be disposed directly on the exposed part of the via layer VIA.

The connecting electrodes CNE and the third insulating layer PAS3 may be disposed on the second insulating layer PAS2.

The connecting electrodes CNE may be disposed on the light-emitting elements ED, the electrodes RME, and the dummy patterns DP. The connecting electrodes CNE may also be disposed in part on the second insulating layer PAS2 and may be insulated from one another by the second and third insulating layers PAS2 and PAS3. The connecting electrodes CNE may be in contact with the light-emitting elements ED and the electrodes RME. The connecting electrodes CNE may be in direct contact with the semiconductor layers exposed at both ends of each of the light-emitting elements ED and may be in contact with at least one of the electrodes RME through the first and second contacts CT1 and CT2, which penetrate the first insulating layer PAS1. Both end portions of each of the light-emitting elements ED may be electrically connected to the electrodes RME via the connecting electrodes CNE.

A first connecting electrode CNE1 may extend in the first direction DR1 and may be disposed on the first electrode RME1 and the first dummy pattern DP1. Part of the first connecting electrode CNE1 on the left first bank BNL1 may overlap with the first dummy pattern DP1, and another part of the first connecting electrode CNE1 may overlap with the first electrode RME1. The first connecting electrode CNE1 may be in contact with the first electrode RME1 through the first contact CT1, which exposes the top surface of the first electrode RME1, and with the first end portions of the light-emitting elements ED. On the contrary, the first connecting electrode CNE1 may not be in direct contact with the first dummy pattern DP1 so that the first dummy pattern DP1 may remain floated.

A second connecting electrode CNE2 may also extend in the first direction DR1 and may be disposed on the second electrode RME2 and the second dummy pattern DP2. Part of the second connecting electrode CNE2 on the right first bank BNL1 may overlap with the second dummy pattern DP2, and another part of the second connecting electrode CNE2 may overlap with the second electrode RME2. The second connecting electrode CNE2 may be in contact with the second electrode RME2 through the second contact CT2, which may expose the top surface of the second electrode RME2, and with the second end portions of the light-emitting elements ED. On the contrary, the second connecting electrode CNE2 may not be in direct contact with the second dummy pattern DP2 so that the second dummy pattern DP2 may remain floated.

The first and second connecting electrodes CNE1 and CNE2 may transmit electric signals applied to the first and second electrodes RME1 and RME2 to the light-emitting elements ED. The electric signals may be directly applied to the light-emitting elements ED. The first and second connecting electrodes CNE1 and CNE2 may be spaced apart from each other in the second direction DR2, in a plan view. The first and second connecting electrodes CNE1 and CNE2 may be disposed not to be in direct contact with each other, and the electric signals applied to the connecting electrodes CNE may flow through the light-emitting elements ED.

The first and second connecting electrodes CNE1 and CNE2 may be disposed in different layers. The first connecting electrode CNE1 may be disposed on the third insulating layer PAS3, and the second connecting electrode CNE2 may be disposed between the second and third insulating layers PAS2 and PAS3. The first and second connecting electrodes CNE1 and CNE2 may be spaced apart from each other and may be insulated from each other by the third insulating layer PAS3. However, the disclosure is not limited thereto. In other embodiments, the third insulating layer PAS3 may not be provided, and the first and second connecting electrodes CNE1 and CNE2 may be disposed directly on the second insulating layer PAS2. The first and second connecting electrodes CNE1 and CNE2 may be a distance apart from each other and may not be directly connected to each other.

The connecting electrodes CNE may have a relatively large width in areas where the first and second contacts CT1 and CT2 are disposed. The connecting electrodes CNE may be in contact with the electrodes RME through the first and second contacts CT1 and CT2, which penetrate the first and second insulating layers PAS1 and PAS2 or the second and third insulating layers PAS2 and PAS3. The first and second contacts CT1 and CT2 may be formed to be apart from the region where the light-emitting elements ED are disposed, in the first direction DR1, and may thus not overlap with the light-emitting elements ED in the second direction DR2. The first and second contacts CT1 and CT2 are illustrated as being disposed in the subarea SA of the first subpixel SPX1, but the disclosure is not limited thereto. In other embodiments, the first and second contacts CT1 and CT2 may be formed in parts of the emission area EMA of the first subpixel SPX1 where the light-emitting elements ED may not be disposed.

The connecting electrodes CNE may include a conductive material. In an example, the connecting electrodes CNE may include ITO, IZO, ITZO, Al, or a combination thereof. The connecting electrodes CNE may include, for example, a transparent conductive material, and light emitted by the light-emitting elements ED may travel toward the electrodes RME through the connecting electrodes CNE. However, the disclosure is not limited thereto.

The third insulating layer PAS3 may be disposed on the second connecting electrode CNE2 and the second insulating layer PAS2. The third insulating layer PAS3 may be disposed on the entire surface of the second insulating layer PAS2 to cover the second connecting electrode CNE2, and the first connecting electrode CNE1 may be disposed on the third insulating layer PAS3. The third insulating layer PAS3 may be disposed on the entire surface of the via layer VIA except for an area where the first connecting electrode CNE1 is disposed. For example, the third insulating layer PAS3 may be disposed not only on the first and second insulating layers PAS1 and PAS2, but also on the first banks BNL1 and the second bank BNL2.

Although not specifically illustrated, an additional insulating layer may be further disposed on the first connecting electrode CNE1 and the third insulating layer PAS3. The additional insulating layer may protect the members disposed on the first substrate SUB from an external environment.

The first, second, and third insulating layers PAS1, PAS2, and PAS3 may include an inorganic insulating material or an organic insulating material, but the disclosure is not limited thereto.

In an embodiment where the second insulating layer PAS2 includes an organic insulating material, the third insulating layer PAS3 may not be provided.

Figure 10:
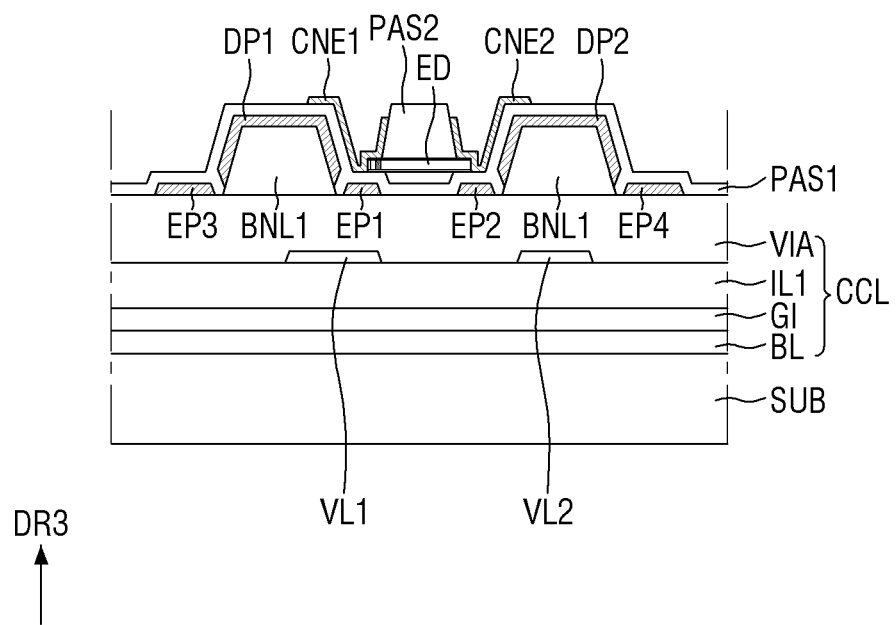
FIG. 10 is a schematic cross-sectional view of part of a display device according to another embodiment of the disclosure.

FIG. 10 is a schematic cross-sectional view of part of a display device according to another embodiment of the disclosure. FIG. 10 illustrates part of the display device according to another embodiment of the disclosure that corresponds to the part of the display device 10, illustrated in FIG. 8.

Referring to FIG. 10, a second insulating layer PAS2 may include an organic insulating material and may thus have a greater width than its counterpart of FIG. 8, and a third insulating layer PAS3 may not be provided. In the embodiment of FIG. 10, first and second connecting electrodes CNE1 and CNE2 may be formed by the same process and may thus be disposed in the same layer. End portions of the first and second connecting electrodes CNE1 and CNE2 may be disposed on side surfaces of the second insulating layer PAS2. As the second insulating layer PAS2 may be formed of an organic insulating material, the third insulating layer PAS3 can be omitted, and the first and second connecting electrodes CNE1 and CNE2 can be formed at the same time. As a result, the number of manufacturing processes can be reduced.

Figure 11:
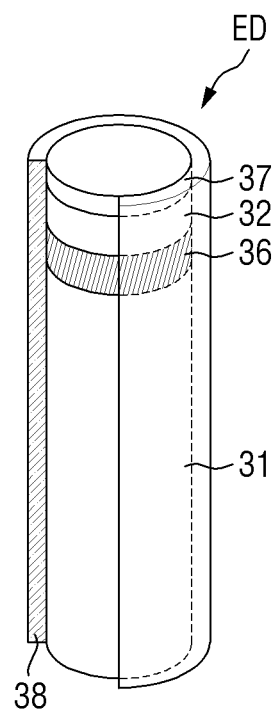
FIG. 11 is a schematic perspective view of a light-emitting element according to an embodiment of the disclosure.

FIG. 11 is a schematic perspective view of a light-emitting element according to an embodiment of the disclosure.

Referring to FIG. 11, a light-emitting element ED may be a light-emitting diode (LED), particularly, an ILED having a size of several nanometers or micrometers and formed of an inorganic material. If an electric field is formed in a particular direction between two opposite electrodes, the light-emitting element ED may be aligned between the two electrodes where polarities are formed.

The light-emitting element ED may have a shape that extends in one direction. The light-emitting element ED may have the shape of a cylinder, a rod, a wire, or a tube, but the shape of the light-emitting element ED is not particularly limited. In other embodiments, the light-emitting element ED may have the shape of a polygonal column such as a regular cube, a rectangular parallelepiped, or a hexagonal column or may have a shape that extends in one direction but with a partially inclined outer surface.

The light-emitting element ED may include semiconductor layers doped with impurities of an arbitrary conductivity type (e.g., a p type or an n type). The semiconductor layers may receive electric signals from an external power source to emit light of a particular wavelength range. The light-emitting element ED may include a first semiconductor layer 31, a second semiconductor layer 32, the light-emitting layer 36, an electrode layer 37, and the insulating film 38.

The first semiconductor layer 31 may include an n-type semiconductor. The first semiconductor layer 31 may include a semiconductor material, i.e., $Al_xGa_yIn_{1-x-y}N$ (where $0 \leq x \leq 1, 0 \leq y \leq 1$, and $0 \leq x+y \leq 1$). In an example, the first semiconductor layer 31 may include at least one of AlGaInN, GaN, AlGaN, InGaN, AlN, and InN that are doped with an n-type dopant. The n-type dopant may be Si, Ge, or Sn.

The second semiconductor layer 32 may be disposed on the first semiconductor layer 31 with the light-emitting layer 36 interposed therebetween. The second semiconductor layer 32 may include a p-type semiconductor. The second semiconductor layer 32 may include a semiconductor material, i.e., $Al_xGa_yIn_{1-x-y}N$ (where $0 \leq x \leq 1, 0 \leq y \leq 1$, and $0 \leq x+y \leq 1$). In an example, the second semiconductor layer 32 may include at least one of AlGaInN, GaN, AlGaN, InGaN, AlN, and InN that are doped may be a p-type dopant. The p-type dopant may be Mg, Zn, Ca, or Ba.

FIG. 11 illustrates that the first and second semiconductor layers 31 and 32 are formed as single layers, but the disclosure is not limited thereto. In other embodiments, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 may be disposed between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electric signals applied thereto via the first and second semiconductor layers 31 and 32. The light-emitting layer 36 may include a material such as AlGaN or AlGaInN. In particular, in a case where the light-emitting layer 36 has a multi-quantum well structure in which multiple quantum layers and multiple well layers may be alternately stacked, the quantum layers may include a material such as AlGaN or AlGaInN, and the well layers may include a material such as GaN or AlInN.

The light-emitting layer 36 may have a structure in which a semiconductor material having a large band gap energy and a semiconductor material having a small band gap energy are alternately stacked or may include group-III or group-V semiconductor materials depending on the wavelength of light to be emitted. The type of light emitted by the light-emitting layer 36 is not particularly limited. The light-emitting layer 36 may emit light of a red or green wavelength range as necessary, instead of blue light.

The electrode layer 37 may be an ohmic connecting electrode, but the disclosure is not limited thereto. In other embodiments, the electrode layer 37 may be a Schottky connecting electrode. The light-emitting element ED may include at least one electrode layer 37. The light-emitting element ED may include more than one electrode layer 37, but the disclosure is not limited thereto. In other embodiments, the electrode layer 37 may not be provided.

The electrode layer 37 may reduce the resistance between the light-emitting element ED and electrodes RME or (connecting electrodes CNE) when the light-emitting element ED is electrically connected to the electrodes RME or (the connecting electrodes CNE). The electrode layer 37 may include a conductive metal. In an example, the electrode layer 37 may include at least one of Al, Ti, In, gold (Au), Ag, ITO, IZO, and ITZO.

The insulating film 38 may be disposed to surround the first and second semiconductor layers 31 and 32 and the electrode layer 37. In an example, the insulating film 38 may be disposed to surround at least the light-emitting layer 36, but to expose both end portions, in the length direction, of the light-emitting element ED. The insulating film 38 may be formed to be rounded in a cross-sectional view, in a region adjacent to at least one end of the light-emitting element ED.

The insulating film 38 may include a material with insulating properties such as, for example, silicon oxide ($SiO_x$), silicon nitride ($SiN_x$), silicon oxynitride ($SiO_xN_y$), aluminum nitride ($AlN_x$), aluminum oxide ($AlO_x$), or a combination thereof. The insulating film 38 is illustrated as being a single-layer film, but the disclosure is not limited thereto. In other embodiments, the insulating film 38 may be formed as a multilayer film in which multiple layers are stacked.

The insulating film 38 may protect the other elements of the light-emitting element ED. The insulating film 38 can prevent any short circuit that may occur in the light-emitting element 36 in case that the light-emitting element ED is in direct contact with electrodes to which electric signals may be applied. Also, the insulating film 38 can prevent the degradation of the emission efficiency of the light-emitting element ED.

The outer surface of the insulating film 38 may be subjected to surface treatment. The light-emitting element ED may be sprayed on electrodes while being dispersed in ink. Here, the surface of the insulating film 38 may be hydrophobically or hydrophilically treated to keep the light-emitting element ED dispersed in ink without agglomerating with other neighboring light-emitting elements ED.

FIGS. 12 through 15 are schematic plan views or cross-sectional views illustrating how to fabricate a display device according to an embodiment of the disclosure. FIGS. 12 through 15 illustrate some of the processes of manufacturing the display device 10. Descriptions of how to form layers in each subpixel SPXn of the display device 10 will be omitted, and instead, an order in which one may form layers in each subpixel SPXn of the display device 10 will hereinafter be described.

Figure 12:
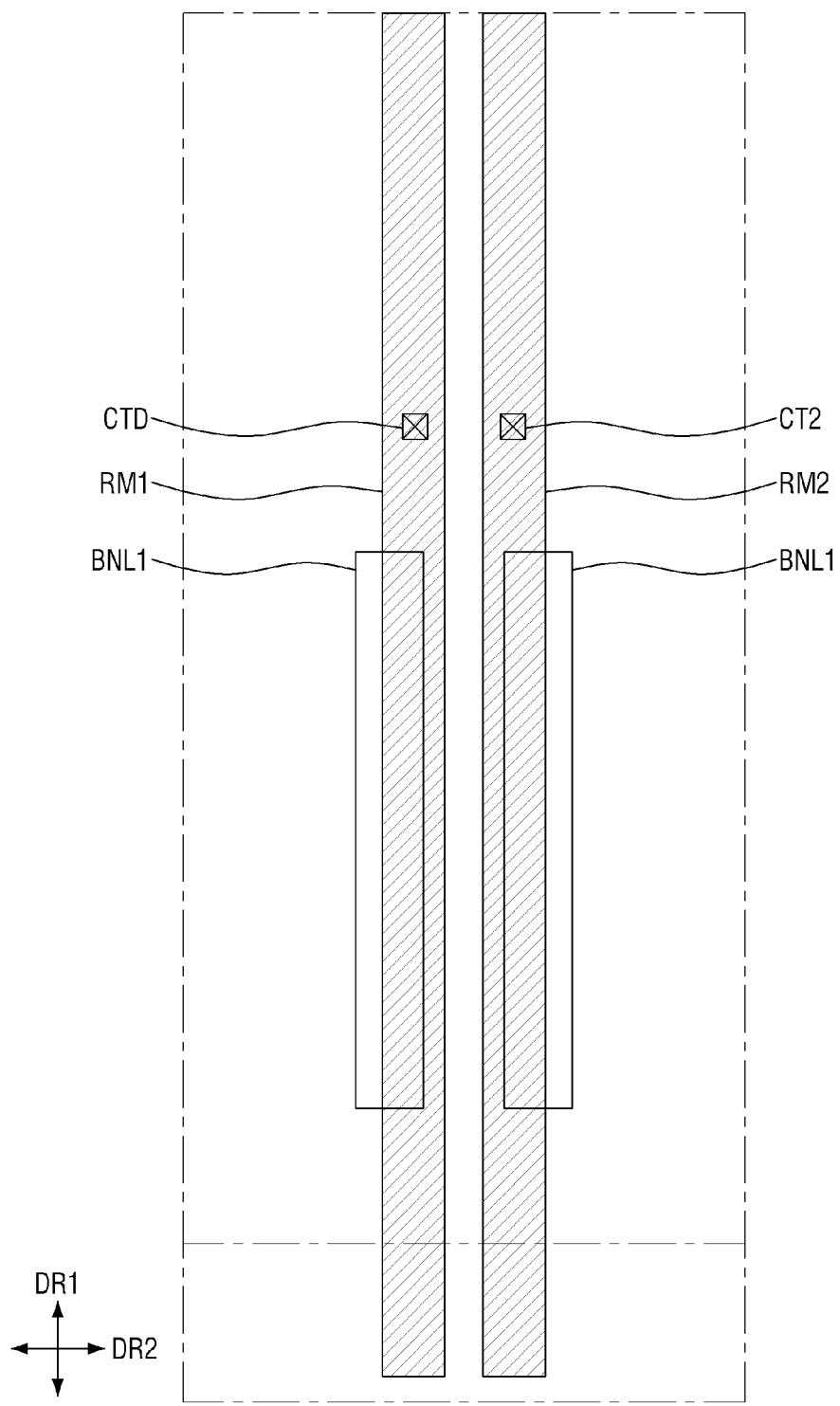
FIGS. 12 through 15 are schematic plan views or cross-sectional views illustrating a manufacturing process of a display device according to an embodiment of the disclosure.

Referring to FIG. 12, a plurality of first banks BNL1 and a plurality of electrode lines (RM1 and RM2), which overlap with the first banks BNL1 and extend in the first direction DR1, may be formed on a via layer VIA. The electrode lines (RM1 and RM2) may include a first electrode line RM1, which partially covers the left first bank BNL1 and extends in the first direction DR1, and a second electrode line RM2, which partially covers the right first bank BNL1 and extends in the first direction DR1. The first and second electrode lines RM1 and RM2 may be used to align light-emitting elements and may be divided later into a first electrode RME1, a first dummy pattern DP1, a second electrode RME2, and a second dummy pattern DP2.

The first and second electrode lines RM1 and RM2 may be disposed over multiple subpixels SPXn. Multiple electrodes RME of a subpixel SPXn may be spaced apart from multiple electrodes RME of another subpixel SPXn in a subarea SA of the former subpixel SPXn, and multiple electrodes RME of each subpixel SPXn may be obtained by dividing the electrode lines (RM1 and RM2) in a subarea SA of each subpixel SPXn after the alignment of light-emitting elements ED in each subpixel SPXn.

Figure 13:
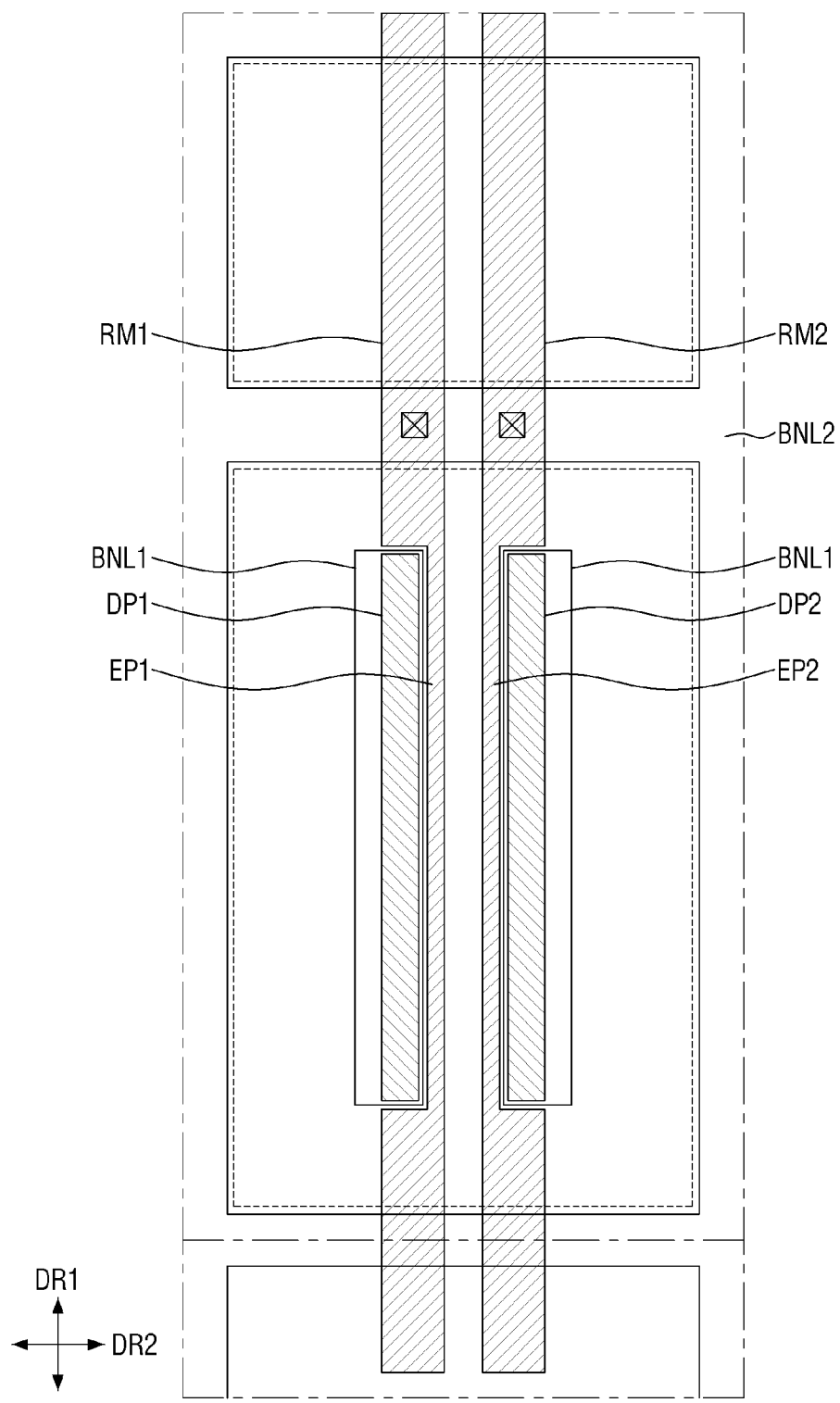

Thereafter, referring to FIG. 13, dummy patterns DP may be formed on the first banks BNL1 by patterning parts of the first and second electrode lines RM1 and RM2, a first insulating layer PAS1 may be formed to cover the dummy patterns DP, and a second bank BNL2 may be formed on the first insulating layer PAS1. The first and second electrode lines RM1 and RM2 may be formed to cover parts of the first banks BNL1, and parts of the first and second electrode lines RM1 and RM2 that may be disposed along the sides of each of the first banks BNL1 may be removed by a patterning process. After the patterning process, parts of the first and second electrode lines RM1 and RM2 that remain on the first banks BNL1 may become first and second dummy patterns DP1 and DP2, and the first and second electrode lines RM1 and RM2 may be spaced apart from the first and second dummy patterns DP1 and DP2, respectively, along the sides of each of the first banks BNL1. Only parts of the first and second electrode lines RM1 and RM2 that may be disposed on the via layer VIA may remain. First and second parts EP1 and EP2 of the first and second electrode lines RM1 and RM2 may be disposed between the first banks BNL1 and may face the dummy patterns DP.

The first insulating layer PAS1 may be formed after the formation of the dummy patterns DP through the patterning of the electrode lines (RM1 and RM2). The first insulating layer PAS1 may be formed to cover not only the electrode lines (RM1 and RM2) and the dummy patterns DP, but also the first banks BNL1. Thereafter, a second bank BNL2 may be formed on the first insulating layer PAS1 in a lattice pattern to open some areas. The areas opened by the second bank BNL2 may be defined as an emission area EMA and the subarea SA of each subpixel SPXn.

Figure 14:
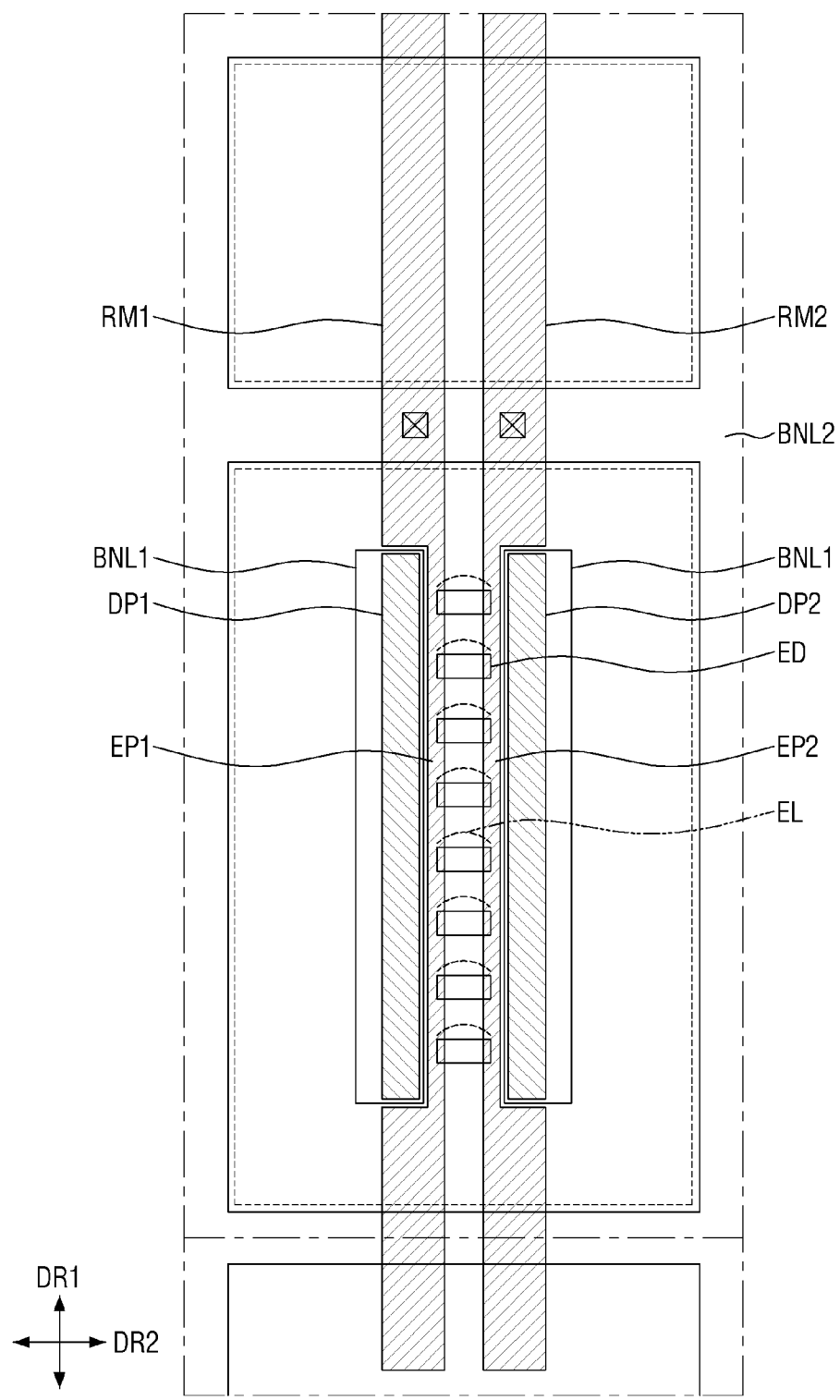
Figure 15:
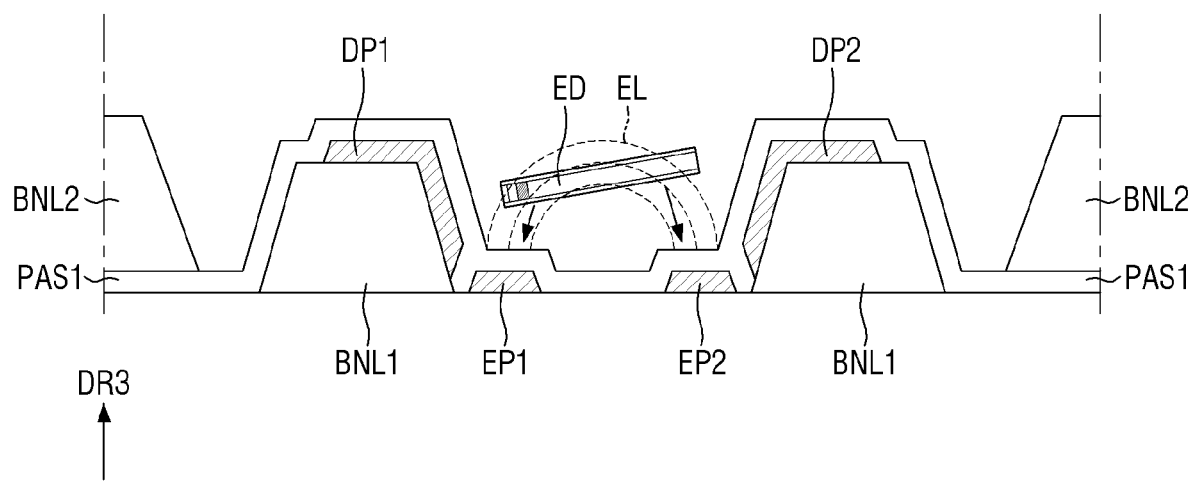

Thereafter, referring to FIGS. 14 and 15, light-emitting elements ED may be sprayed into the emission area EMA of each subpixel SPXn and may be aligned by applying electric signals to the first and second electrode lines RM1 and RM2. The light-emitting elements ED may be prepared in a state of being dispersed in ink and may be sprayed into the emission area EMA of each subpixel SPXn. As electric signals may be applied to the first and second electrode lines RM1 and RM2, an electric field EL may be formed due to the difference in electric potential between the first and second electrode lines RM1 and RM2, and the light-emitting elements ED dispersed in ink may receive a force from the electric field and may thus be placed on the first and second electrode lines RM1 and RM2 with their locations and alignment directions changing.

An electric field EL may be formed between the first banks BNL1 by the first and second parts EP1 and EP2 of the first and second electrode lines RM1 and RM2. As electric signals may not be applied to the dummy patterns DP, which may be disposed on the first banks BNL1, the electric field EL may not be formed on the dummy patterns DP. The light-emitting elements ED may be aligned on the first and second parts EP1 and EP2 by the electric field EL, which may be densely formed between the first banks BNL1.

The first and second electrode lines RM1 and RM2 may further include third parts EP3 and fourth parts EP4, which may be parts of the first and second electrode lines RM1 and RM2 that remain after the separation of the dummy patterns DP from the first and second electrode lines RM1 and RM2. The third parts EP3 and the fourth parts EP4 may have a larger width than the first and second parts EP1 and EP2, and as the electrode lines (RM1 and RM2) may have different widths from one location to another, the electrode lines (RM1 and RM2) can induce the light-emitting elements ED, dispersed in ink, to be aligned at particular locations. The light-emitting elements ED, which receive a force from the electric field EL, may be induced to be placed on the first and second parts EP1 and EP2, which may be narrower than the third parts EP3 and the fourth parts EP4. As the electrode lines (RM1 and RM2) where the electric field EL may be formed have different locations from one location to another location, the light-emitting elements ED can be aligned at particular locations, and the degree of alignment of the light-emitting elements ED can be improved.

Thereafter, although not specifically illustrated, a second insulating layer PAS2, which fixes the light-emitting elements ED, may be formed, and the electrode lines (RM1 and RM2) may be separated in a first separation part ROP1 (see FIG. 4) of the subarea SA of each subpixel SPXn. As the electrode lines (RM1 and RM2) may be separated in the subarea SA of each subpixel SPXn, a plurality of electrodes RME may be formed in each subpixel SPXn to be arranged over the subarea SA and the emission area EMA of each subpixel SPXn. The electrodes RME may include a first electrode RME1, which may be obtained from the first electrode line RM1, and a second electrode RME2, which may be obtained from the second electrode line RM2. The electrodes RME, like the electrode lines (RM1 and RM2), may be spaced apart from the dummy patterns DP along the sides of each of the first banks BNL1.

After the formation of the first and second electrodes RME1 and RME2, a second connecting electrode CNE2, a third insulating layer PAS3, and a first connecting electrode CNE1 may be formed, thereby obtaining the display device 10.

As the dummy patterns DP may be formed by patterning the electrode lines (RM1 and RM2), the electrodes RME having different widths from one location to another location may be formed. Thus, the light-emitting elements ED dispersed in ink can be densely aligned on parts of the electrode lines (RM1 and RM2) having a relatively small width. Also, as the dummy patterns DP, which may be separated from the electrode lines (RM1 and RM2), can reflect light emitted by the light-emitting elements ED, the front emission efficiency of the light-emitting elements ED can be improved.

Display devices according to other embodiments of the disclosure will hereinafter be described.

Figure 16:
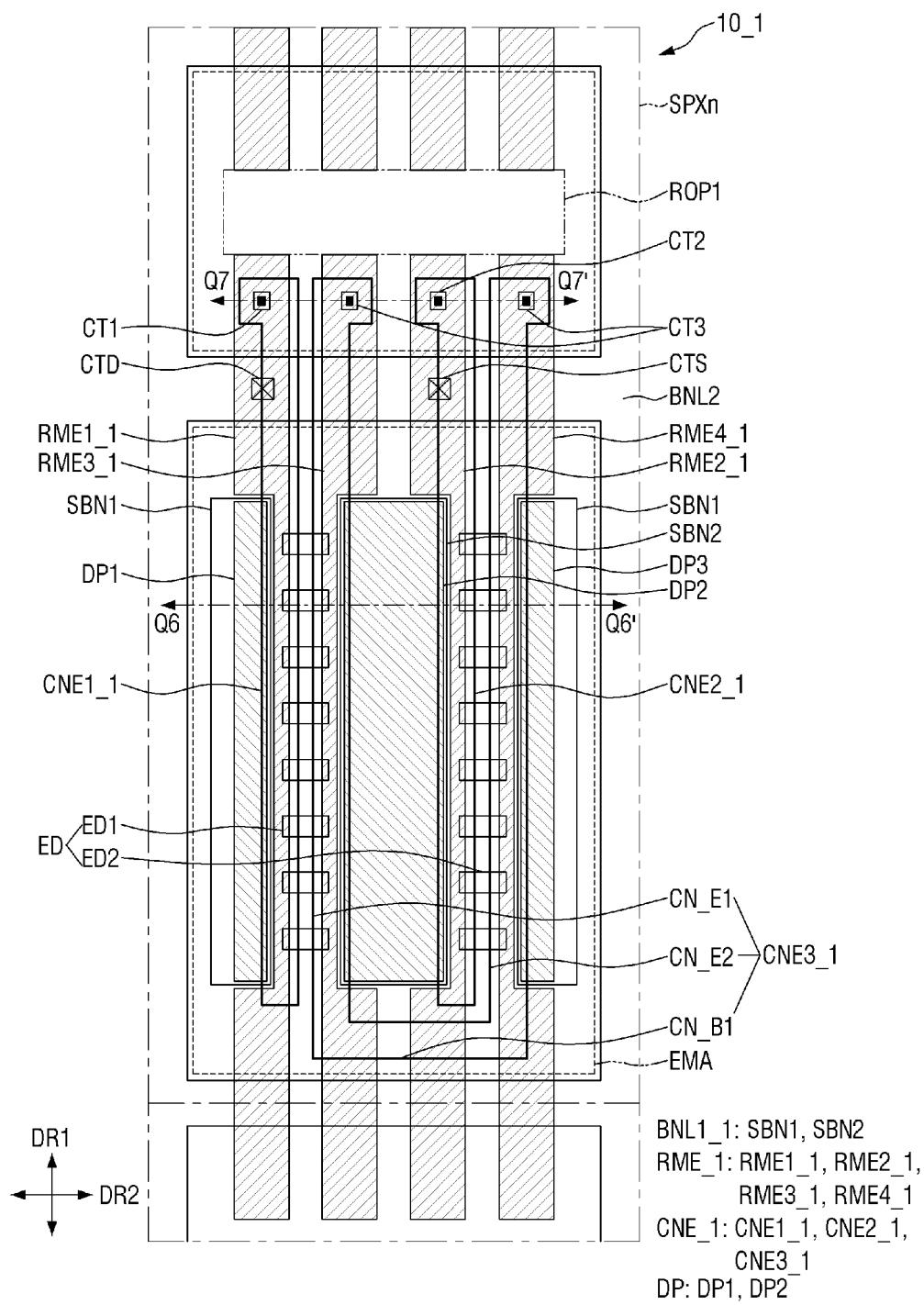
FIG. 16 is a schematic plan view of a subpixel of a display device according to another embodiment of the disclosure.
Figure 17:
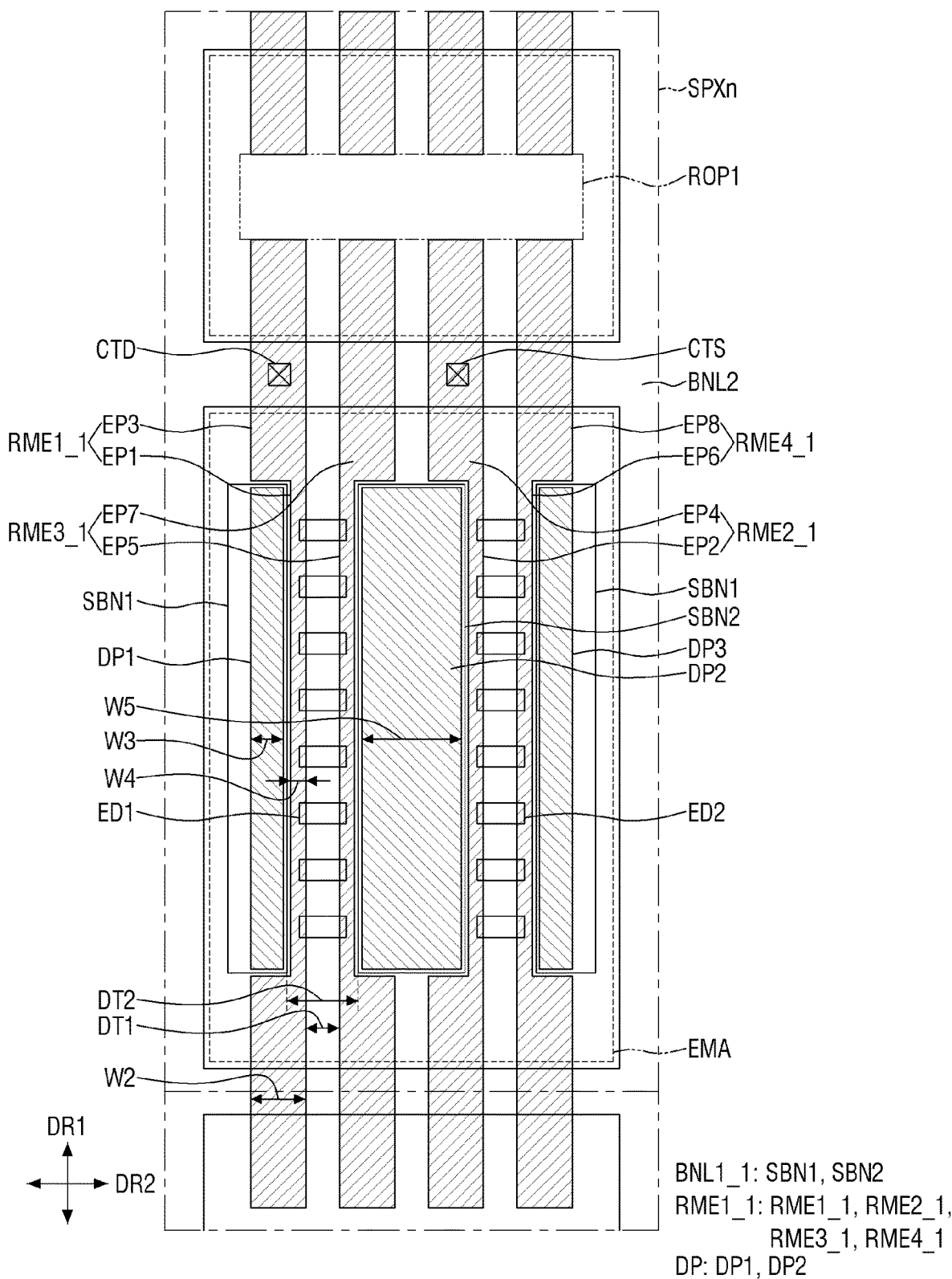
FIG. 17 is a schematic plan view illustrating the layout of electrodes and first banks in the subpixel of FIG. 16.
Figure 18:
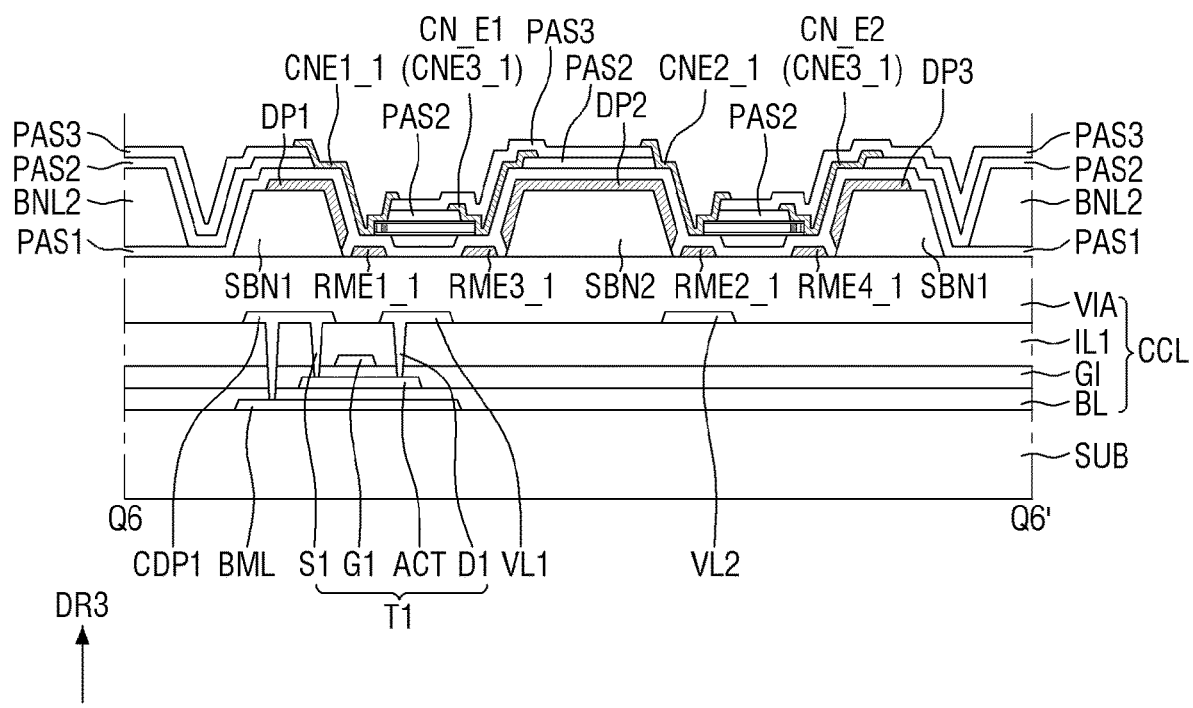
FIG. 18 is a schematic cross-sectional view taken along line Q6-Q6' of FIG. 16.
Figure 19:
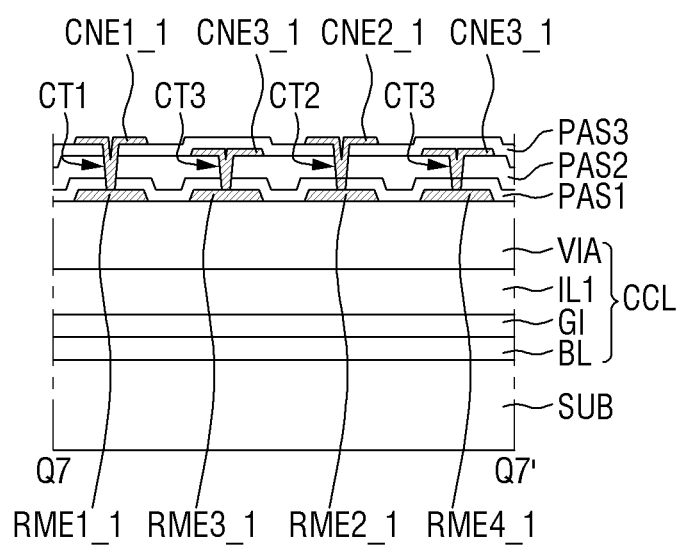
FIG. 19 is a schematic cross-sectional view taken along line Q7-Q7' of FIG. 16.

FIG. 16 is a schematic plan view of a subpixel of a display device according to another embodiment of the disclosure. FIG. 17 is a schematic plan view illustrating the layout of electrodes and first banks in the subpixel of FIG. 16. FIG. 18 is a schematic cross-sectional view taken along line Q6-Q6' of FIG. 16. FIG. 19 is a schematic cross-sectional view taken along line Q7-Q7' of FIG. 16.

Referring to FIGS. 16 through 19, a display device 10_1 may include a plurality of electrodes RME1_1 in a subpixel SPXn, and the electrodes RME1_1 may include first and second electrodes RME1_1 and RME2_1 and may further include third and fourth electrodes RME3_1 and RME4_1. The subpixel SPXn of the display device 10_1 may include as many first banks BNL1_1, as many dummy patterns DP, and as many connecting electrodes CNE_1 as there may be electrodes RME_1 and may also include a relatively large number of light-emitting elements ED. The embodiment of FIGS. 16 through 19 may differ from the embodiment of FIG. 3 in the number of electrodes RME1_1 disposed in each subpixel SPXn. Descriptions of elements or features that have already been described above will be omitted, and the embodiment of FIGS. 16 through 19 will hereinafter be described, focusing mainly on the differences with the embodiment of FIG. 3.

The first banks BNL1_1 may include a plurality of sub-banks (SBN1 and SBN2), which have different widths. The first banks BNL1_1 may include a plurality of first sub-banks SBN1, which may be disposed on both sides (e.g., the left and right sides), in a second direction DR2, of the center of an emission area EMA of the subpixel SPXn, and a second sub-bank SBN2, which may be disposed between the first sub-banks SBN1. The first sub-banks SBN1 may have substantially the same layout as the first banks BNL1 of FIG. 3.

The second sub-bank SBN2 may be spaced apart from the first sub-banks SBN1 in the second direction DR2, between the first sub-banks SBN1. The second sub-bank SBN2 may have substantially the same shape as the first sub-banks SBN1 and may have a larger width than the first sub-banks SBN1 in the second direction DR2. The second sub-bank SBN2 may have a larger width than the first sub-banks SBN1 such that multiple dummy patterns DP or a dummy pattern DP having a relatively large width may be placed thereon, but the disclosure is not limited thereto. In other embodiments, the first sub-banks SBN1 and the second sub-bank SBN2 may have the same width. Light-emitting elements ED may be disposed between one of the first sub-banks SBN1 and the second sub-bank SBN2 and between the second sub-bank SBN2 and another first sub-bank SBN1.

The electrodes RME1_1 may include the first, second, third, and fourth electrodes RME1_1, RME2_1, RME3_1, and RME4_1. The first, second, third, and fourth electrodes RME1_1, RME2_1, RME3_1, and RME4_1 may be spaced apart from one another in the second direction DR2 and may be arranged in the order of the first, third, second, and fourth electrodes RME1_1, RME3_1, RME2_1, and RME4_1 along the second direction DR2.

The first electrode RME1_1 may be disposed adjacent to the left first sub-bank SBN1. A first part EP1 of the first electrode RME1_1 may be spaced apart from the right side of the left first sub-bank SBN1, and third parts EP3 of the first electrode RME1_1 may be disposed parallel to the left first sub-bank SBN1 in a first direction DR1. The first electrode RME1_1 may be disposed to face the right side of the left first sub-bank SBN1.

The second electrode RME2_1 may be disposed adjacent to the second sub-bank SBN2. A second part EP2 of the second electrode RME2_1 may be spaced apart from the right side of the second sub-bank SBN2, and fourth parts EP4 of the second electrode RME2_1 may be disposed parallel to the second sub-bank SBN2 in the first direction DR1. The second electrode RME2_1 may be disposed to face the right side of the second sub-bank SBN2.

The third electrode RME3_1 may be spaced apart from the first and second electrodes RME1_1 and RME2_1, between the first and second electrodes RME1_1 and RME2_1. The third electrode RME3_1 may include a fifth part EP5, which faces the first part EP1 of the first electrode RME1_1, and seventh parts EP7, which may be connected to the fifth part EP5 and may be disposed parallel to the second sub-bank SBN2 in the first direction DR1. The fifth part EP5 and the seventh parts EP7 may correspond to the first part EP1 and the third parts EP3, respectively. The third electrode RME3_1 may be symmetrical with the first electrode RME1_1 with respect to an imaginary line extending in the first direction DR1. The fifth part EP5 of the third electrode RME3_1 may be spaced apart from the left side of the second sub-bank SBN2, and the seventh parts EP7 of the third electrode RME3_1 may be disposed parallel to the second sub-bank SBN2 in the first direction DR1. The third electrode RME3_1 may be disposed to face the left side of the second sub-bank SBN2.

The fourth electrode RME4_1 may be spaced apart from the second and third electrodes RME2_1 and RME3_1 with the second electrode RME2_1 interposed between the third and fourth electrode RME3_1 and RME4_1. The fourth electrode RME4_1 may include a sixth part EP6, which faces the second part EP2 of the second electrode RME2_1, and eighth parts EP8, which may be connected to the sixth part EP6 and may be disposed parallel to the right first sub-bank SBN1 in the first direction DR1. The sixth part EP6 and the eighth parts EP8 may correspond to the second part EP2 and the fourth parts EP4, respectively, of the second electrode RME2_1. The fourth electrode RME4_1 may be symmetrical with the second electrode RME2_1 with respect to an imaginary line extending the first direction DR1. The sixth part EP6 of the fourth electrode RME4_1 may be spaced apart from the left side of the right first sub-bank SBN1, and the eighth parts EP8 of the fourth electrode RME4_1 may be disposed parallel to the right first sub-bank SBN1 in the first direction DR1. The fourth electrode RME4_1 may be disposed to face the left side of the right first sub-bank SBN1.

The width, in the second direction DR2, of the fifth and sixth parts EP5 and EP6 of the third and fourth electrodes RME3_1 and RME4_1, i.e., a fourth width W4, may be the same as the width, in the second direction DR2, of the first part EP1 of the first electrode RME1_1, i.e., a first width W1. For example, the width of the fifth and sixth parts EP5 and EP6 of the third and fourth electrodes RME3_1 and RME4_1 may be smaller than the distance between the first and third electrodes RME1_1 and RME3_1 or between the second and fourth electrodes RME2_1 and RME4_1.

The dummy patterns DP may be disposed on the first sub-banks SBN1 and the second sub-bank SBN2 and may include first, second, and third dummy patterns DP1, DP2, and DP3. The first dummy pattern DP1 may be disposed on the left first sub-bank SBN1 and may be spaced apart from the first electrode RME1_1. The second dummy pattern DP2 may be disposed on the second sub-bank SBN2 and may be spaced apart from the second and third electrodes RME2_1 and RME3_1, and the third dummy pattern DP3 may be disposed on the right first sub-bank SBN1 and may be spaced apart from the fourth electrode RME4_1. The dummy patterns DP may have different widths in the second direction DR2. The width, in the second direction DR2, of the first and third dummy patterns DP1 and DP3, i.e., a third width W3, may be smaller than the width, in the second direction DR2, of the second dummy pattern DP2, i.e., a fifth width W5.

The second and third electrodes RME2_1 and RME3_1 may be initially formed as a single electrode line together during the fabrication of the display device 10_1. The second dummy pattern DP2 may be obtained by separating part of the single electrode line along the sides of the second sub-bank SBN2, and at the same time, the second and third electrodes RME2_1 and RME3_1 may be formed to be separated from the middle of the second dummy pattern DP2 in the first direction DR1. As the electrode line for forming the second and third electrodes RME2_1 and RME3_1 has a larger width than electrode lines for forming the first and fourth electrodes RME1_1 and RME4_1, the second dummy pattern DP2 may also have a larger width than the first dummy pattern DP1. Also, as the second dummy pattern DP2 has a larger width than the first dummy pattern DP1, the second dummy pattern DP2 may cover both side surfaces of the second sub-bank SBN2. Light-emitting elements ED disposed on either side of the second sub-bank SBN2 can be reflected by the second dummy pattern DP2.

As the display device 10_1 includes relatively large numbers of electrodes RME and first banks BNL1_1, each of the gaps between the first banks BNL1_1 may be divided into a relatively large number of sections, and the light-emitting elements ED may be classified into different groups of light-emitting elements depending on the locations of the light-emitting elements ED and which of the electrodes RME both end portions of each of the light-emitting elements ED are placed on.

In an example, the light-emitting elements ED may include first light-emitting elements ED1, which may have both end portions thereof disposed on the first part of the first electrode RME1_1 and the fifth part EP5 of the third electrode RME3_1. The first end portions of the first light-emitting elements ED1 may be disposed on the first part EP1, and the second end portions of the first light-emitting elements ED1 may be disposed on the fifth part EP5. Also, the light-emitting elements ED may include second light-emitting elements ED2, which have both end portions thereof disposed on the second part EP2 of the second electrode RME2_1 and the sixth part EP6 of the fourth electrode RME4_1, between the right first sub-bank SBN1 and the second sub-bank SBN2. The first end portions of the second light-emitting elements ED2 may be disposed on the sixth part EP6, and the second end portions of the second light-emitting elements ED2 may be disposed on the second part EP2. The first end portions of the first light-emitting elements ED1 may be oriented in a leftward direction, and the second end portions of the second light-emitting elements ED2 may be oriented in a rightward direction.

The connecting electrodes CNE_1 may include a first connecting electrode CNE1_1, which may be disposed on the first electrode RME1_1 and the first dummy pattern DP1, a second connecting electrode CNE2_1, which may be disposed on the second electrode RME2_1 and the second dummy pattern DP2, and a third connecting electrode CNE3_1, which may be disposed on the second and third dummy patterns DP2 and DP3.

The first connecting electrode CNE1_1 may be in contact with the first electrode RME1_1 and the first end portions of the first light-emitting elements ED1. The first connecting electrode CNE1_1 may be in contact with the first electrode RME1_1 through a first contact CT1, which penetrates a first insulating layer PAS1. The second connecting electrode CNE2_1 may be in contact with the second electrode RME2_1 and the second end portions of the second light-emitting elements ED2. The second connecting electrode CNE2_1 may be in contact with the second electrode RME2_1 through a second contact CT2, which penetrates the first insulating layer PAS1. The first and second connecting electrodes CNE1_1 and CNE2_1 may extend in the first direction DR1 and may be disposed to extend over the emission area EMA and a subarea SA of the subpixel SPXn. Also, the first and second connecting electrodes CNE1_1 and CNE2_1 may be disposed to overlap with, but not be in direct contact with, the first and second dummy patterns DP1 and DP2, respectively.

The first end portions of the first light-emitting elements ED1 may be electrically connected to the first electrode RME1_1 through the first connecting electrode CNE1_1, and the second end portions of the second light-emitting elements ED2 may be electrically connected to the second electrode RME2_1 through the second connecting electrode CNE2_1.

The third connecting electrode CNE3_1 may include a first extension CN_E1, which is disposed on the third electrode RME3_1 and the second dummy pattern DP2 and extends in the first direction DR1, a second extension CN_E2, which is disposed on the fourth electrode RME4_1 and the third dummy pattern DP3 and extends in the first direction DR1, and a first connector CN_B1, which connects the first and second extensions CN_E1 and CN_E2. The first extension CN_E1 of the third connecting electrode CNE3_1 may be spaced apart from the first and second connecting electrodes CNE1_1 and CNE2_1 in the second direction DR2, between the first and second connecting electrodes CNE1_1 and CNE2_1, and the second extension CN_E2 of the third connecting electrode CNE3_1 maybe spaced apart from, and face, the second connecting electrode CNE2_1. The third connecting electrode CNE3_1 may generally surround the second connecting electrode CNE2_1.

The first extension CN_E1 may be in contact with the third electrode RME3_1 and the second end portions of the first light-emitting elements ED1. The first extension CN_E1 may be in contact with the third electrode RME3_1 through a third contact CT3, which penetrates the first insulating layer PAS1. The second extension CN_E2 may be in contact with the fourth electrode RME4_1 and the first end portions of the second light-emitting elements ED2. The second extension CN_E2 may be in contact with the fourth electrode RME4_1 through another third contact CT3, which penetrates the first insulating layer PAS1.

The second end portions of the first light-emitting elements ED1 and the first end portions of the second light-emitting elements ED2 may be connected in series by the third connecting electrode CNE3_1. Not only parallel connections, but also serial connections may be provided between the first light-emitting elements ED1 and the second light-emitting elements ED2, which may be disposed at different locations from the second sub-bank SBN2.

The third connecting electrode CNE3_1 may be disposed between second and third insulating layers PAS2 and PAS3, and the first and second connecting electrodes CNE1_1 and CNE2_1 may be disposed on the third insulating layer PAS3. The first and second connecting electrodes CNE1_1 and CNE2_1 may be first-type connecting electrodes in contact with the first and second electrodes RME1_1 and RME2_1, which may be directly connected to a third conductive layer, and the third connecting electrode CNE3_1 may be a second-type connecting electrode in contact with the third and fourth electrodes RME3_1 and RME4_1, which may not be directly connected to the third conductive layer.

As the display device 10_1, like the display device 10 of FIG. 10, may include a plurality of electrodes RME, which have different layouts with respect to a plurality of first banks BNL1_1, and dummy patterns DP in each subpixel SPXn, the degree of alignment and the front emission efficiency of light-emitting elements ED can be improved. Also, as the display device 10_1 may include a relatively large number of light-emitting elements ED in each subpixel SPXn, serial connections can be configured between the light-emitting elements ED, and as a result, the amount of light emitted per unit area can be improved.

Figure 20:
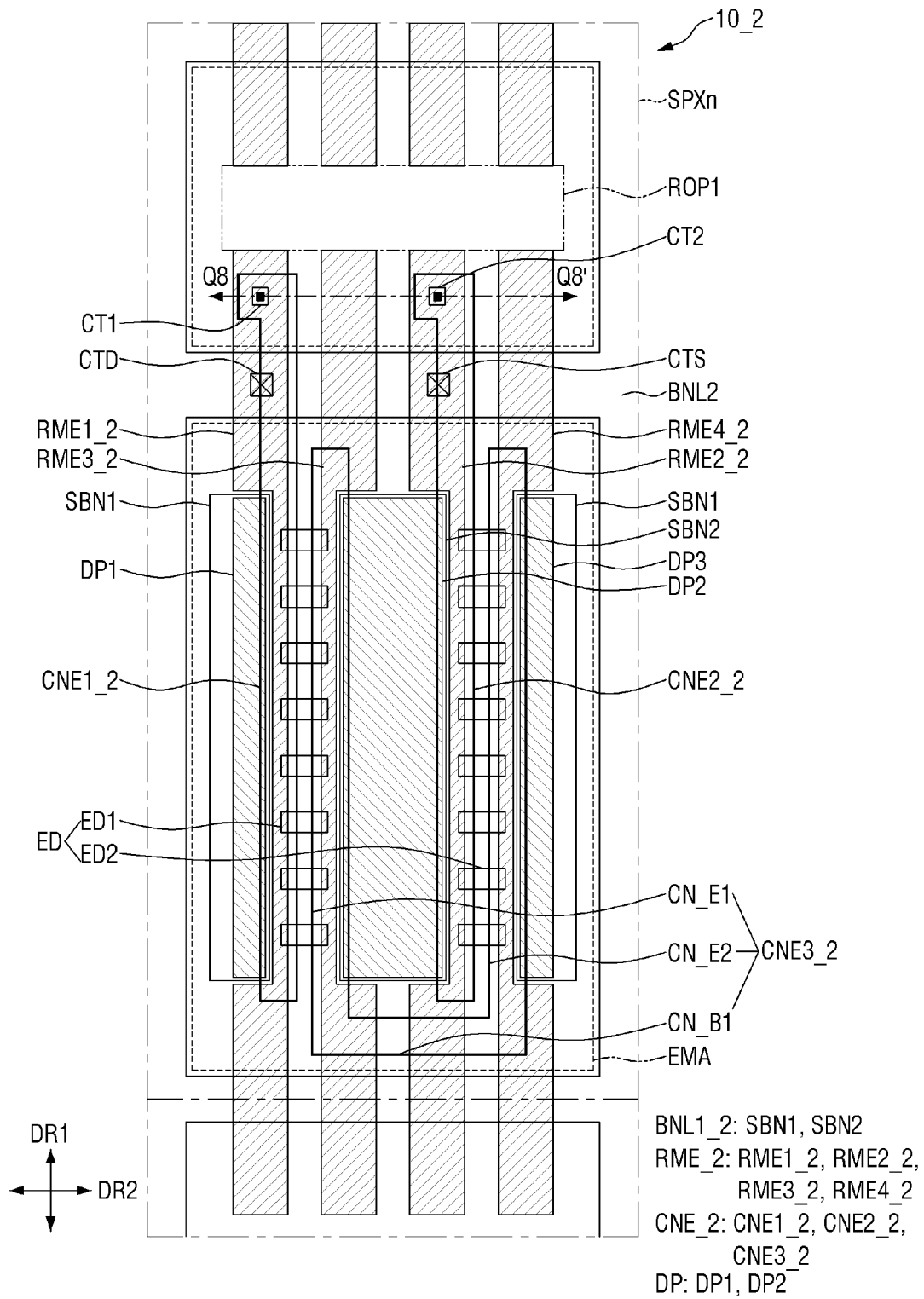
FIG. 20 is a schematic plan view of a subpixel of a display device according to another embodiment of the disclosure.
Figure 21:
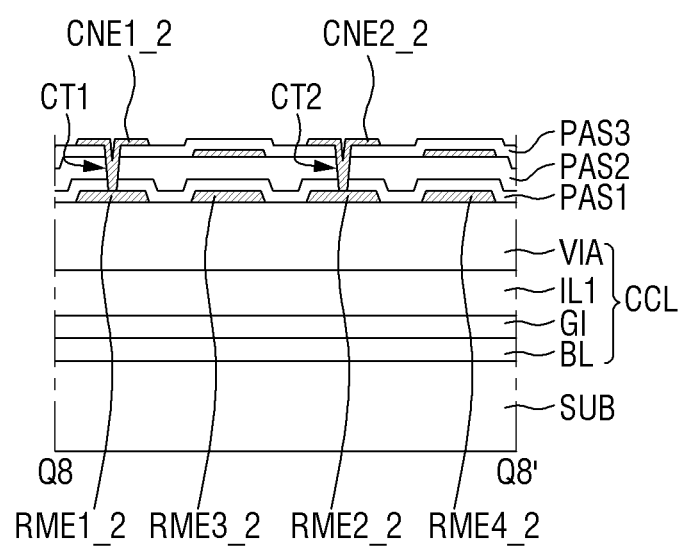
FIG. 21 is a schematic cross-sectional view taken along line Q8-Q8' of FIG. 20.

FIG. 20 is a schematic plan view of a subpixel of a display device according to another embodiment of the disclosure. FIG. 21 is a schematic cross-sectional view taken along line Q8-Q8' of FIG. 20.

Referring to a subpixel SPXn of a display device 10_2 of FIGS. 20 and 21, a third connecting electrode CNE3_2 may not be connected to third and fourth electrodes RME3_2 and RME4_2, and the third and fourth electrodes RME3_2 and RME4_2 may remain floated. The display device 10_2 of FIGS. 20 and 21 may differ from the display device 10_1 of FIG. 16 in how the third connecting electrode CNE3_2 is connected to the third and fourth electrodes RME3_2 and RME4_2. For example, the layout of a plurality of first banks BNL1_2, other electrodes RME_2 (i.e., first and second electrodes RME1_2 and RME2_2, and other connecting electrodes CNE_2 (i.e., first and second connecting electrodes CNE1_2 and CNE2_2) may be the same as the layout of their respective counterparts of FIG. 16. The embodiment of FIGS. 20 and 21 will hereinafter be described, focusing mainly on the differences with the embodiment of FIG. 16.

The third and fourth electrodes RME3_2 and RME4_2, unlike the other electrodes RME_2, may not be connected to a conductive layer therebelow. Power supply voltages applied from first and second voltage lines VL1 and VL2 may be transmitted to the first and second electrodes RME1_2 and RME2_2 and may be transmitted to light-emitting elements ED through the connecting electrodes CNE_2. Even though the power supply voltages are not applied to the third and fourth electrode RME3_2 and RME4_2, the light-emitting elements ED still can emit light. Thus, the third and fourth electrode RME3_2 and RME4_2 may remain floated, instead of being electrically connected to other electrodes.

The third connecting electrode CNE3_2 may include a first extension CN_E1, a second extension CN_E2, and a first connector CN_B1 and may be in contact with first light-emitting elements ED1 and second light-emitting elements ED2. The first and second extensions CN_E1 and CN_E2 may not be connected to the third and fourth electrodes RME3_2 and RME4_2, and a third contact CT3 (see FIG. 15) may not be provided. The first light-emitting elements ED1 and the second light-emitting elements ED2 may be connected in series through the third connecting electrode CNE3_2, but the third and fourth electrodes RME3_2 and RME4_2 may be floated from the serial connections between the first light-emitting elements ED1 and the second light-emitting elements ED2. The first and second extensions CN_E1 and CN_E2 of the third connecting electrode CNE3_2 are illustrated as extending in a first direction DR1 and being disposed only in an emission area EMA of the subpixel SPXn, but the disclosure is not limited thereto. In other embodiments, the first and second extensions CN_E1 and CN_E2 may extend beyond the emission area EMA to be disposed over part of a second bank BNL2 between the emission area EMA and a subarea SA of the subpixel SPXn.

Figure 22:
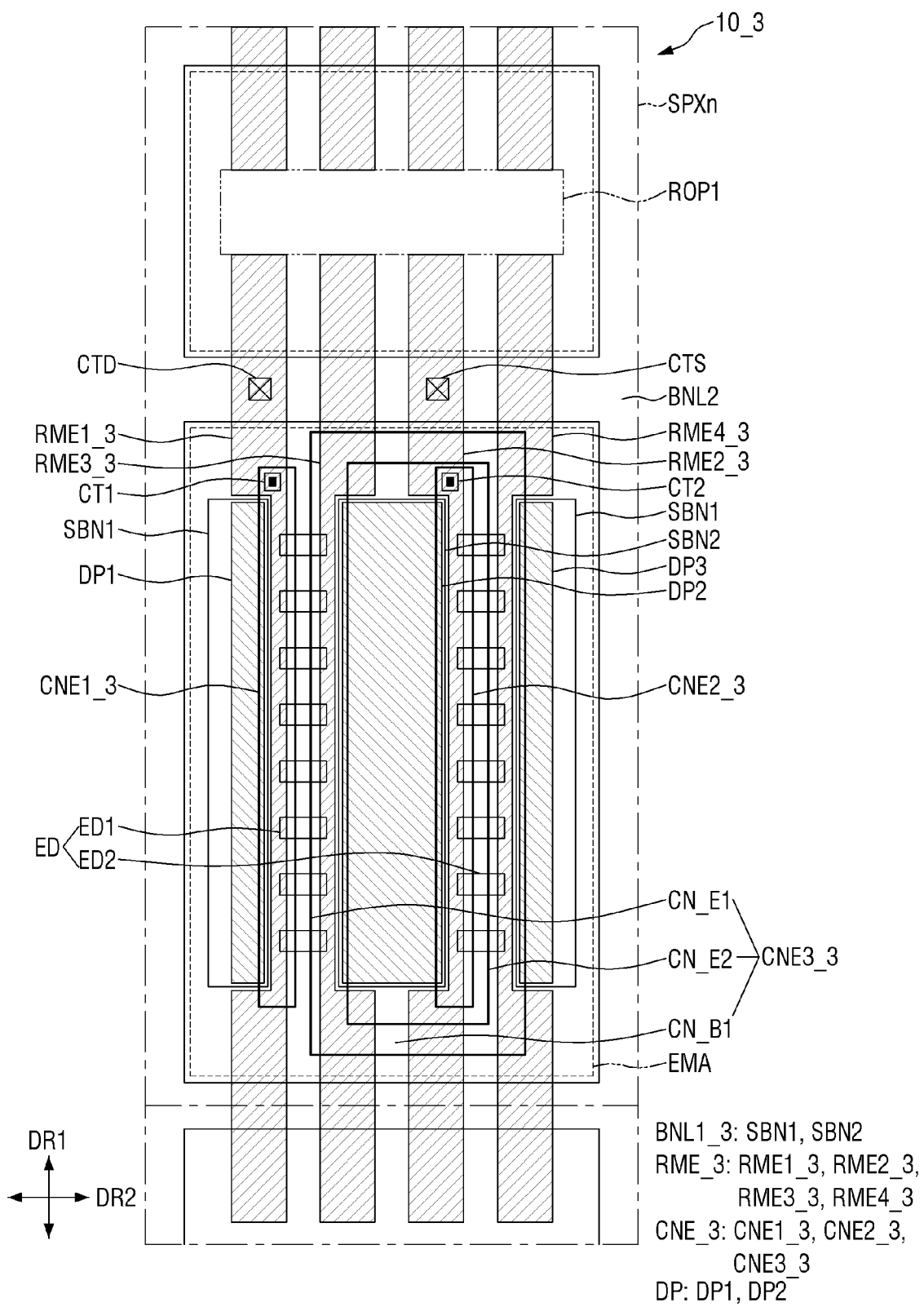
FIG. 22 is a schematic plan view of a subpixel of a display device according to another embodiment of the disclosure.

FIG. 22 is a schematic plan view of a subpixel of a display device according to another embodiment of the disclosure.

Referring to a subpixel SPXn of a display device 10_3 of FIG. 22, first and second connecting electrodes CNE1_3 and CNE2_3 may extend in a direction, and a third connecting electrode CNE3_3 may surround the second connecting electrode CNE2_3. For example, the third connecting electrode CNE3_3 may be spaced apart from the second connecting electrode CNE2_3 and may have a closed loop shape in a plan view. Connecting electrodes CNE_3 may be disposed only in an emission area EMA of the subpixel SPXn and may not be disposed in a subarea SA of the subpixel SPXn. Thus, first and second contacts CT1 and CT2, through which the connecting electrodes CNE_3 and electrodes RME_3 may be connected, may be disposed in the emission area EMA.

The third connecting electrode CNE3_3 may include first and second extensions CN_E1 and CN_E2, which extend in a first direction DR1, and a plurality of first connectors CN_B1, which connect the first and second extensions CN_E1 and CN_E2. The first and second extensions CN_E1 and CN_E2 may be spaced apart from the second connecting electrode CNE2_3 in a second direction DR2, and the first connectors CN_B1 may be spaced apart from the second connecting electrode CNE2_3 in the first direction DR1.

The first connecting electrode CNE1_3 may be connected to a first electrode RME1_3 through the first contact CT1, and the second connecting electrode CNE2_3 may be connected to a second electrode RME2_3 through the second contact CT2. In the embodiment of FIG. 22, like in the embodiment of FIG. 20, the third connecting electrode CNE3_3 may not be connected to third and fourth electrodes RME3_3 and RME4_3 so that the third and fourth electrodes RME3_3 and RME4_3 may remain floated.

The first and second contacts CT1 and CT2 may be disposed in the emission area EMA, but may be disposed not to overlap with light-emitting elements ED in the second direction DR2. The first contact CT1 may be disposed in a third part EP3 (see FIG. 4) of the first electrode RME1_3, on sides, in the first direction DR1, first banks BNL1_3, and the second contact CT2 may be disposed in a fourth part EP4 (see FIG. 4) of the second electrode RME2, on sides, in the first direction DR1, of first banks BNL1_3. As the third connecting electrode CNE3_3 is disposed to be surrounded by the second connecting electrode CNE2_3, the second contact CT2 may be disposed on the inside of the third connecting electrode CNE3_3, and the first contact CT1 may be disposed on the outside of the third connecting electrode CNE3_3.

The embodiment of FIG. 22 may differ from the previous embodiments in the presence of the connecting electrodes RME_3 only in the emission area EMA and the planar shape of the connecting electrodes RME_3. Thus, there may exist electrodes RME_3 floated without being connected to the connecting electrodes CNE_3, and the locations of the first and second contacts CT1 and CT2 may differ the locations of their respective counterparts of any of the previous embodiments.

Figure 23:
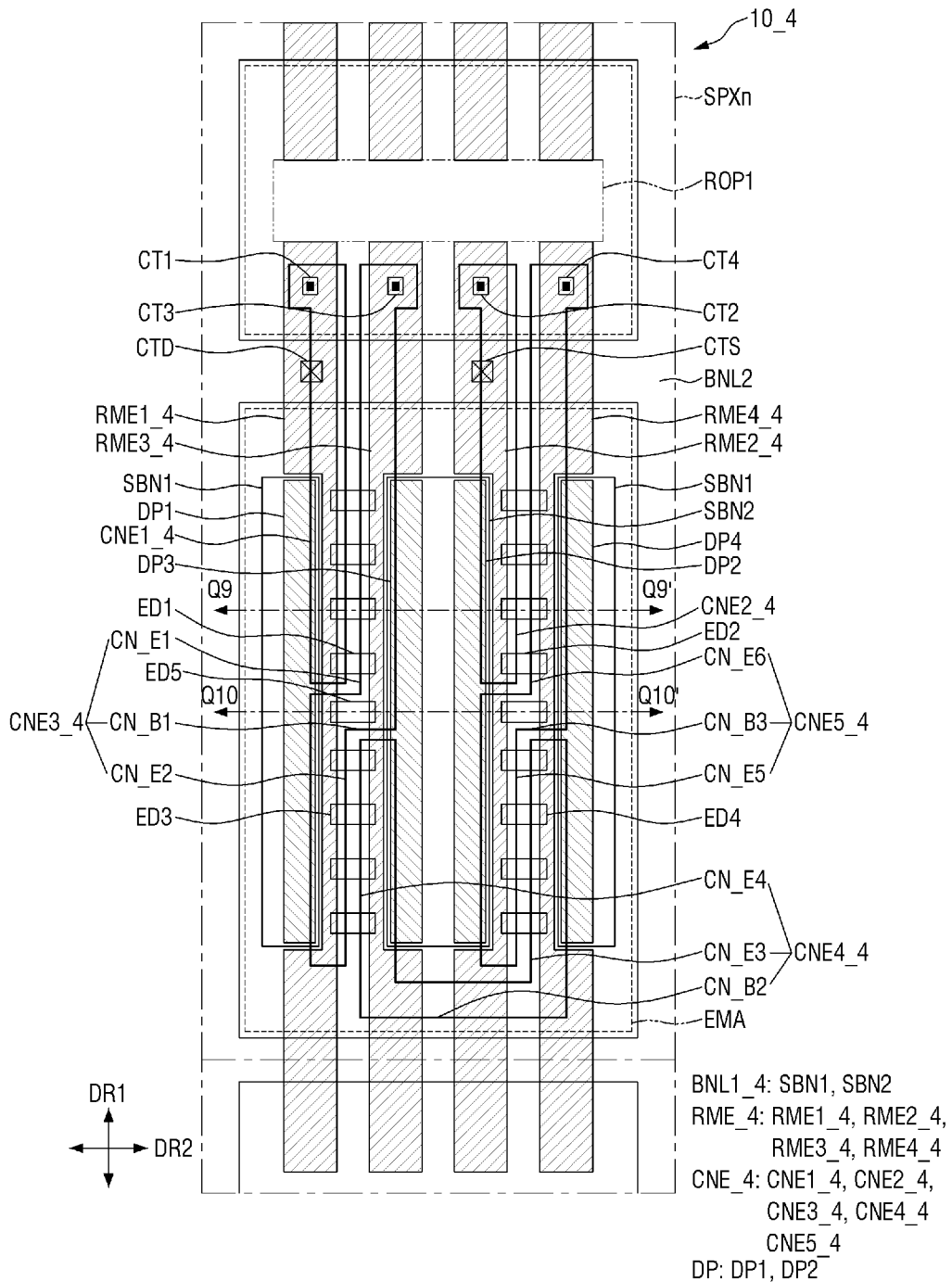
FIG. 23 is a schematic plan view of a subpixel of a display device according to another embodiment of the disclosure.
Figure 24:
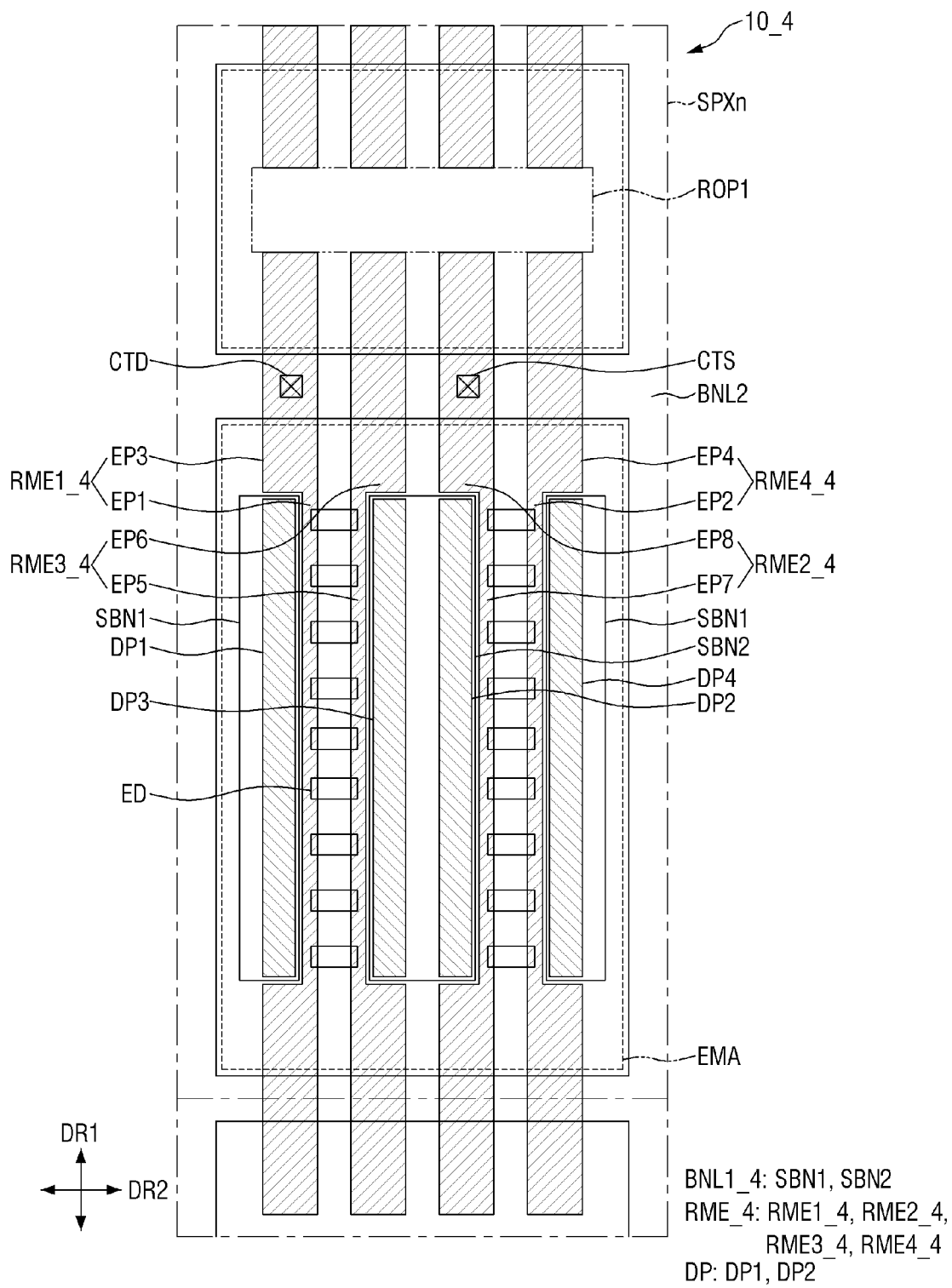
FIG. 24 is a schematic plan view illustrating the layout of electrodes and first banks in the subpixel of FIG. 23.
Figure 25:
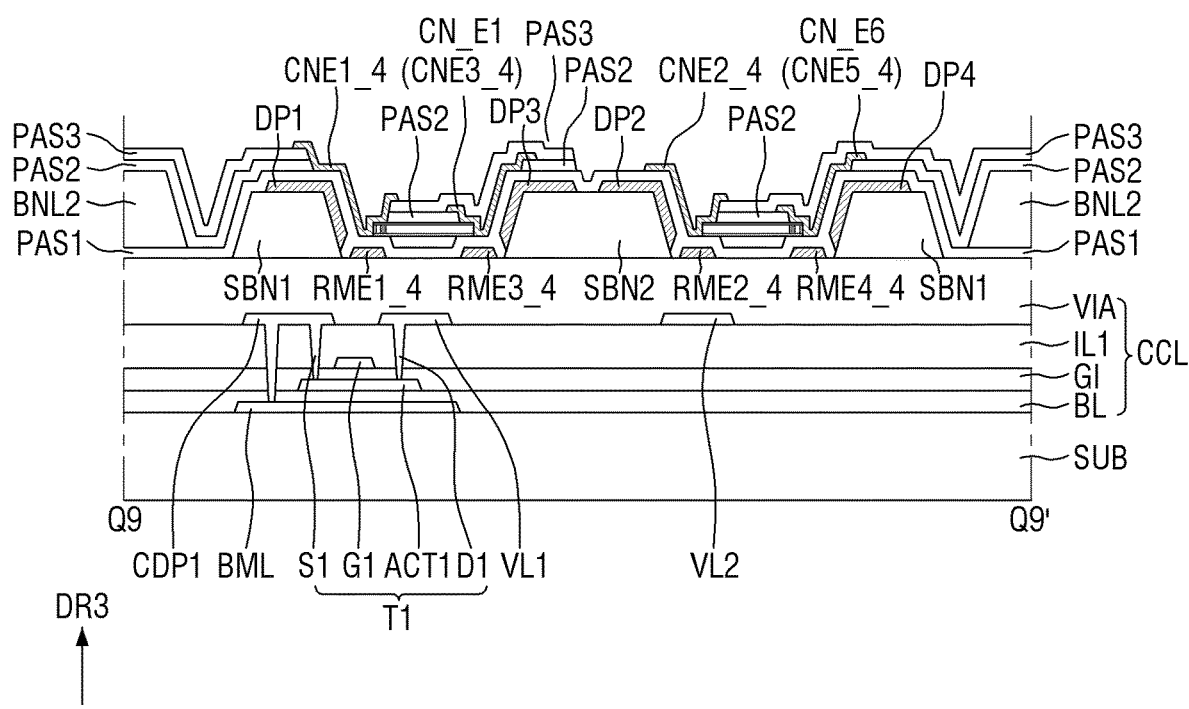
FIG. 25 is a schematic cross-sectional view taken along line Q9-Q9' of FIG. 23.
Figure 26:
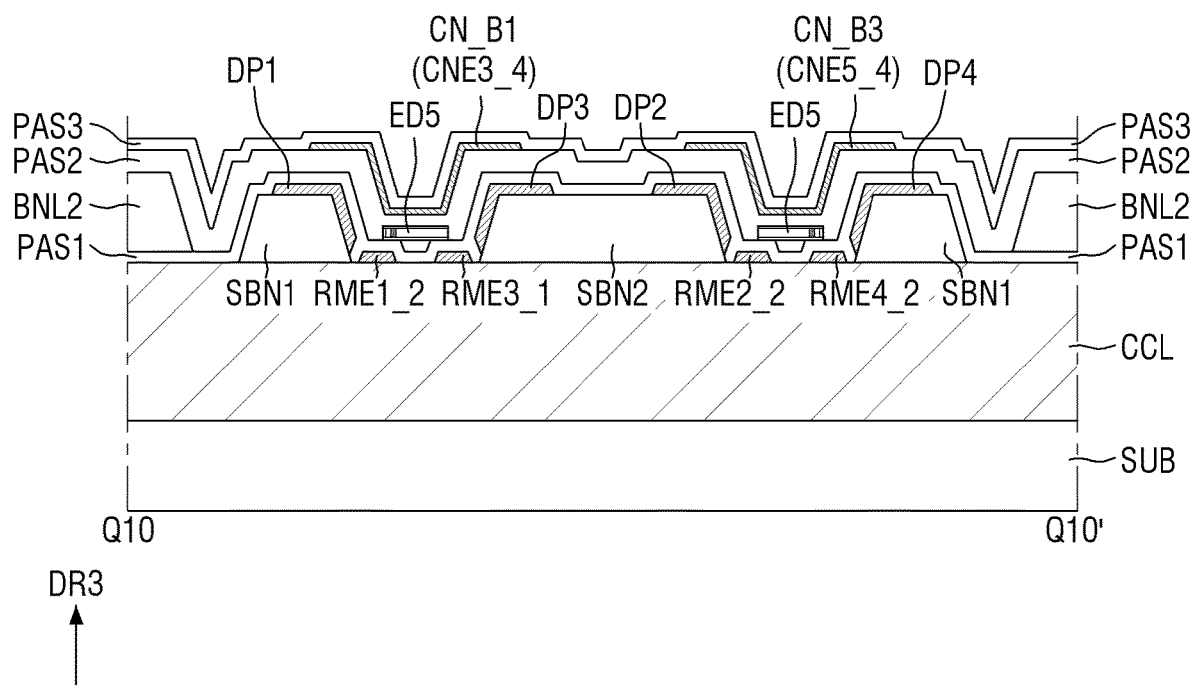
FIG. 26 is a schematic cross-sectional view taken along line Q10-Q10' of FIG. 23.

FIG. 23 is a schematic plan view of a subpixel of a display device according to another embodiment of the disclosure. FIG. 24 is a schematic plan view illustrating the layout of electrodes and first banks in the subpixel of FIG. 23. FIG. 25 is a schematic cross-sectional view taken along line Q9-Q9' of FIG. 23. FIG. 26 is a schematic cross-sectional view taken along line Q10-Q10' of FIG. 23.

Referring to a subpixel SPXn of a display device 10_4 of FIGS. 23 through 26, dummy patterns DP disposed on a second sub-bank SBN2 may be separated from each other in a similar manner to how second and third electrodes RME2_4 and RME3_4 are separated from each other. For example, the dummy patterns DP may include first and fourth dummy patterns DP1 and DP4, which may be disposed on different first sub-banks SBN1, and second and fourth dummy patterns DP2 and DP4, which may be spaced apart from each other on the second sub-bank SBN2. The embodiment of FIGS. 23 through 26 may differ from the embodiment of FIG. 16 in that a plurality of dummy patterns DP may be spaced apart from one another and have the same width.

The first dummy pattern DP1 may be spaced apart from a first electrode RME1_4 on the left first sub-bank SBN1, and the fourth dummy pattern DP4 may be spaced apart from a fourth electrode RME4_4 on the right first sub-bank SBN1. The second and third dummy patterns DP2 and DP3 may be spaced apart from each other on the second sub-bank SBN2, an outer side of the second dummy pattern DP2 may be spaced apart from, and face, a second part EP2 of the second electrode RME2_4, and an outer side of the third dummy pattern DP3 may be spaced apart from, and face, a fifth part EP5 of the third electrode RME3_4. In the embodiment of FIGS. 23 through 26, unlike in the embodiment of FIG. 14, separate electrode lines may be formed for forming the second and third electrodes RME2_4 and RME3_4 during the fabrication of the display device 10_4. As a result of the patterning of the electrode lines along the sides of the second sub-bank SBN2, the second and third dummy patterns DP2 and DP3, which may be separated from the second and third electrodes RME2_4 and RME3_4, may be formed.

As the display device 10_4 may include a relatively large number of connecting electrodes CNE in each subpixel SPXn, the number of serial connections between light-emitting elements ED can be increased. In an example, the display device 10_4 may include first and second connecting electrodes CNE1_4 and CNE2_4, which are each disposed on one electrode RME_4 or one dummy pattern DP, and may further include third, fourth, and fifth connecting electrodes CNE3_4, CNE4_4, and CNE5_4, which may each be disposed on different multiple electrodes RME_4 and different multiple dummy patterns DP.

The first and second connecting electrodes CNE1_4 and CNE2_4 may have almost the same structure as their respective counterparts of FIG. 14 except for their relatively short length in a first direction DR1. The first and second connecting electrodes CNE1_4 and CNE2_4 may be disposed on one side, in the first direction DR1, of the center of an emission area EMA of the subpixel SPXn (e.g., on the upper side of the center of the emission area EMA). The first and second connecting electrodes CNE1_4 and CNE2_4 may be disposed over the emission area EMA and a subarea SA of the subpixel SPXn and may be in contact with the first and second electrodes RME1_4 and RME2_4, respectively, through first and second contacts CT1 and CT2, respectively, which may be disposed in the subarea SA.

The third connecting electrode CNE3_4 may include a first extension CN_E1, which may be disposed on the third electrode RME3_4 and the third dummy pattern DP3, a second extension CN_E2, which may be disposed on the first electrode RME1_4 and the first dummy pattern DP1, and a first connector CN_B1, which connects the first and second extensions CN_E1 and CN_E2. The first extension CN_E1 may be spaced apart from the first connecting electrode CNE1_4 in a second direction DR2, and the second extension CN_E2 may be spaced apart from the first connecting electrode CNE1_4 in the first direction DR1. The first extension CN_E1 may be disposed on the upper side of the emission area EMA, and the second extension CN_E2 may be disposed on the lower side of the emission area EMA. The first extension CN_E1 may be disposed over the emission area EMA and the subarea SA and may be connected to the third electrode RME3_4 through a third contact CT3, which may be formed in the subarea SA. The first connector CN_B1 may be disposed over the first and third electrodes RME1_4 and RME3_4. The third connecting electrode CNE3_4 may generally extend in the first direction DR1, may be bent in the second direction DR2, and may extend back in the first direction DR1.

The fourth connecting electrode CNE4_4 may include a third extension CN_E3, which is disposed on the third electrode RME3_4 and the third dummy pattern DP3, a fourth extension CN_E4, which is disposed on the fourth electrode RME4_4 and the fourth dummy pattern DP4, and a second connector CN_B2, which connects the third and fourth extensions CN_E3 and CN_E4. The third extension CN_E3 may be spaced apart from, and face, the second extension CN_E2 of the third connecting electrode CNE3_4 in the second direction DR2, and the fourth extension CN_E4 may be spaced apart from, and face, a sixth extension CN_E6 of the fifth connecting electrode CNE5_4 in the first direction DR1. The third and fourth extensions CN_E3 and CN_E4 may be disposed on the lower side of the emission area EMA, and the second connector CN_B2 may be disposed over the second, third, and fourth electrodes RME2_4, RME3_4, and RME4_4. The fourth connecting electrode CNE4_4 may be disposed to surround a fifth extension CN_E5 of the fifth connecting electrode CNE5_4 in a plan view.

The fifth connecting electrode CNE5_4 may include the fifth extension CN_E5, which may be disposed on the second electrode RME2_4 and the second dummy pattern DP2, a sixth extension CN_E6, which may be disposed on the fourth electrode RME4_4 and the fourth dummy pattern DP4, and a third connector CN_B3, which connects the fifth and sixth extensions CN_E5 and CN_E6. The fifth extension CN_E5 may be spaced apart from, and face, the fourth extension CN_E4 of the fourth connecting electrode CNE4_4 in the second direction DR2, and the sixth extension CN_E6 may be spaced apart from the second connecting electrode CNE2_4 in the second direction DR2. The fifth extension CN_E5 may be disposed on the lower side of the emission area EMA, and the sixth extension CN_E6 may also be disposed on the lower side of the emission area EMA. The sixth extension CN_E6 may be disposed over the emission area EMA and the subarea SA and may be connected to the fourth electrode RME4_4 through a fourth contact CT4, which is formed in the subarea SA. The third connector CN_B3 may be disposed over the second and fourth electrodes RME2_4 and RME4_4. The fifth connecting electrode CNE5_4 may generally extend in the first direction DR1, may be bent in the second direction DR2, and may extend back in the first direction DR1.

The first and second connecting electrodes CNE1_4 and CNE2_4 may be first-type connecting electrodes in contact with the first and second electrodes RME1_4 and RME2_4, which are directly connected to a third conductive layer, the third and fifth connecting electrode CNE3_4 and CNE5_4 may be second-type connecting electrodes in contact with the third and fourth electrodes RME3_4 and RME4_4, which are not directly connected to the third conductive layer, and the fourth connecting electrode CNE4_4 may be a third-type connecting electrode in contact with none of the electrodes RME_4.

The light-emitting elements ED may be classified into different groups of light-emitting elements ED depending on which of connecting electrodes CNE_4 they are in contact with. In an example, the light-emitting elements ED may include first light-emitting elements ED1 and third light-emitting elements ED3, which may be disposed on the first and third electrodes RME1_4 and RME3_4, and second light-emitting elements ED2 and fourth light-emitting elements ED4, which may be disposed on the second and fourth electrodes RME2_4 and RME4_4.

First end portions of the first light-emitting elements ED1 may be in contact with the first connecting electrode CNE1_4, and second end portions of the first light-emitting elements ED1 may be in contact with the first extension CN_E1 of the third connecting electrode CNE3_4. First end portions of the second light-emitting elements ED2 may be in contact with the sixth extension CN_E6 of the fifth connecting electrode CNE5_4, and second end portions of the second light-emitting elements ED2 may be in contact with the second connecting electrode CNE2_4. First end portions of the third light-emitting elements ED3 may be in contact with the second extension CN_E2 of the third connecting electrode CNE3_4, and second end portions of the third connecting electrode CNE3_4 may be in contact with the third extension CN_E3 of the fourth connecting electrode CNE4_4. First end portions of the fourth light-emitting elements ED4 may be in contact with the fourth extension CN_E4 of the fourth connecting electrode CNE4_4, and second end portions of the fourth light-emitting elements ED4 may be in contact with the fifth extension CN_E5 of the fifth connecting electrode CNE5_4.

The first end portions of the first light-emitting elements ED1 may be electrically connected to the first electrode RME1_4, which may be directly connected to the third conductive layer, and the second end portions of the second light-emitting elements ED2 may be electrically connected to the second electrode RME2_4, which may be directly connected to the third conductive layer. The first light-emitting elements ED1 and the third light-emitting elements ED3 may be electrically connected via the third connecting electrode CNE3_4, the third light-emitting elements ED3 and the fourth light-emitting elements ED4 may be electrically connected via the fourth connecting electrode CNE4_4, and the second light-emitting elements ED2 and the fourth light-emitting elements ED4 may be electrically connected via the fifth connecting electrode CNE5_4. The first light-emitting elements ED1, the second light-emitting elements ED2, the third light-emitting elements ED3, and the fourth light-emitting elements ED4 may be connected in series to one another via multiple connecting electrodes CNE_4.

The first connector CN_B1 of the third connecting electrode CNE3_4 and the third connector CN_B3 of the fifth connecting electrode CNE5_4 may extend in the second direction DR2 and may be disposed over a pair of adjacent different electrodes RME_4 in the second direction DR2 or over first and second sub-banks SBN1 and SBN2. The connecting electrodes CNE_4 may be short-circuited if both end portions of each of light-emitting elements ED disposed below the first or third connector CN_B1 or CN_B3 are connected to the first or third connector CN_B1 or CN_B3. To prevent this, second and third insulating layers PAS2 and PAS3 may be disposed to cover some of the light-emitting elements ED without exposing both end portions of each of the corresponding light-emitting elements ED, and the first, second, and third connectors CN_B1, CN_B2, and CN_B3, which extend in the second direction DR2, may be disposed on areas where the second and third insulating layers PAS2 and PAS3 may not be removed.

As illustrated in FIG. 26, the light-emitting elements ED may further include a plurality of fifth light-emitting elements ED5, which are covered by the second and third insulating layers PAS2 and PAS3 with both end portions thereof not exposed. Both end portions of each of the fifth light-emitting elements ED5 may be disposed on the first and third electrodes RME1_4 and RME3_4 or on the second and fourth electrodes RME2_4 and RME4_4 and may be in contact with none of the connecting electrodes CNE_4. The fifth light-emitting elements ED5 may be light-emitting elements ED disposed between first banks BNL1_4, in the emission area EMA and may be non-light-emitting devices connected to none of the connecting electrodes CNE_4. There may exist areas covered by the second and third insulating layers PAS2 and PAS3, in the middle of the emission area EMA, and the first connector CN_B1 of the third connecting electrode CNE3_4 and the third connector CN_B3 of the fifth connecting electrode CNE5_4 may be disposed in such areas. The first and third connectors CN_B1 and CN_B3 may be disposed to overlap with the fifth light-emitting elements ED5, but may not be directly connected to the first light-emitting elements ED5.

As the display device 10_4 may include a relatively large number of light-emitting elements ED in each subpixel SPXn and can configure serial connections between the light-emitting elements ED, the amount of light emitted per unit area can be further increased.

In a case where electrodes RME extend beyond an emission area EMA of one subpixel SPXn to be disposed in a subarea SA of another subpixel SPXn, fifth light-emitting elements ED5, which may be non-light-emitting devices, may remain in the emission area EMA. In some embodiments, a plurality of electrodes RME of one subpixel SPXn may be divided in the first direction DR1, and as a result, non-light-emitting devices such as fifth light-emitting elements ED5 may be removed from the middle of an emission area EMA of each subpixel SPXn.

Figure 27:
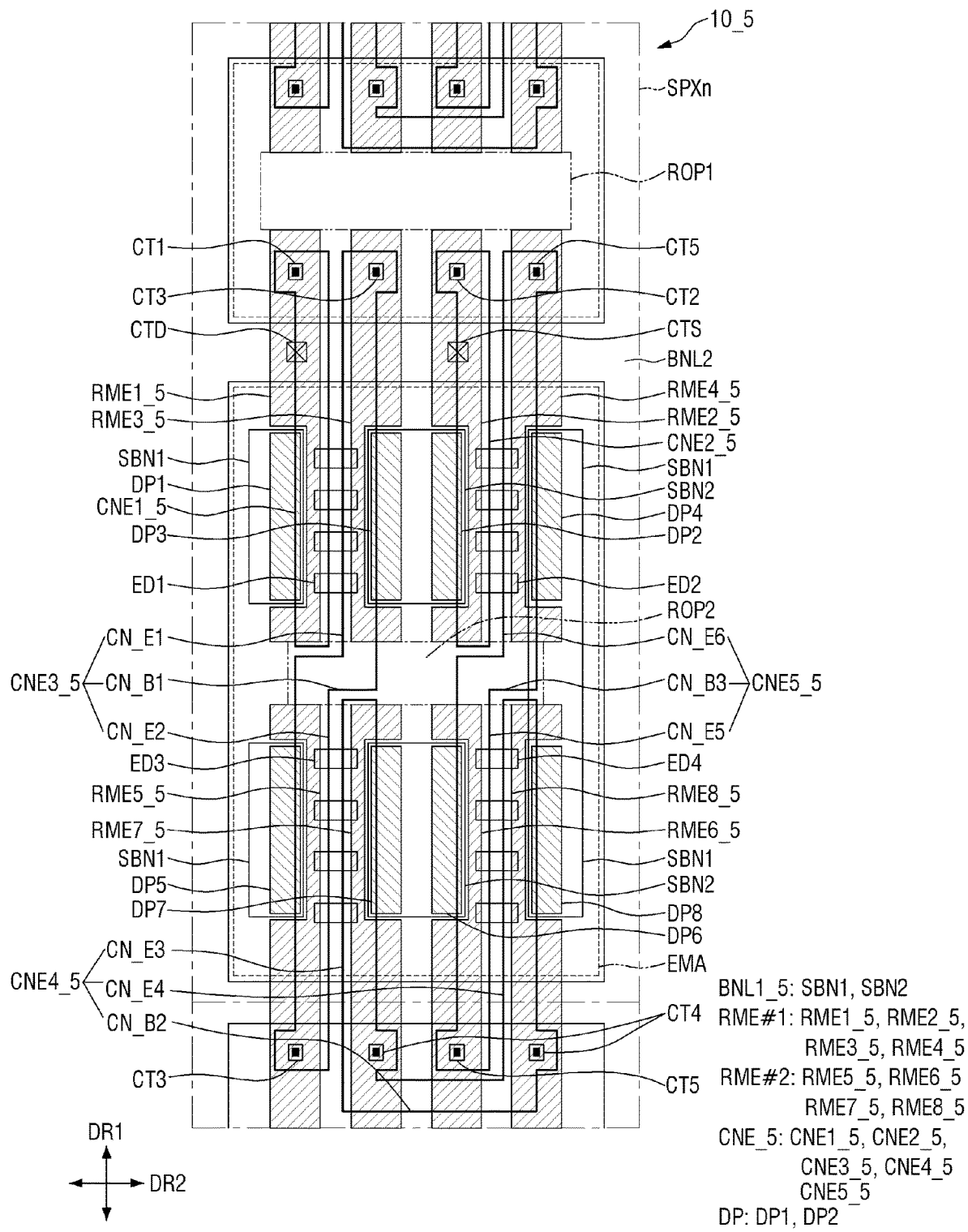
FIG. 27 is a schematic plan view of a subpixel of a display device according to another embodiment of the disclosure.
Figure 28:
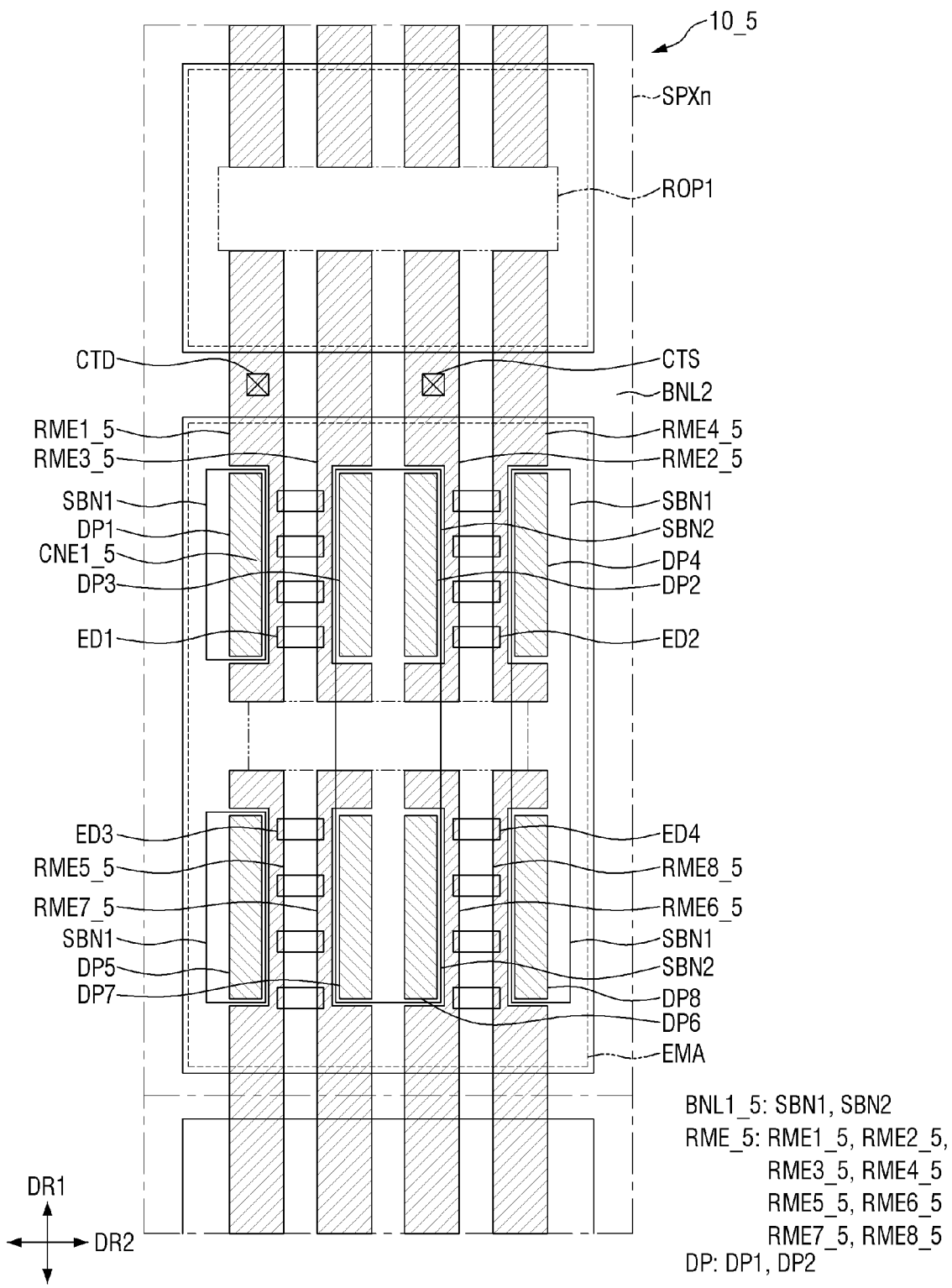
FIG. 28 is a schematic plan view illustrating the layout of electrodes and first banks in the subpixel of FIG. 27.

FIG. 27 is a schematic plan view of a subpixel of a display device according to another embodiment of the disclosure. FIG. 28 is a plan view illustrating the layout of electrodes and first banks in the subpixel of FIG. 27.

Referring to a subpixel SPXn of a display device 10_5 of FIGS. 27 and 28, a plurality of electrodes RME_5 may be disposed in an emission area EMA to be divided by a second separation part ROP2 of the emission area EMA. First, second, third, and fourth electrodes RME1_5, RME2_5, RME3_5, and RME4_5 may be disposed on the upper side of the second separation part ROP2, and fifth, sixth, seventh, and eighth electrodes RME5_5, RME6_5, RME7_5, and RME8_5 may be disposed on the lower side of the second separation part ROP2. The electrodes RME_5 may be obtained by forming single electrode lines and dividing the electrode lines in the second separation part ROP2 after the alignment of light-emitting elements ED. The display device 10_5 may differ from the display device 10_3 of FIG. 22 in the layout of the electrodes RME_5.

The second separation part ROP2 where the electrodes RME_5 may be divided in a first direction DR1 may be formed in the middle of the emission area EMA. The second separation part ROP2 may be formed in substantially the same manner as a first separation part ROP1 of a subarea SA. During the fabrication of the display device 10_5, a plurality of electrode lines may be formed to extend in the first direction DR1, a plurality of dummy patterns DP are separated from the electrode lines, and the light-emitting elements ED may be aligned. Thereafter, the electrode lines may be divided in each of the first and second separation parts ROP1 and ROP2, thereby obtaining the electrodes RME_5.

Sub-banks (SBN1 and SBN2) of first banks BNL1_5, like the electrodes RME_5, may be divided in the second separation part ROP2. First sub-banks SBN1 may be divided into upper first sub-banks SBN1 and lower first sub-banks SBN1 with respect to the second separation part ROP2, and second sub-banks SBN2 may be divided into an upper second sub-bank SBN2 and a lower second sub-bank SBN2 with respect to the second separation part ROP2. Specifically, the first sub-banks SBN1 may include a pair of upper first sub-banks SBN1 in an upper part of the emission area EMA, which may be spaced apart from each other in a second direction DR2, and a pair of lower second sub-banks SBN2 in a lower part of the emission area EMA, which may be spaced apart from each other in the second direction DR2. The upper first sub-banks SBN1 may be spaced apart from the lower first sub-banks SBN1 in the first direction DR1. Similarly, the second sub-banks SBN2 may include the upper and lower second sub-banks SBN2, which may be disposed in the upper and lower parts, respectively, of the emission area EMA and may be spaced apart from each other parallel in the first direction DR1.

The electrodes RME_5 may be divided into first and second electrode groups RME #1 and RME #2, which may be spaced apart from each other in the first direction DR1 by the second separation part ROP2, and each of the first and second electrode groups RME #1 and RME #2 may include multiple electrodes RME_5, which may be spaced apart from one another in the second direction DR2.

The electrodes RME_5 may be divided into the first electrode group RME #1, which may be disposed on the upper side of the second separation part ROP2, and the second electrode group RME #2, which may be disposed on the lower side of the second separation part ROP2.

The electrodes RME_5 of the first electrode group RME #1 may be disposed in part in the subarea SA beyond a second bank BNL2, and the electrodes RME_5 of the second electrode group RME #2 may be disposed in part in a subarea SA of a lower neighboring subpixel SPXn beyond the second bank BNL2. In the subarea SA, the first electrode group RME #1 and a second electrode group RME #2 of an upper neighboring subpixel SPXn may be disposed to be spaced apart from each other by the first separation part ROP1.

The electrodes RME_5 of the first electrode group RME #1 may be arranged parallel to the electrodes RME_5 of the second electrode group RME #2 in the first direction DR1. One of the electrodes RME_5 of the first electrode group RME #1 may be arranged parallel to one of the electrodes RME_5 of the second electrode group RME #2 in the first direction DR1. As already mentioned above, the electrodes RME_5 may be obtained by forming single electrode lines to extend in the first direction DR1 and dividing the electrode lines after the alignment of the light-emitting elements ED.

The first electrode group RME #1 may include the first electrode RME1_5 and the third electrode RME3_5, the second electrode RME2_5, and the fourth electrode RME4_5, which may be sequentially arranged next to the first electrode RME1_5 in the second direction DR2. The second electrode group RME #2 may include the fifth electrode RME5_5 and the seventh electrode RME7_5, the sixth electrode RME6_5, and the eighth electrode RME8_5, which may be sequentially arranged next to the fifth electrode RME5_5 in the second direction DR2. The second and sixth electrodes RME2_5 and RME6_5 may be arranged parallel in the first direction DR1, the third and seventh electrodes RME3_5 and RME7_5 may be arranged parallel in the first direction DR1, and the fourth and eighth electrodes RME4_5 and RME8_5 may be arranged parallel in the first direction DR1.

The first, second, third, and fourth electrodes RME1_5, RME2_5, RME3_5, and RME4_5 may be spaced apart from the upper first sub-banks SBN1 and the upper second sub-bank SBN2, which may be disposed in the upper part of the emission area EMA. The fifth, sixth, seventh, and eighth electrodes RME5_5, RME6_5, RME7_5, and RME8_5 may be spaced apart from the lower first sub-banks SBN1 and the lower second sub-bank SBN2, which are disposed in the lower part of the emission area EMA. The layout of the electrodes RME_5 relative to the sub-banks (SBN1 and SBN2) may be the same as described above.

The electrodes RME_5 may be spaced apart from one another in the first direction DR1, and similarly, a plurality of dummy patterns DP may be spaced apart from one another in the first and second directions DR1 and DR2. First, second, third, and fourth dummy patterns DP1, DP2, DP3, and DP4 may be disposed on the upper side of the second separation part ROP2, and fifth, sixth, seventh, and eighth dummy patterns DP5, DP6, DP7, and DP8 may be disposed on the lower side of the second separation part ROP2. The first dummy pattern DP1, the third dummy pattern DP3, the second dummy pattern DP2, and the fourth dummy pattern DP4 may be sequentially arranged in the second direction DR2 and may each be disposed on one of the upper first sub-banks SBN1 or on the upper second sub-bank SBN2. The fifth dummy pattern DP5, the seventh dummy pattern DP7, the sixth dummy pattern DP6, and the eighth dummy pattern DP8 may be sequentially arranged in the second direction DR2 and may each be disposed on one of the lower first sub-banks SBN1 or on the lower second sub-bank SBN2. The layout of the dummy patterns DP relative to the sub-banks (SBN1 and SBN2) of the first banks BNL1_5 may be the same as described above.

The light-emitting elements ED may include first light-emitting elements ED1, which may be disposed on the first and third electrodes RME1_5 and RME3_5, second light-emitting elements ED2, which may be disposed on the second and fourth electrodes RME2_5 and RME4_5, third light-emitting elements ED3, which may be disposed on the fifth and seventh electrodes RME5_5 and RME7_5, and fourth light-emitting elements ED4, which may be disposed on the sixth and eighth electrodes RME6_5 and RME8_5. Multiple connecting electrodes CNE_5 may include a first connecting electrode CNE1_5, which may be disposed on the first electrode RME1_5 and the first dummy pattern DP1, and a second connecting electrode CNE2_5, which may be disposed on the second electrode RME2_5 and the second dummy pattern DP2. The connecting electrodes CNE_5 may further include a third connecting electrode CNE3_5, which may be disposed on the third electrode RME3_5, the third dummy pattern DP3, the fifth electrode RME5_5, and the fifth dummy pattern DP5, a fourth connecting electrode CNE4_5, which may be disposed on the seventh electrode RME7_5, the seventh dummy pattern DP7, the eighth electrode RME8_5, and the eighth dummy pattern DP8, and a fifth connecting electrode CNE5_5, which may be disposed on the sixth electrode RME6_5, the sixth dummy pattern DP6, the fifth electrode RME5_5, and the fifth dummy pattern DP5. The connecting electrodes CNE_5 may be in contact with the electrodes RME_5 through a plurality of contacts (CT1, CT2, CT3, CT4, and CT5), which may be formed in the subarea SA or in the subarea SA of the lower neighboring subpixel SPXn. In the embodiment of FIGS. 27 and 28, unlike in the embodiment of FIG. 23, the fourth connecting electrode CNE4_5 may be in contact with the seventh and eighth electrodes RME7_5 and RME8_5 through fourth contacts CT4, which may be disposed in the subarea SA of the lower neighboring subpixel SPXn. The third connecting electrode CNE3_5 may be in contact with the third and fifth electrodes RME3_5 and RME5_5 through third contacts CT3, and the fifth connecting electrode CNE5_5 may be in contact with the fourth and sixth electrodes RME4_5 and RME6_5 through fifth contacts CT5. The layout of the light-emitting elements ED and the connecting electrodes CNE_5 relative to the electrodes RME_5 may be substantially the same as described above.

The embodiment of FIGS. 27 and 28 may differ from the embodiment of FIG. 23 in that the electrodes RME_5 and the sub-banks (SBN1 and SBN2) of the first banks BNL1_5 may be divided into upper electrodes RME_5 and lower electrodes RME_5 and into upper sub-banks (SBN1 and SBN2) and lower sub-banks (SBN1 and SBN2), respectively, by the second separation part ROP2. The display device 10_5 can eliminate non-light-emitting devices that may become defects.

Each pixel PX of a display device 10 may further include a color control structure (TPL, WCL1, and WCL2) and a color filter layer CFL, on light-emitting elements ED. Light emitted by the light-emitting elements ED may be output through the color control structure (TPL, WCL1, and WCL2) and the color filter layer CFL, and even if light-emitting elements ED of the same type are disposed in subpixels SPXn of each pixel PX, the subpixels SPXn of each pixel PX may emit light of different colors.

FIGS. 29 through 32 are schematic cross-sectional views of display devices according to other embodiments of the disclosure.

Figure 29:
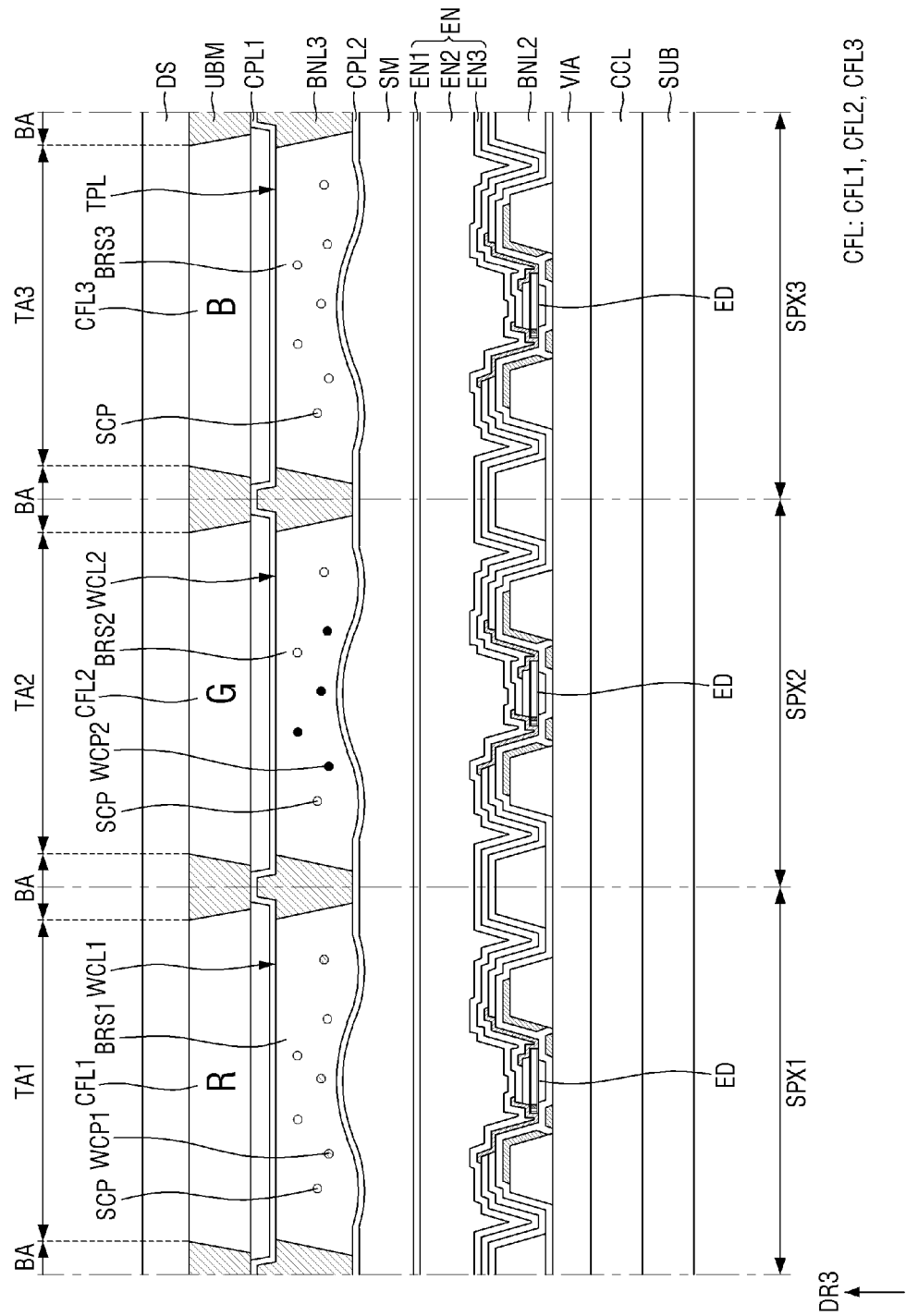
FIGS. 29 through 32 are schematic cross-sectional views of display devices according to other embodiments of the disclosure.

Referring to FIG. 29, a display device 10 may include a second substrate DS, which faces a first substrate SUB, and color filter layers CFL and a color control structure (TPL, WCL1, and WCL2), which may be disposed on a surface of the second substrate DS. The display device 10 may further include encapsulation layers EN, which may be disposed on a third insulating layer PAS3, on the first substrate SUB. The first and second substrates SUB and DS may be bonded to each other by a sealing member SM.

The encapsulation layers EN, which may be disposed on the first substrate SUB, may be disposed to cover the third insulating layer PAS3 and first connecting electrodes CNE1. The encapsulation layers EN may be disposed on the entire surface of the first substrate SUB and may completely cover the elements disposed on the first substrate SUB.

The encapsulation layers EN may include first, second, and third encapsulation layers EN1, EN2, and EN3, which may be sequentially stacked on the third insulating layer PAS3. The first and third encapsulation layers EN1 and EN3 may include an inorganic insulating material, and the second encapsulation layer EN2 may include an organic insulating material. In an example, the first and third encapsulation layers EN1 and EN3 may include at least one of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride ($SiO_xN_y$), and lithium fluoride, and the second encapsulation layer EN2 may include at least one of an acrylic resin, a methacrylic resin, polyisoprene, a vinyl resin, an epoxy resin, a urethane resin, a cellulose resin, and a perylene resin. The structure and the material of the encapsulation layers EN are not particularly limited, but may vary.

The color filter layers CFL and the color control structure (TPL, WCL1, and WCL2) may be disposed on the second substrate DS, above the encapsulation layers EN. In the embodiment of FIG. 29, the color filter layers CFL and the color control structure (TPL, WCL1, and WCL2) may be disposed on the surface of the second substrate DS, and the second substrate DS may be bonded to the first substrate SUB with light-emitting elements ED disposed thereon, by the sealing member SM.

The display device 10 may include multiple first, second, and third light-transmitting areas TA1, TA2, and TA3, which have the color filter layer CF disposed therein and emit light, and a light-blocking area BA, which may be disposed between the first, second, and third light-transmitting areas TA1, TA2, and TA3 and may not emit light. The first, second, and third light-transmitting areas TA1, TA2, and TA3 may be located to correspond to parts of emission areas EMA of first, second, and third subpixels SPX1, SPX2, and SPX3 of a pixel PX, and the light-blocking area BA may account for the rest of the pixel PX. As will be described later, the first, second, and third light-transmitting areas TA1, TA2, and TA3 and the light-blocking area BA may be defined by an upper light-absorbing member UBM.

The second substrate DS may be spaced apart from, and face, the first substrate SUB. The second substrate DS may be formed of a light-transmitting material. In some embodiments, the second substrate DS may include a glass substrate or a plastic substrate. In some embodiments, the second substrate DS may further include a layer disposed on the glass substrate or the plastic substrate, such as an inorganic insulating layer. The first, second, and third light-transmitting areas TA1, TA2, and TA3 and the light-blocking area BA may be defined on the second substrate DS, as illustrated in FIG. 29.

The upper light-absorbing member UBM may be disposed on a surface of the second substrate DS that faces the first substrate SUB. The upper light-absorbing member UBM may be formed in a lattice pattern to expose parts of the surface of the second substrate DS. The upper light-absorbing member UBM may be disposed to cover subareas SA of the first, second, and third subpixels SPX1, SPX2, and SPX3 together with the second bank BNL2, in a plan view. Areas where the upper light-blocking member UBM may not be disposed may be the first, second, and third light-transmitting areas TA1, TA2, and TA3, which have the color filter layer CF disposed therein and emit light, and an area where the upper light-blocking member UBM may be disposed may be the light-blocking area BA, which blocks the transmission of light.

The upper light-absorbing member UBM may include an organic material capable of absorbing light. The upper light-absorbing member UBM may absorb external light and may thus reduce the distortion of colors that may be caused by the reflection of external light. In an example, the upper light-absorbing member UBM may be formed of a material that is used as a black matrix for the display device 10, and may absorb all visible wavelengths.

In some embodiments, the upper light-absorbing member UBM may include a material capable of absorbing light of a particular visible wavelength range and transmitting light of another particular visible wavelength range. The upper light-absorbing member UBM may be replaced with a color pattern including the same material as one of the color filter layers CFL. In an example, in the area where the upper light-absorbing member UBM may be disposed, a color pattern or a stack of multiple color patterns including the same material as one of the color filter layers CFL may be disposed. This example will be described later in detail.

The color filter layers CFL may be disposed on the surface of the second substrate DS. The color filter layers CFL may be disposed on the surface of the second substrate DS to correspond to areas opened by the upper light-absorbing member UBM. The color filter layers CFL may be spaced apart from one another by the upper light-absorbing member UBM, but the disclosure is not limited thereto. In other embodiments, the color filter layers CFL may be disposed in part on the upper light-absorbing member UBM to be spaced apart from one another over the upper light-absorbing member UBM. In yet other embodiments, the color filter layers CFL may overlap in part with one another.

The color filter layers CFL may include a first color filter layer CFL1, which may be disposed in the first subpixel SPX1, a second color filter layer CFL2, which may be disposed in the second subpixel SPX2, and a third color filter layer CFL3, which may be disposed in the third subpixel SPX3. The first, second, and third color filter layers CFL1, CFL2, and CFL3 may be disposed in the first, second, and third light-transmitting areas TA1, TA2, and TA3 or the emission areas EMA of first, second, and third subpixels SPX1, SPX2, and SPX3 as island patterns, but the disclosure is not limited thereto. The first, second, and third color filter layers CFL1, CFL2, and CFL3 may form linear patterns.

The color filter layers CFL may include a colorant (such as a pigment or a dye) capable of absorbing light of wavelengths other than a particular wavelength range pigment. The first, second, and third color filter layers CFL1, CFL2, and CFL3 may be disposed in the first, second, and third subpixels SPX1, SPX2, and SPX3, respectively, to transmit therethrough only some of light incident upon the first, second, and third subpixels SPX1, SPX2, and SPX3. The first, second, and third subpixels SPX1, SPX2, and SPX3 may selectively display light of colors that the first, second, and third color filter layers CFL1, CFL2, and CFL3 respectively transmit therethrough. The first color filter layer CFL1 may be a red filter layer, the second color filter layer CFL2 may be a green filter layer, and the third color filter layer CFL3 may be a blue filter layer. Light emitted by the light-emitting elements ED may pass through the color control structure (TPL, WCL1, and WCL2) and may be output through the color filter layers CFL.

A first capping layer CPL1 may be disposed on the color filter layers CFL and on the upper light-absorbing member UBM. The first capping layer CPL1 may prevent the color filter layers CFL from being damaged by, or contaminated with, external impurities such as moisture or the air. The first capping layer CPL1 may be formed of an inorganic insulating material.

A third bank BNL3 may be disposed on a surface of the first capping layer CPL1 to overlap with the upper light-absorbing member UBM. The third bank BNL3 may include parts that extend in the first direction DR1 and parts that extend in the second direction DR2 and may be arranged in a lattice pattern. The third bank BNL3 may surround areas where the color filter layers CFL may be disposed, to correspond to the first, second, and third light-transmitting areas TA1, TA2, and TA3. The third bank BNL3 may form areas in which the color control structure (TPL, WCL1, and WCL2) is to be disposed.

The color control structure (TPL, WCL1, and WCL2) may be disposed in the areas surrounded by the third bank BNL3, on the surface of the first capping layer CPL1. The color control structure (TPL, WCL1, and WCL2) may be disposed in the first, second, and third light-transmitting areas TA1, TA2, and TA3, surrounded by the third bank BNL3, and may form island patterns in a display area DPA, but the disclosure is not limited thereto. In other embodiments, the color control structure (TPL, WCL1, and WCL2) may extend in one direction over multiple subpixels SPXn to form linear patterns.

In an embodiment where the light-emitting elements ED emit third-color light, i.e., blue light, the color control structure (TPL, WCL1, and WCL2) may include a first wavelength conversion layer WCL1, which may be disposed in the first subpixel SPX1 to correspond to the first light-transmitting area TA1, a second wavelength conversion layer WCL2, which may be disposed in the second subpixel SPX2 to correspond to the second light-transmitting area TA2, and a light-transmitting layer TPL, which may be disposed in the third subpixel SPX3 to correspond to the third light-transmitting area TA3.

The first wavelength conversion layer WCL1 may include a first base resin BRS1 and a first wavelength conversion material WCP1, which is disposed in the first base resin BRS1. The second wavelength conversion layer WCL2 may include a second base resin BRS2 and a second wavelength conversion material WCP2, which is disposed in the second base resin BRS2. The first and second wavelength conversion layers WCL1 and WCL2 may convert blue light incident from the light-emitting elements ED and may transmit the converted light therethrough. Each of the first and second wavelength conversion layers WCL1 and WCL2 may further include a scatterer SCP, which may be included in the first or second base resin BRS1 or BRS2 and can improve the efficiency of wavelength conversion.

The light-transmitting layer TPL may include a third base resin BRS3 and a scatterer SCP, which is disposed in the third base resin BRS3. The light-transmitting layer TPL may transmit blue light incident from the light-emitting elements ED therethrough while maintaining the wavelength of the blue light. The scatterer SCP of the light-transmitting layer TPL may control the path along which light is to be emitted through the light-transmitting layer TPL. The light-transmitting layer TPL may not include a wavelength conversion material.

The scatterers SCP of the first wavelength conversion layer WCL1, the second wavelength conversion layer WCL2, and the light-transmitting layer TPL may be particles of a metal oxide or an organic material. The metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), and the organic material may be an acrylic resin or a urethane resin.

The first, second, and third base resins BRS1, BRS2, and BRS3 may include a light-transmitting organic material. In an example, the first, second, and third base resins BRS1, BRS2, and BRS3 may include an epoxy resin, an acrylic resin, a cardo resin, or an imide resin. The first, second, and third base resins BRS1, BRS2, and BRS3 may be formed of the same material, but the disclosure is not limited thereto.

The first wavelength conversion material WCP1 may be a material that converts third-color light, i.e., blue light, into first-color light, i.e., red light, and the second wavelength conversion material WCP2 may be a material that converts blue light into a second-color light, i.e., green light. The first and second wavelength conversion materials WCP1 and WCP2 may be quantum dots, quantum rods, or phosphors. The quantum dots may include group IV nanocrystals, group II-VI compound nanocrystals, group III-V compound nanocrystals, group IV-VI nanocrystals, or a combination thereof.

The color control structure (TPL, WCL1, and WCL2) is illustrated as having an uneven top surface and being higher near the third bank BNL3 than in the middle of the areas surrounded by the third bank BNL3, but the disclosure is not limited thereto. The color control structure (TPL, WCL1, and WCL2) may be formed to have a flat top surface or to be higher in the middle of the areas surrounded by the third bank BNL3 than near the third bank BNL3.

The light-emitting elements ED of each of the first, second, and third subpixels SPX1, SPX2, and SPX3 may all emit blue light, and the first, second, and third subpixels SPX1, SPX2, and SPX3 may output light of different colors. In an example, light emitted by the light-emitting elements ED of the first subpixel SPX1 may be incident upon the first wavelength conversion layer WCL1, light emitted by the light-emitting elements ED of the second subpixel SPX2 may be incident upon the second wavelength conversion layer WCL2, and light emitted by the light-emitting elements ED of the third subpixel SPX3 may be incident upon the light-transmitting layer TPL. The light incident upon the first wavelength conversion layer WCL1 may be converted into red light, the light incident upon the second wavelength conversion layer WCL2 may be converted into green light, and the light incident upon the light-transmitting layer TPL may be emitted through the light-transmitting layer TPL as blue light without being wavelength-converted. Even if light-emitting elements ED that emit light of the same color are disposed in each of the first, second, and third subpixels SPX1, SPX2, and SPX3, the first, second, and third subpixels SPX1, SPX2, and SPX3 may be able to emit light of different colors depending on the layout of the color control structure (TPL, WCL1, and WCL2).

The light-emitting elements ED of the first subpixel SPX1 may emit blue light, and the blue light may be incident upon the first wavelength conversion layer WCL1 through the encapsulation layers EN and a second capping layer CPL2. The first base resin BRS1 of the first wavelength conversion layer WCL1 may be formed of a transparent material, and some of the blue light may be incident upon the first capping layer CPL1 through the first base resin BRS1. However, at least some of the blue light may be incident upon the scatterer SCP and the first wavelength conversion material WCP1 in the first base resin BRS1 and may be scattered, be converted into red light, and be incident upon the first capping layer CPL1 as red light. Light incident upon the second capping layer CPL2 may be incident upon the first color filter layer CPL1, and the first color filter layer CFL1 may block the transmission of all beams of light except for red R light. Thus, red light may be output from the first subpixel SPX1.

Similarly, light emitted by the light-emitting elements ED of the second subpixel SPX2 may be output through the encapsulation layers EN, the second capping layer CPL2, the second wavelength conversion layer WCL2, the first capping layer CPL1, and the second color filter layer CFL2 as green G light.

The light-emitting elements ED of the third subpixel SPX3 may output blue light, and the blue light may be incident upon the light-transmitting layer TPL through the encapsulation layers EN and the second capping layer CPL2. The third base resin BRS3 of the light-transmitting layer TPL may be formed of a transparent material, and some of the blue light may be incident upon the third color filter layer CFL3 through the third base resin BRS3. The light incident upon the first capping layer CPL1 may be incident upon the third color filter layer CFL3 through the first capping layer CPL1, and the third color filter layer CFL3 may block the transmission of all beams of light except for blue light. Thus, blue B light may be output from the third subpixel SPX3.

As the color control structure (TPL, WCL1, and WCL2) and the first, second, and third color filter layers CFL1, CFL2, and CFL3 may be disposed above light-emitting elements ED, the first, second, and third subpixels SPX1, SPX2, and SPX3 can emit light of different colors even if light-emitting elements ED of the same type are disposed in each of the first, second, and third subpixels SPX1, SPX2, and SPX3.

Referring to FIG. 29, the first, second, and third color filter layers CFL1, CFL2, and CFL3 and the color control structure (TPL, WCL1, and WCL2) may be formed on the second substrate DS, and the first and second substrates SUB and DS may be bonded together by the sealing member SM. However, the disclosure is not limited thereto. In other embodiments, the color control structure (TPL, WCL1, and WCL2) may be formed directly on the first substrate SUB, or the first, second, and third color filter layers CFL1, CFL2, and CFL3 may also be formed on the first substrate SUB, in which case, the second substrate DS may not be provided.

Figure 30:
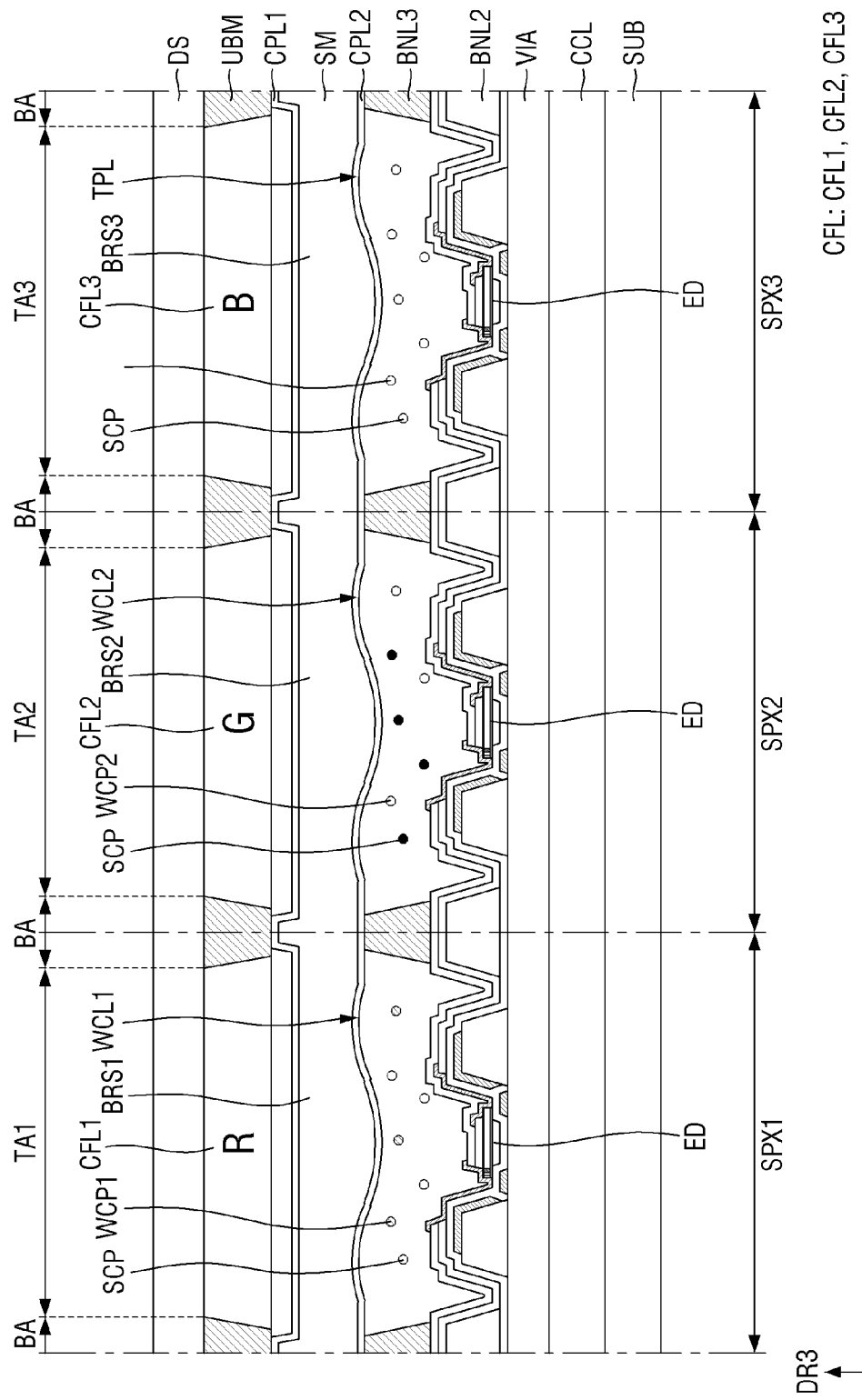

Referring to FIG. 30, a color control structure (TPL, WCL1, and WCL2) and a third bank BNL3 may be formed on a first substrate SUB, and color filter layers CFL may be formed on a second substrate DS. The embodiment of FIG. 30 may differ from the embodiment of FIG. 29 in the layout of the color control structure (TPL, WCL1, and WCL2).

The third bank BNL3 may be disposed directly on a third insulating layer PAS3 to overlap with a second bank BNL2 in a thickness direction. The third bank BNL3 may be disposed to surround at least emission areas EMA of first, second, and third subpixels SPX1, SPX2, and SPX3, and the color control structure (TPL, WCL1, and WCL2) may be disposed to correspond to the emission areas EMA. In other embodiments, the color control structure (TPL, WCL1, and WCL2) may be formed as linear patterns and may be disposed over multiple emission areas EMA.

The color control structure (TPL, WCL1, and WCL2) may be disposed directly on first connecting electrodes CNE1 and the third insulating layer PAS3. Light-emitting elements ED and the color control structure (TPL, WCL1, and WCL2) may be continuously arranged on one first substrate SUB. The third bank BNL3 may have a height and may be disposed to surround areas in which the light-emitting elements ED are disposed, and first, second, and third base resins BRS1, BRS2, and BRS3 of the color control structure (TPL, WCL1, and WCL2) may be disposed directly on the third insulating layer PAS3, in the areas surrounded by the third bank BNL3. Scatterers SCP and first and second wavelength conversion materials WCP1 and WCP2 of the color control structure (TPL, WCL1, and WCL2) may be disposed near the light-emitting elements ED, in the first, second, and third base resins BRS1, BRS2, and BRS3.

A second capping layer CPL2 may be disposed on the third bank BNL3 and the color control structure (TPL, WCL1, and WCL2). Processes of forming a circuit layer CCL, forming the light-emitting elements ED and electrodes RME, and forming the color control structure (TPL, WCL1, and WCL2) may be performed on the first substrate SUB. The color filter layers CFL, an upper light-absorbing member UBM, and a first capping layer CPL1 may be disposed on a surface of the second substrate DS, and the second substrate DS may be bonded to the first substrate SUB where the color control structure (TPL, WCL1, and WCL2) may be formed, by a sealing member SM. According to the embodiment of FIG. 30, as the distance between the light-emitting elements ED and the color control structure (TPL, WCL1, and WCL2) decreases, the efficiency of color conversion can be increased. Also, as the color control structure (TPL, WCL1, and WCL2) may be disposed directly on the color control structure (TPL, WCL1, and WCL2), encapsulation layers EN may not be provided.

Figure 31:
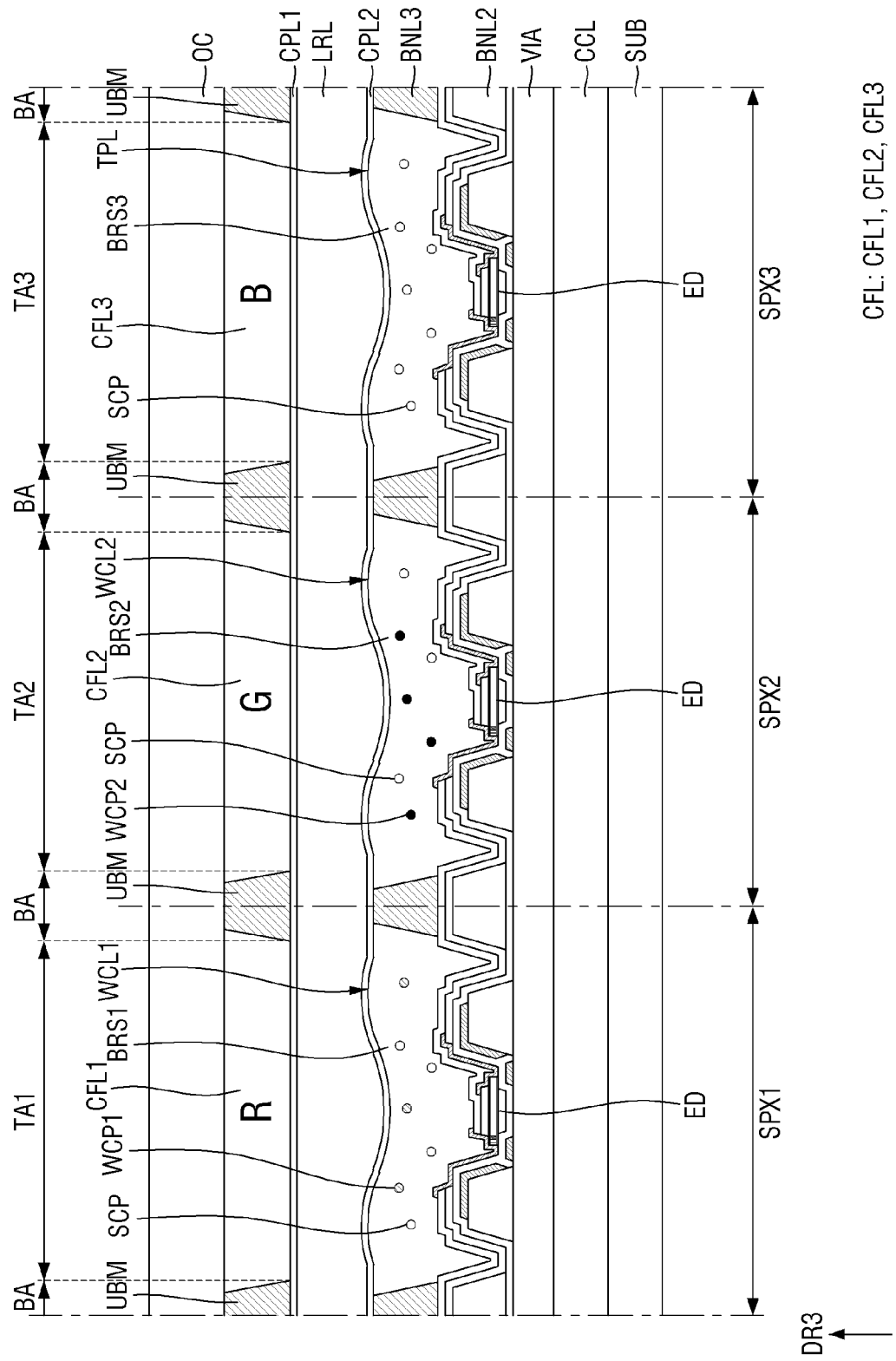

Referring to FIG. 31, light-emitting elements ED may be disposed on a first substrate SUB, and a color control structure (TPL, WCL1, and WCL2) and color filter layers CFL may be sequentially arranged above the light-emitting elements ED. The embodiment of FIG. 31 may differ from the embodiment of FIG. 30 in that layers are all formed on a first substrate SUB, and that a second substrate DS and a sealing member SM are not provided.

A low refractive layer LRL may be disposed on the color control structure (TPL, WCL1, and WCL2) and a third bank BNL3, and a first capping layer CPL1, the color filter layers CFL, an upper light-absorbing member UBM, and an overcoat layer OC may be disposed on the low refractive layer LRL.

The low refractive layer LRL, which may be an optical layer capable of recycling light transmitted through the color control structure (TPL, WCL1, and WCL2), can improve the emission efficiency and the color purity of a display device 10. The low refractive layer LRL may be formed of an organic material having a low refractive index and can compensate for any height differences formed by the color control structure (TPL, WCL1, and WCL2) and the third bank BNL3.

The first capping layer CPL1, the color filter layers CFL, and the upper light-absorbing member UBM may be substantially the same as described above except for their locations.

The first capping layer CPL1 may be disposed on the low refractive layer LRL and may prevent the low refractive layer LRL from being damaged by, or contaminated with, external impurities such as moisture or the air. The upper light-absorbing member UBM may be disposed to overlap with the third bank BNL3, on the first capping layer CPL1. The upper light-absorbing member UBM may be formed in a lattice pattern to expose parts of a surface of the first capping layer CPL1. The color filter layers CFL may be disposed on the first capping layer CPL1 to correspond to areas opened by the upper light-absorbing member UBM.

The overcoat layer OC may be disposed on the color filter layers CFL and the upper light-absorbing member UBM. The over coat layer OC may be disposed on the entire surface of a display area DPA and may also be disposed in part in a non-display area NDA. The overcoat layer OC may include an organic insulating material and may protect the elements disposed in the display area DPA from the outside.

Figure 32:
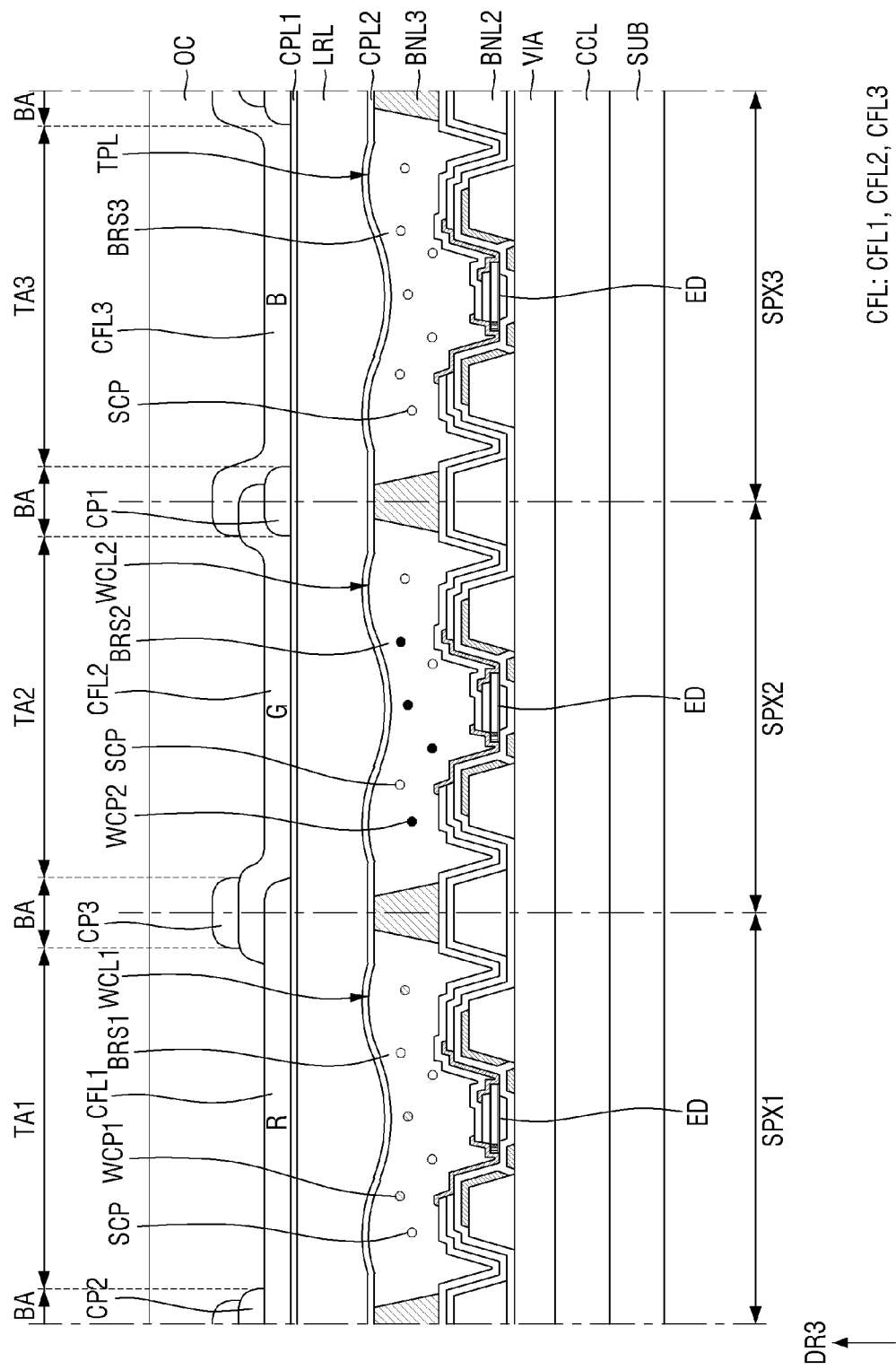

Referring to FIG. 32, an upper light-absorbing member UBM may not be provided, and a plurality of color patterns (CP1, CP2, and CP3) may be provided. The embodiment of FIG. 32 may differ from the embodiment of FIG. 31 in that an upper light-absorbing member UBM may be replaced with the color patterns (CP1, CP2, and CP3).

The color patterns (CP1, CP2, and CP3) may be formed in substantially the same as the upper light-absorbing member UBM of FIG. 31. The color patterns (CP1, CP2, and CP3) may include the same material as, and be integrally formed with, color filter layers CFL. The color patterns (CP1, CP2, and CP3) may be stacked in a light-blocking area BA so that the transmission of light may be blocked in the light-blocking area BA.

A first color pattern CP1 may include the same material as a first color filter layer CFL1 and may be disposed in the light-blocking area BA. The first color pattern CP1 may be disposed directly on the first capping layer CPL1, in the light-blocking area BA, and may be integrally formed with the first color filter layer CFL1, in part of the light-blocking area BA adjacent to a first light-transmitting area TA1 of a first subpixel SPX1.

A second color pattern CP2 may include the same material as a second color filter layer CFL2 and may be disposed in the light-blocking area BA. The second color pattern CP2 may be disposed directly on the first color pattern CP1, in the light-blocking area BA, and may be integrally formed with the second color filter layer CFL2, in part of the light-blocking area BA adjacent to a second light-transmitting area TA2 of a second subpixel SPX2. Similarly, a third color pattern CP3 may include the same material as a third color filter layer CFL3 and may be disposed in the light-blocking area BA. The third color pattern CP3 may be disposed directly on the second color pattern CP2, in the light-blocking area BA, and may be integrally formed with the third color filter layer CFL3, in part of the light-blocking area BA adjacent to a third light-transmitting area TA3 of a third subpixel SPX3.

According to the embodiment of FIG. 32, as the color patterns (CP1, CP2, and CP3) may be stacked and perform the same functions as an upper light-absorbing member UBM, color mixing that may be caused by materials including different colorants can be prevented between neighboring areas. Also, as the color patterns (CP1, CP2, and CP3) include the same material as the color filter layers CFL, external light or reflected light transmitted through the light-blocking area BA may have a color or a wavelength range. The eye color sensibility perceived by the eyes of a user varies depending on the color of light, and blue-wavelength light may be perceived less sensitively than green- and red-wavelength light to the user. As an upper light-absorbing member UBM is not provided in the light-blocking area BA, and instead, the color patterns (CP1, CP2, and CP3) may be provided, the transmission of light can be blocked, and at the same time, reflected light can be perceived less sensitively by the user. Also, reflected light from external light can be reduced by absorbing the external light.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
    first banks extending in a first direction, the first banks being spaced apart from each other in a second direction intersecting the first direction;
    a first electrode extending in the first direction and including a first part which is disposed between the first banks, the first electrode being spaced apart from the first banks in a view in a third direction perpendicular to both the first direction and the second direction;
    a second electrode extending in the first direction and including a second part which is spaced apart from the first part in the second direction and disposed between the first banks, the second electrode being spaced apart from the first banks in the view;

a first dummy pattern disposed on one of the first banks and spaced apart from the first part of the first electrode;
a second dummy pattern disposed on another one of the first banks and spaced apart from the second part of the second electrode; and
light-emitting elements disposed between the first banks, the light-emitting elements having at least one end portion disposed on one of the first part of the first electrode and the second part of the second electrode.

2. The display device of claim 1, wherein
a first distance between the first electrode and the second electrode is smaller than a second distance between the first banks, and
a first width of the first part of the first electrode and the second part of the second electrode is smaller than the first distance.

3. The display device of claim 2, wherein a width of the first dummy pattern and the second dummy pattern is greater than the first width.

4. The display device of claim 1, wherein
the first electrode further includes a third part which extends in the first direction, is connected to the first part, and is disposed on a side of the one of the first banks in the first direction,
the second electrode further includes a fourth part which extends in the first direction, is connected to the second part, and is disposed on a side of the another one of the first banks in the first direction, and
a second width of the third part and the fourth part is greater than a width of the first dummy pattern and the second dummy pattern.

5. The display device of claim 4, wherein
one of the sides of the third part that faces the fourth part is parallel to one of the sides of the first part that faces the second part in the first direction, and
one of the sides of the fourth part that faces the third part is parallel to one of the sides of the second part that faces the first part in the first direction.

6. The display device of claim 5, wherein
another side of the third part is spaced apart from a side of the first dummy pattern that does not face the first part, and
another side of the fourth part is spaced apart from a side of the second dummy pattern that does not face the second part.

7. The display device of claim 5, wherein
another side of the first part is spaced apart from the first dummy pattern, and
another side of the second part is spaced apart from the second dummy pattern.

8. The display device of claim 4, further comprising:
a first insulating layer disposed on the first electrode, the second electrode, the first dummy pattern, and the second dummy pattern;
a first connecting electrode disposed on the first electrode and the first dummy pattern, the first connecting electrode electrically contacting first end portions of the light-emitting elements; and
a second connecting electrode disposed on the second electrode and the second dummy pattern, the second connecting electrode electrically contacting second end portions of the light-emitting elements.

9. The display device of claim 8, wherein
the first connecting electrode contacts the first electrode through a first contact which penetrates the first insulating layer,
the first connecting electrode does not contact the first dummy pattern,
the second connecting electrode contacts the second electrode through a second contact which penetrates the first insulating layer, and
the second connecting electrode does not contact the second dummy pattern.

10. The display device of claim 4, wherein
the first banks include first sub-banks and a second sub-bank which is disposed between the first sub-banks,
the first part of the first electrode is disposed between one of the first sub-banks and the second sub-bank,
the second part of the second electrode is disposed between another one of the first sub-banks and the second sub-bank, and
the display device further comprises:
a third electrode which is disposed between the first electrode and the second electrode and includes a fifth part disposed between the one of the first sub-banks and the second sub-bank; and
a fourth electrode which is spaced apart from the second electrode in the second direction and includes a sixth part disposed between the another one of the first sub-banks and the second sub-bank.

11. The display device of claim 10, further comprising:
a third dummy pattern spaced apart from the sixth part of the fourth electrode and disposed on the another one of the first sub-banks, wherein
the second dummy pattern is disposed between the second part of the second electrode and the fifth part of the third electrode and disposed on the second sub-bank, and
a width of the second dummy pattern is greater than each of a width of the first dummy pattern and a width of the third dummy pattern.

12. The display device of claim 10, further comprising:
a third dummy pattern spaced apart from the fifth part of the third electrode and disposed on the second sub-bank; and
a fourth dummy pattern spaced apart from the sixth part of the fourth electrode and disposed on the another one of the first sub-banks,
wherein the second dummy pattern and the third dummy pattern are spaced apart from each other on the second sub-bank.

13. A display device comprising:
first banks extending in a first direction, the first banks being spaced apart from each other in a second direction intersecting the first direction;
a first electrode extending in the first direction and including a first part which is disposed between the first banks;
a second electrode extending in the first direction and including a second part which is spaced apart from the first part in the second direction and disposed between the first banks;
a first dummy pattern disposed on one of the first banks and spaced apart from the first part of the first electrode;
a second dummy pattern disposed on another one of the first banks and spaced apart from the second part of the second electrode; and
light-emitting elements disposed between the first banks, the light-emitting elements having at least one end portion disposed on one of the first part of the first electrode and the second part of the second electrode, wherein the first electrode and the second electrode are spaced apart from the first dummy pattern and the second dummy pattern at a same distance along sides of the first banks.

14. A display device comprising:
first banks disposed on a first substrate;
a first electrode including a first part which is disposed between the first banks;
a second electrode including a second part which is disposed between the first banks and spaced apart from the first part;
dummy patterns disposed on the first banks and spaced apart from the first electrode and the second electrode;
a first insulating layer disposed on the first banks, the first electrode, the second electrode, and the dummy patterns; and
light-emitting elements disposed between the first banks and disposed on the first insulating layer, the light-emitting elements having at least one end portion disposed on one of the first part of the first electrode and the second part of the second electrode.

15. The display device of claim 14, wherein
the first electrode and the second electrode are spaced apart from the first banks, and
each of a width of the first part of the first electrode and a width of the second part of the second electrode are smaller than a distance between the first and second parts of the first and second electrodes.

16. The display device of claim 14, wherein
the dummy patterns include:
  a first dummy pattern which is disposed on a first bank adjacent to the first part; and
  a second dummy pattern which is disposed on a first bank adjacent to the second part, and
a distance between the first dummy pattern and the second dummy pattern is greater than a distance between the first banks.

17. The display device of claim 16, wherein
a width of the first dummy pattern is greater than a width of the first part, and
a width of the second dummy pattern is greater than a width of the second part.

18. The display device of claim 16, further comprising:
a first connecting electrode disposed on the first electrode and the first dummy pattern, the first connecting electrode electrically contacting first end portions of the light-emitting elements; and
a second connecting electrode disposed on the second electrode and the second dummy pattern, the second connecting electrode electrically contacting second end portions of the light-emitting elements,
wherein the first connecting electrode and the second connecting electrode do not contact the first dummy pattern and the second dummy pattern.

19. The display device of claim 14, wherein
the first banks include first sub-banks and a second sub-bank which is disposed between the first sub-banks,
the first part of the first electrode is disposed between one of the first sub-banks and the second sub-bank,
the second part of the second electrode is disposed between another one of the first sub-banks and the second sub-bank, and
the display device further comprises:
  a third electrode including a part that is spaced apart from the first part of the first electrode and is disposed between the one of the first sub-banks and the second sub-bank, and
  a fourth electrode including a part that is spaced apart from the second part of the second electrode and is disposed between the another one of the first sub-banks and the second sub-bank.

20. The display device of claim 19, wherein
the dummy patterns further include:
  a first dummy pattern which is spaced apart from the first electrode and is disposed on the one of the first sub-banks;
  a second dummy pattern which is spaced apart from the second electrode and is disposed on the second sub-bank;
  a third dummy pattern which is spaced apart from the third electrode and is disposed on the second sub-bank; and
  a fourth dummy pattern which is spaced apart from the fourth electrode and is disposed on the another one of the first sub-banks, and
the second dummy pattern and the third dummy pattern are spaced apart from each other on the second sub-bank.

* * * * *